United States Patent
Aomatsu et al.

(10) Patent No.: US 9,601,358 B2
(45) Date of Patent: Mar. 21, 2017

(54) SUBSTRATE TREATMENT APPARATUS, AND SUBSTRATE TREATMENT METHOD

(71) Applicant: SCREEN Holdings Co., Ltd., Kyoto (JP)

(72) Inventors: Akiyoshi Aomatsu, Kyoto (JP); Shoji Uemae, Kyoto (JP); Kazuki Nakamura, Kyoto (JP); Yoshinori Izumi, Kyoto (JP); Nobutaka Tanahashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 28 days.

(21) Appl. No.: 14/822,242

(22) Filed: Aug. 10, 2015

(65) Prior Publication Data

US 2016/0045938 A1    Feb. 18, 2016

(30) Foreign Application Priority Data

Aug. 15, 2014 (JP) ................................ 2014-165555
Aug. 15, 2014 (JP) ................................ 2014-165556

(51) Int. Cl.
*B08B 9/28*      (2006.01)
*H01L 21/67*     (2006.01)

(52) U.S. Cl.
CPC ......... *H01L 21/67051* (2013.01); *B08B 9/28* (2013.01)

(58) Field of Classification Search
USPC ................................ 134/2, 3, 26, 28, 33, 36
See application file for complete search history.

(56) References Cited

U.S. PATENT DOCUMENTS

| 5,634,980 | A | * | 6/1997 | Tomita | ................. | B08B 3/08 |
| | | | | | | 134/18 |
| 5,882,433 | A | * | 3/1999 | Ueno | ................. | H01L 21/67028 |
| | | | | | | 134/31 |
| 2003/0168088 | A1 | * | 9/2003 | Watanabe | ................. | H01L 21/6708 |
| | | | | | | 134/153 |

(Continued)

FOREIGN PATENT DOCUMENTS

JP      11-297652      10/1999
JP      4917469        4/2012

(Continued)

*Primary Examiner* — Binh X Tran
*Assistant Examiner* — David Cathey, Jr.
(74) *Attorney, Agent, or Firm* — Ostrolenk Faber LLP

(57) ABSTRACT

The inventive substrate treatment apparatus includes: a rotative treatment control unit which controls a first chemical liquid supplying unit and a second chemical liquid supplying unit to perform a first chemical liquid supplying step of supplying a first chemical liquid to a substrate rotated by a substrate holding and rotating mechanism and a second chemical liquid supplying step of supplying a second chemical liquid to the substrate rotated by the substrate holding and rotating mechanism after the first chemical liquid supplying step; and a cleaning control unit which controls the cleaning liquid supplying unit to spout the cleaning liquid from the cleaning liquid outlet port to supply the cleaning liquid to the cup inner wall and/or the base wall surface before start of the second chemical liquid supplying step after end of the first chemical liquid supplying step, and/or during and/or after the second chemical liquid supplying step.

10 Claims, 19 Drawing Sheets

(56) References Cited

U.S. PATENT DOCUMENTS

| | | | |
|---|---|---|---|
| 2007/0119476 A1* | 5/2007 | Hara | H01L 21/6708 134/1.3 |
| 2010/0163078 A1* | 7/2010 | Hsu | H01L 21/67051 134/33 |
| 2011/0297192 A1 | 12/2011 | Ogata et al. | 134/94.1 |
| 2012/0175819 A1 | 7/2012 | Miya et al. | 264/334 |
| 2012/0273011 A1* | 11/2012 | Osada | H01L 21/67051 134/33 |
| 2014/0158159 A1 | 6/2014 | Ishibashi | 134/6 |

FOREIGN PATENT DOCUMENTS

| | | |
|---|---|---|
| JP | 4917470 | 4/2012 |
| TW | 200802534 A | 1/2008 |
| TW | 201215458 A1 | 4/2012 |
| TW | 201230177 A1 | 7/2012 |
| TW | 201428841 A | 7/2014 |

* cited by examiner

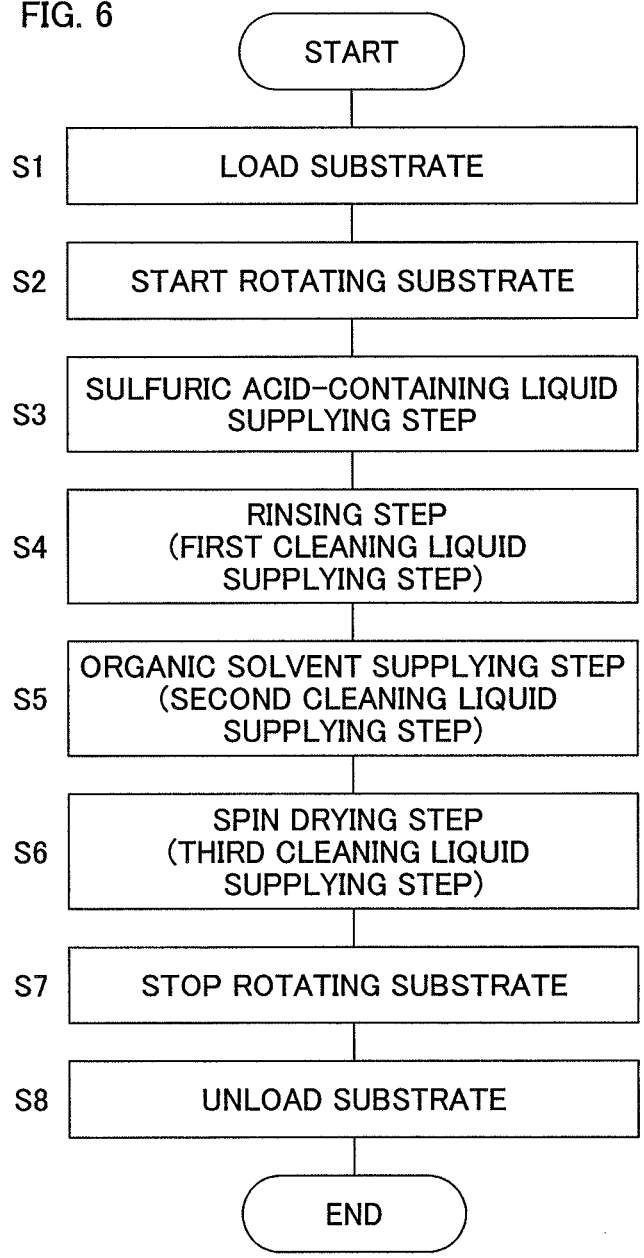

SUBSTRATE TREATMENT APPARATUS, AND SUBSTRATE TREATMENT METHOD

BACKGROUND OF THE INVENTION

1. Field of the Invention

The present invention relates to a substrate treatment apparatus and a substrate treatment method for treating a substrate with a chemical liquid. Examples of the substrate to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

2. Description of the Related Art

In production processes for semiconductor devices and liquid crystal display devices, a substrate treatment apparatus of a single substrate treatment type adapted to treat a single substrate at a time is used for treating a front surface of a substrate such as a semiconductor wafer or a liquid crystal display panel glass substrate with a chemical liquid. The substrate treatment apparatus of the single substrate treatment type includes a treatment chamber defined by a partition wall, a substrate holding and rotating mechanism which generally horizontally holds the substrate and rotates the substrate, a bottomed cylindrical treatment cup which accommodates the substrate holding and rotating mechanism, and a chemical liquid nozzle which supplies the chemical liquid to the substrate held by the substrate holding and rotating mechanism. The substrate holding and rotating mechanism, the treatment cup and the chemical liquid nozzle are provided in the treatment chamber.

The treatment cup includes a fixed cup, and a guard vertically movable with respect to the cup and capable of receiving a chemical liquid scattered from the substrate rotated by the substrate holding and rotating mechanism. A treatment liquid received by the guard flows on an inner wall of the guard into the cup.

In the substrate treatment apparatus, plural types of chemical liquids are often used. Where chemical liquids which are liable to cause a hazard when being accidentally brought into contact with each other or mixed together, e.g., a sulfuric acid-containing liquid such as a sulfuric acid/hydrogen peroxide mixture (SPM) and an organic solvent such as isopropyl alcohol (IPA), are used in combination (i.e., the chemical liquids to be used in combination are inappropriate for mixing thereof), the accidental mixing of the chemical liquids should be reliably prevented. In general, therefore, different treatment chambers are used for treatment with different types of chemical liquids as disclosed in JP2007-103732A. Where an inappropriate combination of chemical liquids are used for the treatment in a single treatment chamber, a so-called interlock process is employed for preventing the accidental mixing of the chemical liquids in the treatment chamber. In the interlock process, when one of the chemical liquids is supplied, the opening of a chemical liquid valve for the other chemical liquid is prohibited or, when a detected rotation speed of the substrate falls outside a predetermined rotation speed range, the opening of chemical liquid valves for the chemical liquids is prohibited (see, for example, JP4917469 and JP4917470).

SUMMARY OF THE INVENTION

Even if plural types of chemical liquids to be used in combination for the substrate treatment are inappropriate for mixing thereof, it is sometimes desirable to complete the substrate treatment in the single treatment chamber for improvement of the productivity. To meet the desired demand, the accidental mixing of the chemical liquids should be reliably prevented not only in the treatment chamber but also in the substrate holding and/or rotating mechanism and the cup.

Further, a vat for receiving the chemical liquid is provided on the entire bottom of the treatment chamber so that a chemical liquid dripping or leaking from the chemical liquid nozzle can be prevented from flowing out of the treatment chamber. The vat has a drain port, and a drainpipe is connected to the drain port. The chemical liquid received in the vat is guided toward the drain port on an upper surface of the vat to be drained outside the apparatus from the drain port through the drain pipe. Where the treatment is performed with the use of the inappropriate combination of the chemical liquids in the single treatment chamber and the chemical liquids are received in the same vat, there is a possibility that the accidental mixing of the chemical liquids occurs on the upper surface of the vat.

It is therefore an object of the present invention to provide a substrate treatment apparatus and a substrate treatment method which, even if plural types of chemical liquids to be used in combination for substrate treatment are inappropriate for mixing thereof, reliably prevent the accidental mixing of the chemical liquids and complete the substrate treatment in a single treatment chamber.

It is another object of the present invention to provide a substrate treatment apparatus which reliably prevents the accidental mixing of the inappropriate combination of the chemical liquids on the vat.

According to a first inventive aspect, there is provided a substrate treatment apparatus which includes: a treatment chamber; a substrate holding and rotating mechanism provided in the treatment chamber and including a spin base rotatable about a predetermined rotation axis for holding the substrate and rotating the substrate about the rotation axis; an annular cup provided around the substrate holding and rotating mechanism for retaining a treatment liquid expelled from the substrate rotated by the substrate holding and rotating mechanism; a first chemical liquid supplying unit which supplies a first chemical liquid to the substrate held by the substrate holding and rotating mechanism; a second chemical liquid supplying unit which supplies a second chemical liquid different from the first chemical liquid to the substrate held by the substrate holding and rotating mechanism; a cleaning liquid nozzle having a cleaning liquid outlet port for spouting a cleaning liquid toward a cup inner wall which is an inner wall of the cup and/or a base wall surface which is a wall surface of an outer periphery of the spin base; a cleaning liquid supplying unit which supplies the cleaning liquid to the cleaning liquid nozzle; a rotative treatment control unit which controls the first chemical liquid supplying unit and the second chemical liquid supplying unit to perform a first chemical liquid supplying step of supplying the first chemical liquid to the substrate rotated by the substrate holding and rotating mechanism and a second chemical liquid supplying step of supplying the second chemical liquid different from the first chemical liquid to the substrate rotated by the substrate holding and rotating mechanism after the first chemical liquid supplying step; and a cleaning control unit which controls the cleaning liquid supplying unit to spout the cleaning liquid from the cleaning liquid outlet port to supply the cleaning liquid to the cup inner wall and/or the base wall surface before the start of the second chemical liquid supplying step after the end of the first chemical liquid supplying step, and/or during and/or after the second chemical liquid supplying step.

With this arrangement, the first chemical liquid supplying step and the second chemical liquid supplying step are performed in this order in the same treatment chamber. Further, the cleaning liquid is supplied to the cup inner wall and/or the base wall surface before the start of the second chemical liquid supplying step after the end of the first chemical liquid supplying step, and/or during and/or after the second chemical liquid supplying step.

Where the cleaning liquid is supplied to the cup inner wall and/or the base wall surface before the start of the second chemical liquid supplying step after the end of the first chemical liquid supplying step, the first chemical liquid can be removed from the cup inner wall and/or the base wall surface by the supply of the cleaning liquid. At the start of the second chemical liquid supplying step, therefore, the first chemical liquid remains neither on the cup inner wall nor on the base wall surface. This reliably prevents the first chemical liquid and the second chemical liquid from being accidentally brought into contact with each other or mixed together in the second chemical liquid supplying step.

Where the cleaning liquid is supplied to the cup inner wall and/or the base wall surface in the second chemical liquid supplying step and/or after the second chemical liquid supplying step, the second chemical liquid can be removed from the cup inner wall and/or the base wall surface by the supply of the cleaning liquid. At the start of the first chemical liquid supplying step for the next substrate treatment, therefore, the second chemical liquid remains neither on the cup inner wall nor on the base wall surface. This reliably prevents the first chemical liquid and the second chemical liquid from being accidentally brought into contact with each other or mixed together in the first chemical liquid supplying step.

Thus, even if the plural types of chemical liquids (the first chemical liquid and the second chemical liquid) to be used in combination for the substrate treatment are inappropriate for mixing thereof, the substrate treatment apparatus can reliably prevent the accidental mixing of the chemical liquids and complete the substrate treatment in the single treatment chamber.

The expression "the chemical liquids to be used in combination are inappropriate for mixing thereof" herein means not only "a combination of chemical liquids which are liable to cause a hazard when being accidentally mixed together" but also "a combination of chemical liquids which are liable to produce a reaction product when being accidentally mixed together" and "a combination of chemical liquids which are liable to have difficulty in separation and recovery when being accidentally mixed together." An exemplary combination of the chemical liquids which are liable to produce a reaction product when being accidentally mixed together is a combination of an acid and an alkali, which produce a salt to contaminate the inside of the apparatus. An exemplary combination of chemical liquids which are liable to have difficulty in separation and recovery when being accidentally mixed together is a combination of HF (hydrofluoric acid) and SPM (sulfuric acid/hydrogen peroxide mixture).

According to an embodiment of the present invention, the rotative treatment control unit includes a rinsing control unit which performs a rinsing step of supplying a rinse liquid to the substrate rotated by the substrate holding and rotating mechanism to rinse away the first chemical liquid from the front surface of the substrate before the start of the second chemical liquid supplying step after the end of the first chemical liquid supplying step, and the cleaning control unit includes a first cleaning control unit which spouts the cleaning liquid from the cleaning liquid outlet port in the rinsing step and/or before the start of the second chemical liquid supplying step after the end of the rinsing step.

With this arrangement, the first chemical liquid supplying step, the rinsing step and the second chemical liquid supplying step are performed in this order in the same treatment chamber. Further, the cleaning liquid is supplied to the cup inner wall and/or the base wall surface in the rinsing step after the first chemical liquid supplying step and/or before the start of the second chemical liquid supplying step after the end of the rinsing step.

After the end of the first chemical liquid supplying step, the first chemical liquid is liable to adhere to (or remain on) the cup inner wall and/or the base wall surface. If the second chemical liquid supplying step is started in this state, there is a possibility that the first chemical liquid and the second chemical liquid are accidentally brought into contact with each other or mixed together in the second chemical liquid supplying step.

With the inventive arrangement, in contrast, the cleaning liquid is supplied to the cup inner wall and/or the base wall surface in the rinsing step to be performed after the first chemical liquid supplying step and/or before the start of the second chemical liquid supplying step after the rinsing step. Thus, the first chemical liquid is removed from the cup inner wall and/or the base wall surface before the start of the second chemical liquid supplying step. At the start of the second chemical liquid supplying step, therefore, the first chemical liquid remains neither on the cup inner wall nor on the base wall surface. This reliably prevents the accidental mixing of the first chemical liquid and the second chemical liquid in the second chemical liquid supplying step.

The cleaning control unit may include a second cleaning control unit which spouts the cleaning liquid from the cleaning liquid outlet port in the second chemical liquid supplying step.

With this arrangement, the cleaning liquid is supplied to the cup inner wall and/or the base wall surface in the second chemical liquid supplying step.

If the first chemical liquid supplying step for the next substrate treatment is started with the second chemical liquid adhering to (or remaining on) the cup inner wall and/or the base wall surface after the end of the second chemical liquid supplying step, there is a possibility that the first chemical liquid and the second chemical liquid are accidentally brought into contact with each other or mixed together.

With the inventive arrangement, in contrast, the cleaning liquid is supplied to the cup inner wall and/or the base wall surface in the second chemical liquid supplying step and/or after the end of the second chemical liquid supplying step. Thus, the second chemical liquid can be removed from the cup inner wall and/or the base wall surface. At the start of the next substrate treatment, therefore, the second chemical liquid remains neither on the cup inner wall nor on the base wall surface. This reliably prevents the accidental mixing of the first chemical liquid and the second chemical liquid in the first chemical liquid supplying step for the next substrate treatment.

The rotative treatment control unit may include a spin drying control unit which performs a spin drying step of causing the substrate holding and rotating mechanism to rotate the substrate to spin off liquid from the front surface of the substrate after the end of the second chemical liquid supplying step. The cleaning control unit may include a third cleaning control unit which spouts the cleaning liquid from the cleaning liquid outlet port in the spin drying step.

With this arrangement, the cleaning liquid is supplied to the cup inner wall and/or the base wall surface in the spin drying step.

If the first chemical liquid supplying step for the next substrate treatment is started with the second chemical liquid adhering to (or remaining on) the cup inner wall and/or the base wall surface after the end of the spin drying step, there is a possibility that the first chemical liquid and the second chemical liquid are accidentally brought into contact with each other or mixed together.

With the inventive arrangement, in contrast, the cleaning liquid is supplied to the cup inner wall and/or the base wall surface in the spin drying step. Thus, the second chemical liquid can be removed from the cup inner wall and/or the base wall surface. After the end of the spin drying step, therefore, the second chemical liquid remains neither on the cup inner wall nor on the base wall surface. This reliably prevents the accidental mixing of the first chemical liquid and the second chemical liquid in the first chemical liquid supplying step for the next substrate treatment.

The substrate treatment apparatus may further include: a common pipe connected to a drain/recovery port provided in a bottom of the cup; a recovery pipe connected to the common pipe for recovering the first chemical liquid or the second chemical liquid; a drain pipe connected to the common pipe; a switch valve which switches a destination of liquid flowing through the common pipe between the recovery pipe and the drain pipe; and a destination setting control unit which controls the switch valve so that the destination of the liquid flowing through the common pipe is set to the drain pipe, while causing the cleaning control unit to supply the cleaning liquid.

With this arrangement, the destination of the liquid flowing through the common pipe is set to the drain pipe, while the cleaning liquid is supplied to the cup inner wall and/or the base wall surface. Therefore, the cleaning liquid supplied to the cup inner wall and/or the base wall surface is guided to the common pipe through the drain/recovery port of the cup, and then to the drain pipe. Even if the first chemical liquid or the second chemical liquid adheres to a pipe wall of the common pipe in the first chemical liquid supplying step or the second chemical liquid supplying step, therefore, the first chemical liquid or the second chemical liquid can be washed away from the pipe wall with the cleaning liquid flowing through the common pipe. This reliably prevents the first chemical liquid and the second chemical liquid from being accidentally brought into contact with each other or mixed together on the pipe wall of the common pipe.

The cleaning liquid nozzle may include a first cleaning liquid nozzle having a first cleaning liquid outlet port to be opposed to the base wall surface.

The first cleaning liquid nozzle may be disposed with the first cleaning liquid outlet port directed obliquely upward. With this arrangement, the first cleaning liquid nozzle can be disposed obliquely below the base wall surface. If the first cleaning liquid nozzle was disposed on a lateral side of the base wall surface, the first cleaning liquid nozzle would be located between the spin base and the cup as seen in plan, resulting in size increase of the substrate treatment apparatus. In the present invention, in contrast, the first cleaning liquid nozzle is not located on the lateral side of the base wall surface, so that the size of the substrate treatment apparatus is not increased. Thus, the substrate treatment apparatus is adapted to supply the cleaning liquid to the base wall surface without size increase thereof. Since the cleaning liquid is supplied to the base wall surface obliquely from below, the first or second chemical liquid can be advantageously removed from the bottom surface of the outer periphery of the spin base.

The cleaning liquid nozzle may include a second cleaning liquid nozzle having a second cleaning liquid outlet port for supplying the cleaning liquid to the cup inner wall.

In this case, the cup may annularly surround the substrate holding and rotating mechanism, and may have a drain port provided in a bottom wall thereof. The second cleaning liquid outlet port may include a plurality of second cleaning liquid outlet ports provided circumferentially of the cup laterally of the spin chuck. The second cleaning liquid outlet ports may be absent in a region near the drain port.

With this arrangement, the second cleaning liquid outlet ports are absent in the region near the drain port, so that the cleaning liquid spouted from the second cleaning liquid outlet ports moves circumferentially toward the drain port in the cup and is guided from the drain port to the common pipe. That is, a distance for which the cleaning liquid moves in the cup is increased. Thus, the first or second chemical liquid can be efficiently removed from the cup.

The first chemical liquid may be a sulfuric acid-containing liquid. The second chemical liquid may be an organic solvent. Examples of the sulfuric acid-containing liquid include SPM and sulfuric acid. Examples of the organic solvent include IPA, methanol, ethanol, HFE (hydrofluoroether) and acetone, at least one of which is used.

According to a second aspect of the present invention, there is provided a substrate treatment method for treating a substrate by using a substrate treatment apparatus which includes: a substrate holding and rotating mechanism having a spin base rotatable about a predetermined rotation axis for holding the substrate and rotating the substrate about the rotation axis; a cup provided around the substrate holding and rotating mechanism for retaining a treatment liquid expelled from the substrate rotated by the substrate holding and rotating mechanism; and a cleaning liquid nozzle which spouts a cleaning liquid toward a cup inner wall which is an inner wall of the cup and/or a base wall surface which is a wall surface of an outer periphery of the spin base, the method including: a first chemical liquid supplying step of supplying a first chemical liquid to the substrate rotated by the substrate holding and rotating mechanism; a second chemical liquid supplying step of supplying a second chemical liquid different from the first chemical liquid to the substrate rotated by the substrate holding and rotating mechanism after the first chemical liquid supplying step; and a cleaning liquid supplying step of spouting the cleaning liquid from the cleaning liquid nozzle to supply the cleaning liquid to the cup inner wall and/or the base wall surface before the start of the second chemical liquid supplying step after the end of the first chemical liquid supplying step, and/or during and/or after the second chemical liquid supplying step.

In this method, the first chemical liquid supplying step and the second chemical liquid supplying step are performed in this order in the same treatment chamber. The cleaning liquid is supplied to the cup inner wall and/or the base wall surface before the start of the second chemical liquid supplying step after the end of the first chemical liquid supplying step, and/or during and/or after the second chemical liquid supplying step.

Where the cleaning liquid is supplied to the cup inner wall and/or the base wall surface before the start of the second chemical liquid supplying step after the end of the first chemical liquid supplying step, the first chemical liquid can be removed from the cup inner wall and/or the base wall surface by the supply of the cleaning liquid. At the start of the second chemical liquid supplying step, therefore, the first chemical liquid remains neither on the cup inner wall nor on the base wall surface. This reliably prevents the first chemical liquid and the second chemical liquid from being accidentally brought into contact with each other or mixed together in the second chemical liquid supplying step.

Where the cleaning liquid is supplied to the cup inner wall and/or the base wall surface in the second chemical liquid supplying step and/or after the second chemical liquid supplying step, the second chemical liquid can be removed from the cup inner wall and/or the base wall surface by the supply of the cleaning liquid. At the start of the first chemical liquid supplying step for the next substrate treatment, therefore, the second chemical liquid remains neither on the cup inner wall nor on the base wall surface. This reliably prevents the first chemical liquid and the second chemical liquid from being accidentally brought into contact with each other or mixed together in the first chemical liquid supplying step.

Thus, even if the plural types of chemical liquids (the first chemical liquid and the second chemical liquid) to be used in combination for the substrate treatment are inappropriate for mixing thereof, the substrate treatment method can reliably prevent the accidental mixing of the chemical liquids and complete the substrate treatment in the single treatment chamber.

According to an embodiment of the present invention, the substrate treatment method further includes a rinsing step of supplying a rinse liquid to the substrate rotated by the substrate holding and rotating mechanism to rinse away the first chemical liquid from the front surface of the substrate before the start of the second chemical liquid supplying step after the end of the first chemical liquid supplying step, and the cleaning liquid supplying step includes a first cleaning liquid supplying step of spouting the cleaning liquid from the cleaning liquid nozzle in the rinsing step and/or before the start of the second chemical liquid supplying step after the end of the rinsing step.

In this method, the first chemical liquid supplying step, the rinsing step and the second chemical liquid supplying step are performed in this order in the same treatment chamber. Further, the cleaning liquid is supplied to the cup inner wall and/or the base wall surface in the rinsing step after the first chemical liquid supplying step and/or before the start of the second chemical liquid supplying step after the end of the rinsing step.

After the end of the first chemical liquid supplying step, the first chemical liquid is liable to adhere to (or remain on) the cup inner wall and/or the base wall surface. If the second chemical liquid supplying step is started in this state, there is a possibility that the first chemical liquid and the second chemical liquid are accidentally brought into contact with each other or mixed together in the second chemical liquid supplying step.

In the inventive method, in contrast, the cleaning liquid is supplied to the cup inner wall and/or the base wall surface in the rinsing step to be performed after the first chemical liquid supplying step and/or before the start of the second chemical liquid supplying step after the rinsing step. Thus, the first chemical liquid is removed from the cup inner wall and/or the base wall surface before the start of the second chemical liquid supplying step. At the start of the second chemical liquid supplying step, therefore, the first chemical liquid remains neither on the cup inner wall nor on the base wall surface. This reliably prevents the accidental mixing of the first chemical liquid and the second chemical liquid in the second chemical liquid supplying step.

The cleaning liquid supplying step may include a second cleaning liquid supplying step of spouting the cleaning liquid from the cleaning liquid nozzle in the second chemical liquid supplying step and/or after the end of the second chemical liquid supplying step.

In this method, the cleaning liquid is supplied to the cup inner wall and/or the base wall surface in the second chemical liquid supplying step.

If the first chemical liquid supplying step for the next substrate treatment is started with the second chemical liquid adhering to (or remaining on) the cup inner wall and/or the base wall surface after the end of the second chemical liquid supplying step, there is a possibility that the first chemical liquid and the second chemical liquid are accidentally brought into contact with each other or mixed together.

In the inventive method, in contrast, the cleaning liquid is supplied to the cup inner wall and/or the base wall surface in the second chemical liquid supplying step and/or after the end of the second chemical liquid supplying step. Thus, the second chemical liquid can be removed from the cup inner wall and/or the base wall surface. At the start of the next substrate treatment, therefore, the second chemical liquid remains neither on the cup inner wall nor on the base wall surface. This reliably prevents the accidental mixing of the first chemical liquid and the second chemical liquid in the first chemical liquid supplying step for the next substrate treatment.

The substrate treatment method may further include a spin drying step of causing the substrate holding and rotating mechanism to rotate the substrate to spin off liquid from a front surface of the substrate after the end of the second chemical liquid supplying step. The cleaning liquid supplying step may include a third cleaning liquid supplying step of spouting the cleaning liquid from the cleaning liquid nozzle in the spin drying step and/or after the spin drying step.

In this method, the cleaning liquid is supplied to the cup inner wall and/or the base wall surface in the spin drying step.

If the first chemical liquid supplying step for the next substrate treatment is started with the second chemical liquid adhering to (or remaining on) the cup inner wall and/or the base wall surface after the end of the spin drying step, there is a possibility that the first chemical liquid and the second chemical liquid are accidentally brought into contact with each other or mixed together.

In the inventive method, in contrast, the cleaning liquid is supplied to the cup inner wall and/or the base wall surface in the spin drying step. Thus, the second chemical liquid can be removed from the cup inner wall and/or the base wall surface. After the end of the spin drying step, therefore, the second chemical liquid remains neither on the cup inner wall nor on the base wall surface. This reliably prevents the accidental mixing of the first chemical liquid and the second chemical liquid in the first chemical liquid supplying step for the next substrate treatment.

The cup may include a plurality of cups disposed in non-overlapping relation as seen in plan. In this case, a first cup located at the innermost position out of the plurality of cups may be cleaned in the cleaning liquid supplying step.

In this method, the cleaning liquid is supplied to the first cup located at the innermost position in the cleaning liquid supplying step. Since the first cup is located closest to the substrate holding and rotating mechanism, the first or second chemical liquid is liable to flow into the first cup to adhere to an inner wall of the first cup during the treatment with the first chemical liquid or the second chemical liquid. However, the inner wall of the first cup to which the first or second chemical liquid is liable to adhere can be cleaned with the cleaning liquid. This reliably prevents the accidental mixing of the first chemical liquid and the second chemical liquid.

The substrate treatment apparatus may further include: a common pipe connected to a drain/recovery port provided in a bottom of the cup; a recovery pipe connected to the common pipe for recovering the first chemical liquid or the second chemical liquid; and a drainpipe connected to the common pipe. In this case, the cleaning step may be performed with a destination of liquid flowing through the common pipe being set to the drain pipe.

In this method, the destination of the liquid flowing through the common pipe is set to the drain pipe while the cleaning liquid is supplied to the cup inner wall and/or the base wall surface. Therefore, the cleaning liquid supplied to the cup inner wall and/or the base wall surface is guided to the common pipe through the drain/recovery port of the cup, and then to the drain pipe. Therefore, even if the first chemical liquid or the second chemical liquid adheres to a pipe wall of the common pipe in the first chemical liquid supplying step or the second chemical liquid supplying step, the first chemical liquid or the second chemical liquid can be washed away from the pipe wall with the cleaning liquid flowing through the common pipe. This reliably prevents the first chemical liquid and the second chemical liquid from being accidentally brought into contact with each other or mixed together on the pipe wall of the common pipe. The first chemical liquid may be a sulfuric acid-containing liquid. The second chemical liquid may be an organic solvent. Examples of the sulfuric acid-containing liquid include SPM and sulfuric acid. Examples of the organic solvent include IPA, methanol, ethanol, HFE (hydrofluoroether) and acetone, at least one of which is used.

According to a third aspect of the present invention, there is provided a substrate treatment apparatus, which includes: a treatment chamber; a substrate holding mechanism provided in the treatment chamber for holding a substrate; a tubular treatment cup provided in the treatment chamber and surrounding the substrate holding mechanism; a first chemical liquid nozzle which spouts a first chemical liquid to the substrate held by the substrate holding mechanism; a second chemical liquid nozzle which spouts a second chemical liquid different from the first chemical liquid to the substrate held by the substrate holding mechanism; a first moving mechanism which moves the first chemical liquid nozzle between a first outer space and an upper position above the substrate held by the substrate holding mechanism, the first outer space being a predetermined space defined outside the treatment cup in the treatment chamber as seen in plan; a second moving mechanism which moves the second chemical liquid nozzle between a second outer space different from the first outer space and the upper position above the substrate held by the substrate holding mechanism, the second outer space being a predetermined space defined outside the treatment cup in the treatment chamber as seen in plan; a first vat disposed at least in a bottom of the first outer space for receiving liquid from above and guiding the liquid toward a first drain port; and a second vat disposed in a bottom of the second outer space for receiving liquid from above and guiding the received liquid toward a second drain port different from the first drain port; wherein at least bottom portions of the first outer space and the second outer space are isolated from each other.

With this arrangement, a vat to be provided on the bottom of the treatment chamber is divided at least into the first vat disposed in the bottom of the first outer space and the second vat disposed in the bottom of the second outer space. When the first chemical liquid nozzle is moved in the first outer space, the first chemical liquid dripping from the first chemical liquid nozzle is received in the first vat. On the other hand, when the second chemical liquid nozzle is moved in the second outer space, the second chemical liquid dripping from the second chemical liquid nozzle is received in the second vat. In other words, the vat is divided into the first vat for the first chemical liquid and the second vat for the second chemical liquid according to the movement ranges of the first and second chemical liquid nozzles.

Since at least the bottom portions of the first outer space and the second outer space are isolated from each other, there is no liquid communication between the first vat and the second vat. Further, the liquid received in the first vat and the liquid received in the second vat are drained from the different drain ports.

Thus, the first chemical liquid and the second chemical liquid are reliably prevented from being accidentally brought into contact with each other or mixed together in the vat. Even if the chemical liquids to be used in combination are inappropriate for mixing thereof, the substrate treatment apparatus can reliably prevent the accidental mixing of these chemical liquids in the vat.

The first chemical liquid may be a sulfuric acid-containing liquid. The second chemical liquid may be an organic solvent. Examples of the sulfuric acid-containing liquid include SPM and sulfuric acid. Examples of the organic solvent include IPA, methanol, ethanol, HFE (hydrofluoroether) and acetone, at least one of which is used.

The foregoing and other objects, features and effects of the present invention will become more apparent from the following detailed description of the preferred embodiments with reference to the attached drawings.

BRIEF DESCRIPTION OF THE DRAWINGS

FIG. 6 is a process diagram for explaining an exemplary substrate treatment process to be performed by the substrate treatment apparatus.

DETAILED DESCRIPTION OF PREFERRED EMBODIMENTS

Figure 1:
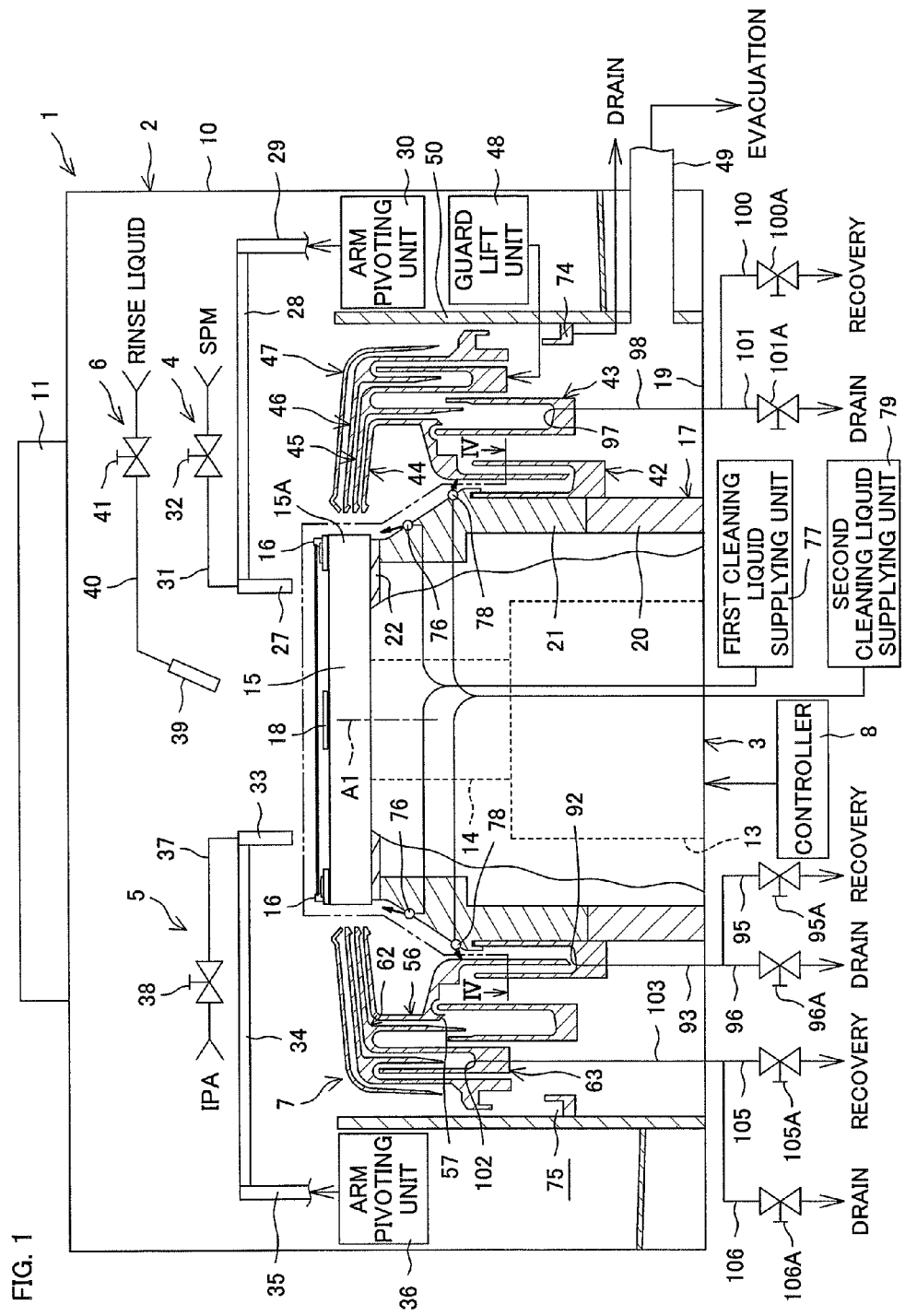
FIG. 1 is a diagram of a substrate treatment apparatus according to a first embodiment of the present invention as seen in a horizontal direction.
Figure 2:
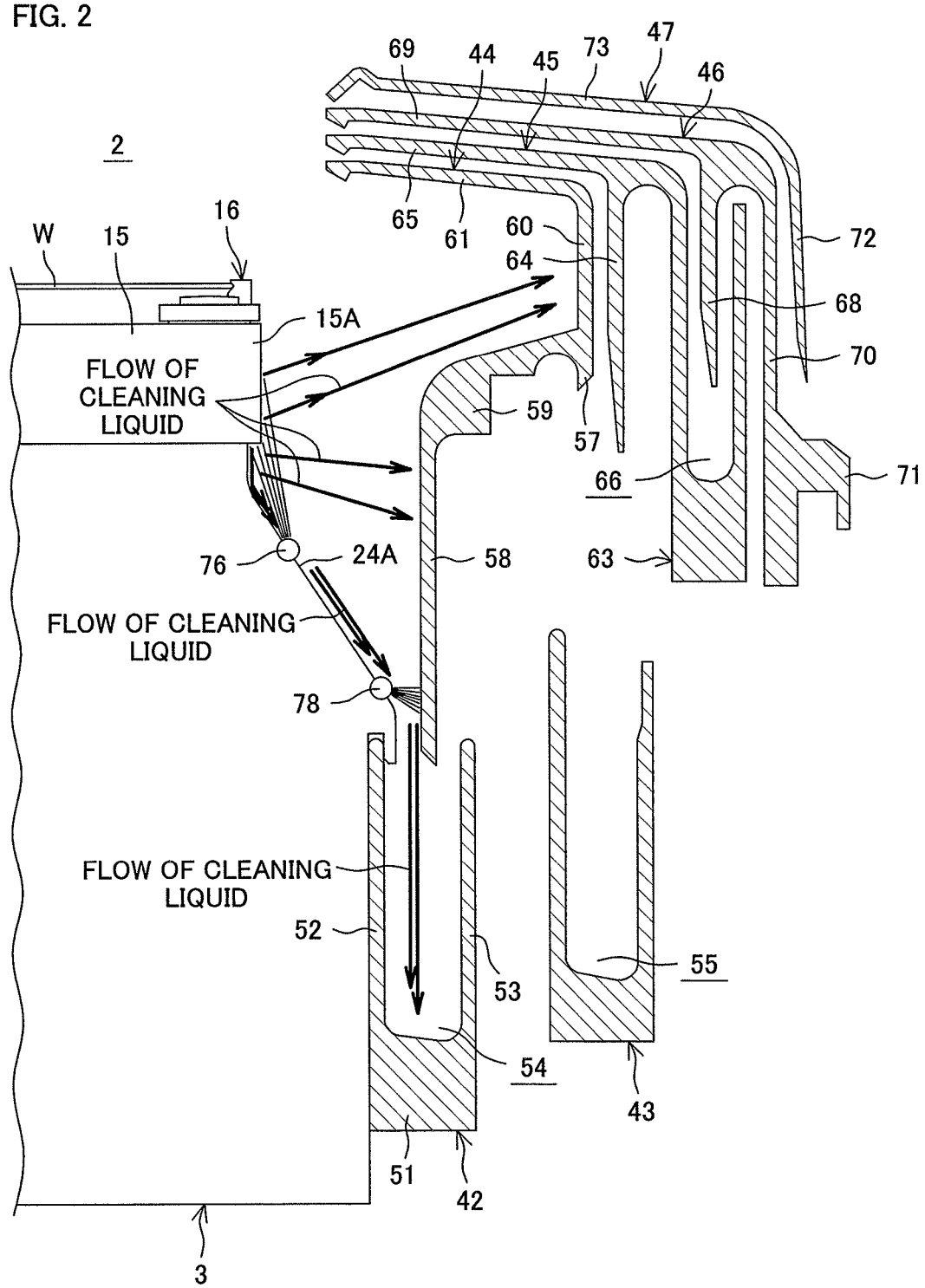
FIG. 2 is a sectional view for explaining first and second cleaning nozzles.
Figure 3:
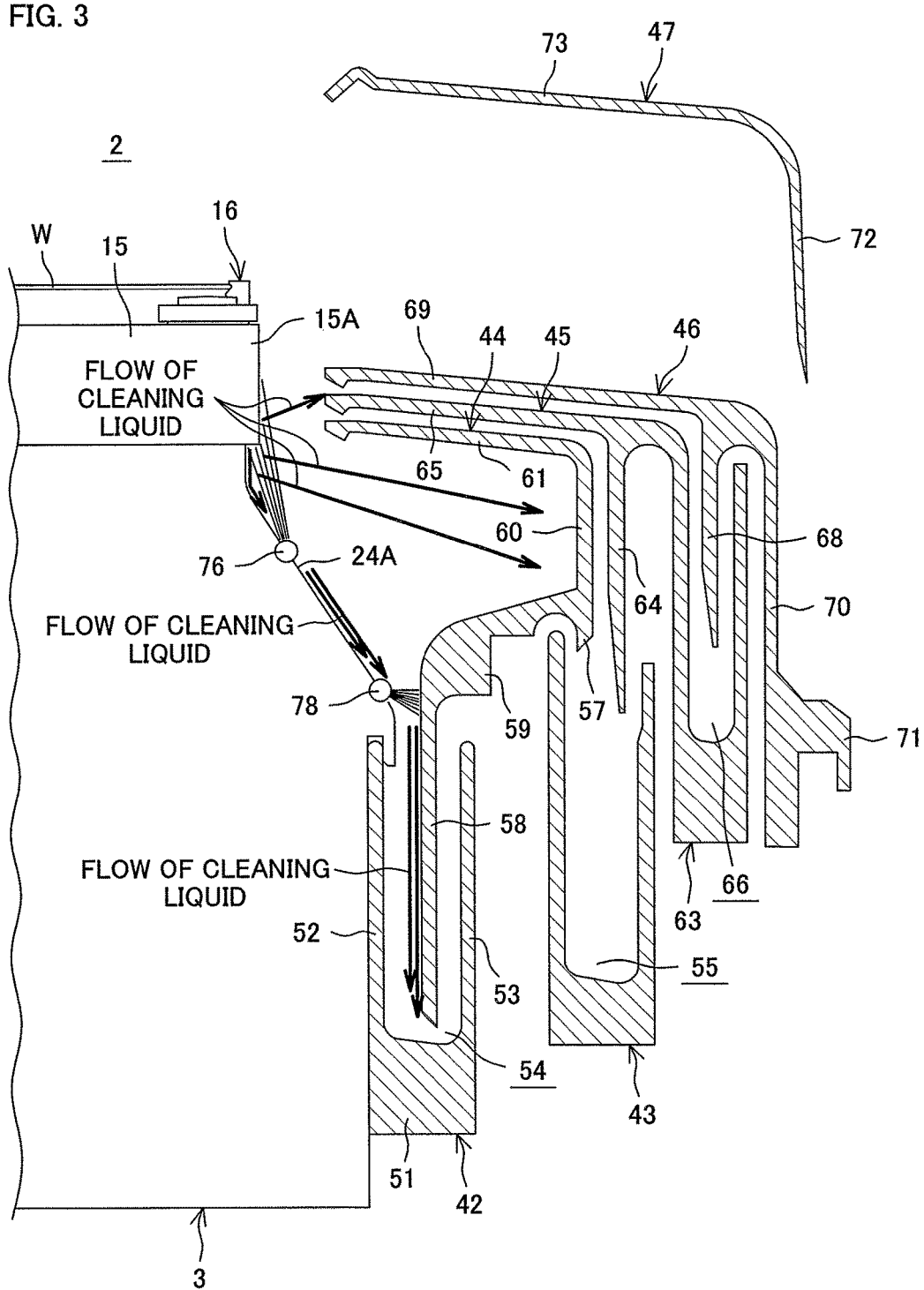
FIG. 3 is a sectional view for explaining the first and second cleaning nozzles.
Figure 4:
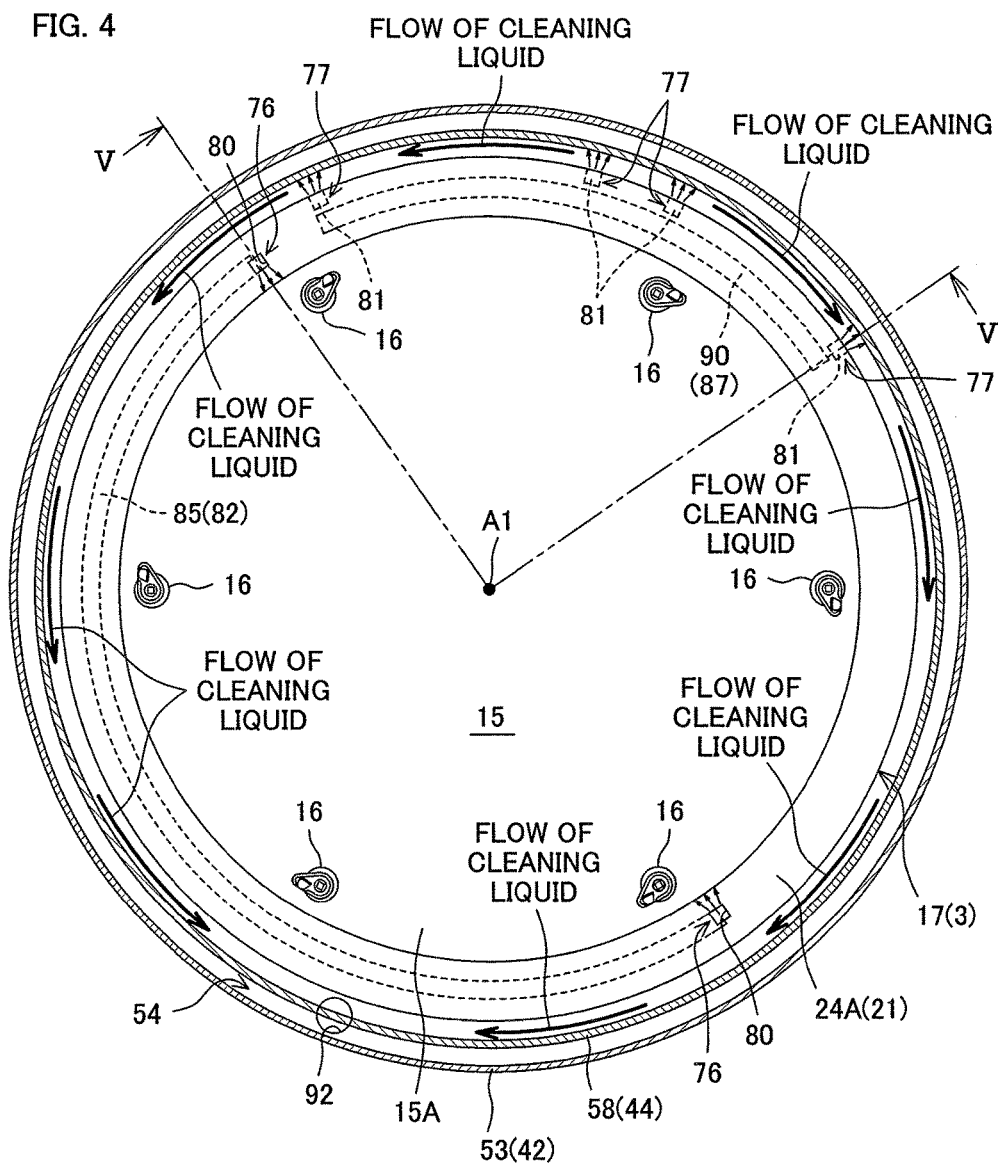
FIG. 4 is a sectional view taken along a sectional plane IV-IV in FIG. 1.
Figure 5:
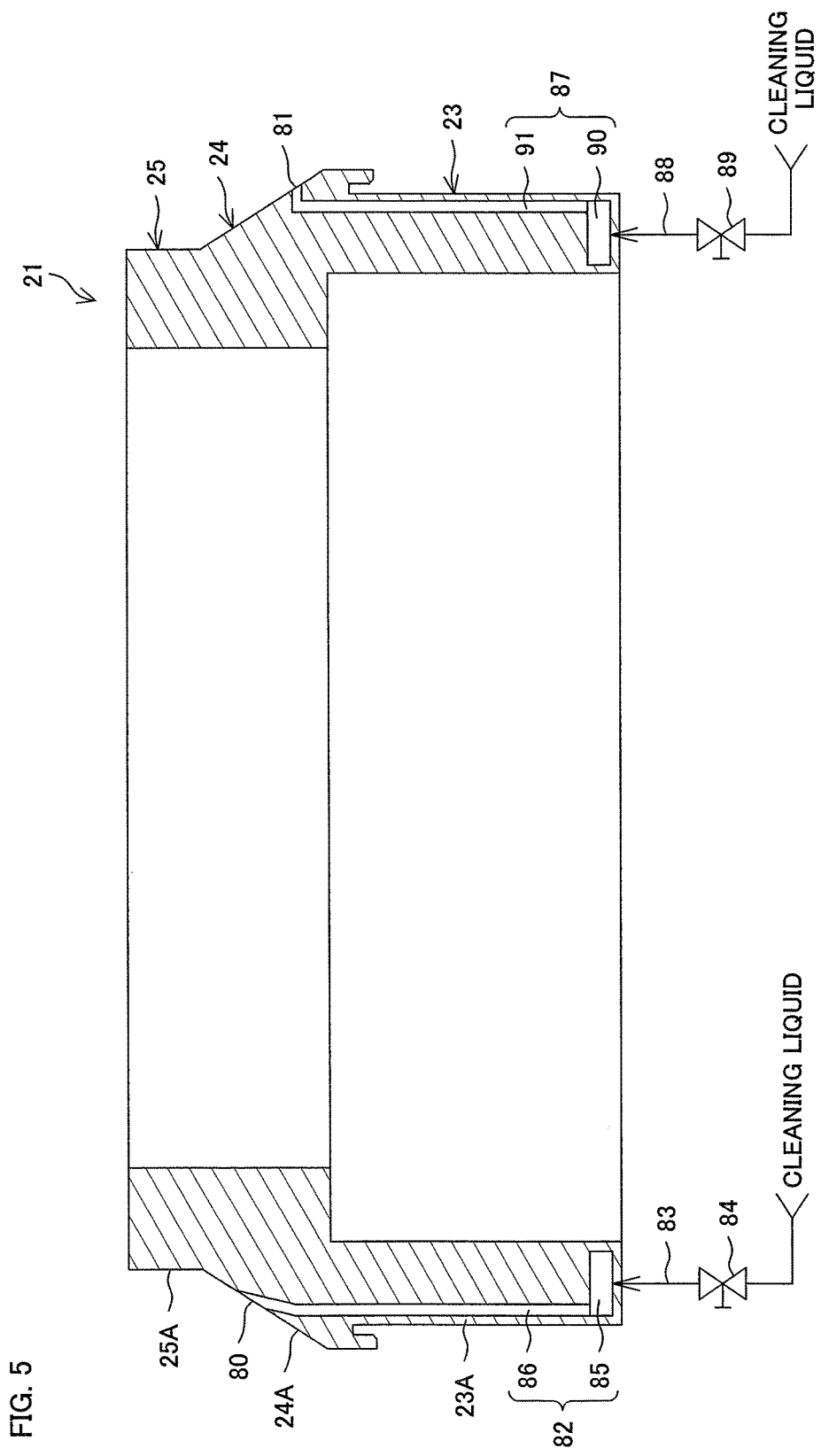
FIG. 5 is a sectional view of a boss taken along a sectional plane V-V in FIG. 4.

FIG. 1 is a diagram of a substrate treatment apparatus 1 according to a first embodiment of the present invention as seen in a horizontal direction. FIGS. 2 and 3 are sectional views for explaining first and second cleaning nozzles 76, 78. FIG. 2 illustrates a state with a first guard 44 in opposed relation to a peripheral surface of a substrate W, while FIG. 3 illustrates a state with a fourth guard 47 in opposed relation to the peripheral surface of the substrate W. FIG. 4 is a sectional view taken along a sectional plane IV-IV in FIG. 1. FIG. 5 is a sectional view of a boss 21 taken along a sectional plane V-V in FIG. 4.

The substrate treatment apparatus 1 is of a single substrate treatment type adapted to treat a front surface (having a device formation region) of a substrate W (e.g., a round semiconductor wafer or the like) with a liquid for a cleaning process or an etching process. The substrate treatment apparatus 1 includes a box-shaped treatment chamber 2 having an inside space, a spin chuck (substrate holding and rotating mechanism) 3 which horizontally holds a single substrate W in the treatment chamber 2 and rotates the substrate W about a vertical rotation axis A1 extending through the center of the substrate W, a sulfuric acid-containing liquid supplying unit (first chemical liquid supplying unit) 4 which supplies a sulfuric acid/hydrogen peroxide mixture (SPM) as an exemplary sulfuric acid-containing liquid (first chemical liquid) to the substrate W held by the spin chuck 3, an organic solvent supplying unit (second chemical liquid supplying unit) 5 which supplies isopropyl alcohol (IPA) as an exemplary organic solvent (organic solvent having a lower surface tension, second chemical liquid) to the front surface (upper surface) of the substrate W held by the spin chuck 3, a rinse liquid supplying unit 6 which supplies DIW (deionized water) as an exemplary rinse liquid to the front surface (upper surface) of the substrate W held by the spin chuck 3, a tubular treatment cup 7 surrounding the spin chuck 3, and a controller 8 which controls the operations of devices provided in the substrate treatment apparatus 1 and the opening and closing of valves.

The treatment chamber 2 includes a boxed-shaped partition wall 10, an FFU (fan filter unit) 11 as an air supplying unit which supplies clean air into the inside of the partition wall 10 (into the treatment chamber 2) from above the partition wall 10, and an evacuation unit (not shown) which expels gas from the treatment chamber 2 from below the partition wall 10. The spin chuck 3, a sulfuric acid-containing liquid nozzle 27 of the sulfuric acid-containing liquid supplying unit 4, an organic solvent nozzle 33 of the organic solvent supplying unit 5, and a rinse liquid nozzle 39 of the rinse liquid supplying unit 6 are accommodated in the inside of the partition wall 10.

The FFU 11 is disposed on the partition wall 10, and attached to a top portion of the partition wall 10. The FFU 11 supplies the clean air into the treatment chamber 2 from the top portion of the partition wall 10. The evacuation unit is connected to a bottom portion of the treatment cup 7 through a cup evacuation duct 49, and the inside of the treatment cup 7 is evacuated through the bottom portion of the treatment cup 7. The FFU 11 and the evacuation unit forma down flow (downward stream) in the treatment chamber 2.

A chuck of a clamping type adapted to horizontally clamp the substrate W to horizontally hold the substrate W is used as the spin chuck 3. More specifically, the spin chuck 3 includes a spin motor 13, a spin shaft 14 unified with a drive shaft of the spin motor 13, a disk-shaped spin base 15 horizontally attached to an upper end of the spin shaft 14, and a cover member 17 which covers the periphery of the spin motor 13 and the spin shaft 14 to define a side wall of the spin chuck excluding the spin base 15.

The spin shaft 14 is a vertical hollow shaft, in which a lower surface supply line (not shown) is inserted. A treatment liquid (e.g., first chemical liquid, second chemical liquid or pure water (DIW)) is supplied to the lower surface supply line. A lower surface nozzle 18 which spouts the treatment liquid supplied to the lower surface supply line is provided at an upper end of the lower surface supply line. The lower surface nozzle 18 spouts the treatment liquid generally vertically upward, and the treatment liquid spouted from the lower surface nozzle 18 is applied generally perpendicularly to a center portion of a lower surface of the substrate W held by the spin chuck 3.

The spin motor 13 is disposed on a horizontal bottom plate 19, and surrounded by the tubular cover member 17. The cover member 17 has a lower edge disposed on the bottom plate 19 of the partition wall 10, and an upper edge portion extending to near the spin base 15.

As shown in FIGS. 1 and 4, a plurality of clamping members 16 (three or more clamping members, e.g., six clamping members) are circumferentially provided on an upper surface of the spin base 15. The clamping members 16 are disposed in circumferentially properly spaced relation according to the outer peripheral shape of the substrate W on a peripheral portion of the upper surface of the spin base 15. In FIG. 4, the substrate W is not held on the spin chuck 3.

As shown in FIG. 1, the cover member 17 includes a cylindrical base boss 20, a cylindrical boss 21 and an annular disk-shaped boss cover 22, which are combined together in this order from a lower side. The base boss 20 and the boss 21 are fixed to each other by bolts (not shown), and the boss 21 and the boss cover 22 are fixed to each other by bolts (not shown). The base boss 20 is disposed on the bottom plate 19 to surround the spin motor 13. The boss cover 22 fills a gap defined between the spin base 15 and the boss 21.

As shown in FIG. 5, the boss 21 integrally includes a lower portion 23 having a first cylindrical surface 23A serving as an outer peripheral surface thereof, a middle portion 24 having an upwardly projecting conical taper surface 24A serving as an outer peripheral surface thereof and an upper portion 25 having a second cylindrical surface 25A serving as an outer peripheral surface thereof, and is made of a resin material such as PVC (polyvinyl chloride).

As shown in FIG. 1, the sulfuric acid-containing liquid supplying unit 4 includes a sulfuric acid-containing liquid nozzle 27 which spouts the SPM toward the front surface of the substrate W, a first nozzle arm 28 having a distal end to which the sulfuric acid-containing liquid nozzle 27 is attached, a first arm support shaft 29 extending vertically on a lateral side of the spin chuck 3 and pivotally supporting the first nozzle arm 28, and a first arm pivoting unit 30 which rotates the first arm support shaft 29 to move the first nozzle arm 28 to thereby move the sulfuric acid-containing liquid nozzle 27. The sulfuric acid-containing liquid nozzle 27 is, for example, a straight nozzle which spouts the SPM in the form of continuous stream, and is attached to the horizontal first nozzle arm 28, for example, with its spout directed downward. The first nozzle arm 28 extends horizontally.

The sulfuric acid-containing liquid supplying unit 4 further includes a sulfuric acid-containing liquid line 31 through which the SPM is guided to the sulfuric acid-containing liquid nozzle 27, and a sulfuric acid-containing liquid valve 32 which opens and closes the sulfuric acid-containing liquid line 31. With the sulfuric acid-containing liquid valve 32 open, the SPM is supplied from an SPM supply source to the sulfuric acid-containing liquid nozzle 27 through the sulfuric acid-containing liquid line 31. Thus, the SPM is spouted from the sulfuric acid-containing liquid nozzle 27.

The first arm pivoting unit 30 pivots the first nozzle arm 28 about the first arm support shaft 29, whereby the sulfuric acid-containing liquid nozzle 27 is horizontally moved. The first arm pivoting unit 30 horizontally moves the sulfuric acid-containing liquid nozzle 27 between a treatment position such that the SPM spouted from the sulfuric acid-containing liquid nozzle 27 is applied to the upper surface of the substrate W and a home position at which the sulfuric acid-containing liquid nozzle 27 is located adjacent the spin chuck 3 as seen in plan. Further, the first arm pivoting unit 30 horizontally moves the sulfuric acid-containing liquid nozzle 27 between a center position such that the SPM spouted from the sulfuric acid-containing liquid nozzle 27 is applied to the upper surface center portion of the substrate W and a peripheral position such that the SPM spouted from the sulfuric acid-containing liquid nozzle 27 is applied to the upper surface peripheral portion of the substrate W. The center position and the peripheral position are each defined as the treatment position. The sulfuric acid-containing liquid nozzle 27 may be a fixed nozzle which is fixedly disposed with its spout directed toward a predetermined position (e.g., center portion) on the upper surface of the substrate W.

The organic solvent supplying unit 5 includes an organic solvent nozzle 33 which spouts IPA toward the front surface of the substrate W, a second nozzle arm 34 having a distal end to which the organic solvent nozzle 33 is attached, a second arm support shaft 35 extending vertically on a lateral side of the spin chuck 3 and pivotally supporting the second nozzle arm 34, and a second arm pivoting unit 36 which rotates the second arm support shaft 35 to move the second nozzle arm 34 to thereby move the organic solvent nozzle 33. The organic solvent nozzle 33 is, for example, a straight nozzle which spouts IPA in the form of continuous stream, and is attached to the horizontal second nozzle arm 34, for example, with its spout directed downward. The second nozzle arm 34 extends horizontally.

The organic solvent supplying unit 5 further includes an organic solvent line 37 through which IPA is guided to the organic solvent nozzle 33, and an organic solvent valve 38 which opens and closes the organic solvent line 37. With the organic solvent valve 38 open, IPA is supplied from an IPA supply source to the organic solvent nozzle 33 through the organic solvent line 37. Thus, IPA is spouted from the organic solvent nozzle 33.

The second arm pivoting unit 36 pivots the second nozzle arm 34 about the second arm support shaft 35, whereby the organic solvent nozzle 33 is horizontally moved. The second arm pivoting unit 36 horizontally moves the organic solvent nozzle 33 between a treatment position such that IPA spouted from the organic solvent nozzle 33 is applied to the upper surface of the substrate W and a home position at which the organic solvent nozzle 33 is located adjacent the spin chuck 3 as seen in plan. Further, the second arm pivoting unit 36 horizontally moves the organic solvent nozzle 33 between a center position such that IPA spouted from the organic solvent nozzle 33 is applied to the upper surface center portion of the substrate W and a peripheral position such that IPA spouted from the organic solvent nozzle 33 is applied to the upper surface peripheral portion of the substrate W. The center position and the peripheral position are each defined as the treatment position. The organic solvent nozzle 33 may be a fixed nozzle which is fixedly disposed with its spout directed toward a predetermined position (e.g., center portion) on the upper surface of the substrate W.

The rinse liquid supplying unit 6 includes a rinse liquid nozzle 39 which spouts the rinse liquid toward the substrate W held by the spin chuck 3, a rinse liquid line 40 which supplies the rinse liquid to the rinse liquid nozzle 39, and a rinse liquid valve 41 which switches on and off the supply of the rinse liquid from the rinse liquid line 40 to the rinse liquid nozzle 39. The rinse liquid nozzle 39 is a fixed nozzle which spouts the rinse liquid with its spout kept still. The rinse liquid supplying unit 6 may include a rinse liquid nozzle moving device which moves the rinse liquid nozzle 39 to move a rinse liquid application position on the upper surface of the substrate W.

With the rinse liquid valve 41 open, the rinse liquid supplied from the rinse liquid line 40 to the rinse liquid nozzle 39 is spouted from the rinse liquid nozzle 39 toward the upper surface center portion of the substrate W. The rinse liquid is pure water (deionized water) by way of example not by way of limitation. Other examples of the rinse liquid include carbonated water, electrolytic ion water, hydrogen water, ozone water and a hydrochloric acid aqueous solution having a dilute concentration (e.g., about 10 to about 100 ppm).

The treatment cup 7 includes a cylindrical member 50 surrounding the spin chuck 3, a plurality of cups 42, 43 (first and second cups 42, 43) fixedly provided between the spin chuck 3 and the cylindrical member 50, a plurality of guards 44 to (first to fourth guards 44 to 47) which each receive a treatment liquid (chemical liquid and rinse liquid) scattered around the substrate W, and a guard lift unit 48 which independently moves up and down the respective guards 44 to 47. By driving the guard lift unit 48, the guards 44 to 47 are independently moved up and down. The guard lift unit 48 includes, for example, a ball screw mechanism.

The cylindrical member 50 surrounds the spin chuck 3. The cylindrical member 50 is configured to retain the treatment liquid therein. The treatment liquid retained in the cylindrical member 50 is guided to a drain unit (not shown). An upstream end of the cup evacuation duct 49 is connected to a predetermined circumferential portion of a lower edge portion of the cylindrical member 50. A downstream end of the cup evacuation duct 49 is connected to the evacuation unit (not shown) provided outside the apparatus. An internal atmosphere of the cylindrical member 50 is expelled through the cup evacuation duct 49 by the evacuation unit (not shown). A third cup 74 is disposed along an inner periphery of the cylindrical member 50 to surround the first to fourth guards 44 to 47. The third cup 74 has a U-shaped cross section to define a drain channel 75 for collecting and draining a treatment liquid used for the treatment of the substrate W. The treatment liquid collected in the drain channel 75 is guided to the drain unit (not shown).

The treatment cup 7 is collapsible, and the guard lift unit 48 moves up and down at least one of the four guards 44 to 47, whereby the treatment cup 7 is expanded and collapsed.

The first cup 42 has an annular shape, and surrounds the spin chuck 3 between the spin chuck 3 and the cylindrical member 50. The first cup 42 is generally rotationally symmetrical about the rotation axis A1 of the substrate W. The first cup 42 integrally includes an annular bottom 51 (see FIGS. 2 and 3) as seen in plan, a cylindrical inner wall 52 (see FIG. 2 and the like) extending upright from an inner peripheral edge of the bottom 51, and a cylindrical outer wall 53 (see FIG. 2 and the like) extending upright from an outer peripheral edge of the bottom 51. The bottom 51, the inner wall 52 and the outer wall 53 form a U-shaped cross section. The bottom 51, the inner wall 52 and the outer wall 53 define a first drain/recovery channel 54 (see FIG. 2 and the like) for recovering or draining the treatment liquid used for the treatment of the substrate W. The first drain/recovery channel 54 has a first drain/recovery port 92 (see FIG. 4) which opens in a lowermost bottom portion thereof. A first common pipe 93 is connected to the first drain/recovery port 92. The first common pipe 93 is branched to be connected to a first recovery pipe 95 and a first drain pipe 96. A first recovery valve 95A is provided in the first recovery pipe 95, and a first drain valve 96A is provided in the first drain pipe 96. By opening the first recovery valve 95A with the first drain valve 96A closed, liquid flowing through the first common pipe 93 is guided to the first recovery pipe 95 (recovery port (see FIG. 7A and the like)). By opening the first drain valve 96A with the first recovery valve 95A closed, the liquid flowing through the first common pipe 93 is guided to the first drain pipe 96 (drain port (see FIG. 7A and the like)). That is, the first recovery valve 95A and the first drain valve 96A function as switch valves which switch the destination of the liquid flowing through the first common pipe 93 between the first recovery pipe 95 and the first drain pipe 96.

A distal end portion of the first recovery pipe 95 extends to a recovery treatment unit (not shown), and a distal end portion of the first drainpipe 96 extends to the drain unit (not shown). By switching the destination by units of the switch valves (the first recovery valve 95A and the first drain valve 96A), the liquid flowing through the first common pipe 93 is selectively guided to the first recovery pipe 95 and the first drain pipe 96. Thus, the treatment liquid expelled from the substrate W is recovered or drained.

The second cup 43 has an annular shape, and surrounds the spin chuck 3 between the first cup 42 and the cylindrical member 50. The second cup 43 is generally rotationally symmetrical about the rotation axis A1 of the substrate W. The second cup 43 has a U-shaped cross section, and defines a second drain/recovery channel 55 (see FIG. 2 and the like) for collecting and recovering the treatment liquid used for the treatment of the substrate W. The second drain/recovery channel 55 has a second drain/recovery port 97 which opens in a lowermost bottom portion thereof. A second common pipe 98 is connected to the second drain/recovery port 97. The second common pipe 98 is branched to be connected to a second recovery pipe 100 and a second drain pipe 101. A second recovery valve 100A is provided in the second recovery pipe 100, and a second drain valve 101A is provided in the second drain pipe 101. By opening the second recovery valve 100A with the second drain valve 101A closed, liquid flowing through the second common pipe 98 is guided to the second recovery pipe 100. By opening the second drain valve 101A with the second recovery valve 100A closed, the liquid flowing through the second common pipe 98 is guided to the second drain pipe 101. That is, the second recovery valve 100A and the second drain valve 101A function as switch valves which switch the destination of the liquid flowing through the second common pipe 98 between the second recovery pipe 100 and the second drain pipe 101. A distal end portion of the second recovery pipe 100 extends to the recovery treatment unit (not shown), and a distal end portion of the second drain pipe 101 extends to the drain unit (not shown). By switching the destination by units of the switch valves (the second recovery valve 100A and the second drain valve 101A), the liquid flowing through the second common pipe 98 is selectively guided to the second recovery pipe 100 and the second drain pipe 101.

A third drain/recovery port 102 opens in a lowermost bottom portion of a third drain/recovery channel 66. A third common pipe 103 is connected to the third drain/recovery port 102. The third common pipe 103 is branched to be connected to a third recovery pipe 105 and a third drain pipe 106. A third recovery valve 105A is provided in the third recovery pipe 105, and a third drain valve 106A is provided in the third drain pipe 106. By opening the third recovery valve 105A with the third drain valve 106A closed, liquid flowing through the third common pipe 103 is guided to the third recovery pipe 105. By opening the third drain valve 106A with the third recovery valve 105A closed, the liquid flowing through the third common pipe 103 is guided to the third drain pipe 106. That is, the third recovery valve 105A and the third drain valve 106A function as switch valves which switch the destination of the liquid flowing through the third common pipe 103 between the third recovery pipe 105 and the third drain pipe 106. A distal end portion of the third recovery pipe 105 extends to the recovery treatment unit (not shown), and a distal end portion of the third drain pipe 106 extends to the drain unit (not shown). By switching the destination by means of the switch valves (the third recovery valve 105A and the third drain valve 106A), the liquid flowing through the third common pipe 103 is selectively guided to the third recovery pipe 105 and the third drain pipe 106.

The innermost first guard 44 surrounds the spin chuck 3, and is generally rotationally symmetrical about the rotation axis A1 of the substrate W rotated by the spin chuck 3. The first guard 44 integrally includes a cylindrical guide portion 56 surrounding the spin chuck 3, and a cylindrical treatment liquid separation wall 57 connected to the guide portion 56. The guide portion 56 includes a cylindrical lower portion 58 (see FIG. 2 and the like) surrounding the spin chuck 3, a cylindrical thicker portion 59 (see FIG. 2 and the like) extending outward from an upper edge of the lower portion 58 (away from the rotation axis A1 of the substrate W), a cylindrical middle portion 60 (see FIG. 2 and the like) extending vertically upward from an outer periphery of an upper surface of the thicker portion 59, and an annular upper portion 61 (see FIG. 2 and the like) extending obliquely upward inward (toward the rotation axis A1 of the substrate W) from an upper edge of the middle portion 60.

The treatment liquid separation wall 57 slightly extends vertically downward from the outer periphery of the thicker portion 59, and is located above the second drain/recovery channel 55 (see FIG. 2 and the like). The lower portion 58 of the guide portion 56 is located above the first drain/ recovery channel 54 (see FIG. 2 and the like), and is accommodated in the first drain/recovery channel 54 when the first guard 44 and the first cup 42 are located closest to each other. An inner peripheral edge of the upper portion 61 has a round shape having a greater diameter than the substrate W held by the spin chuck 3 as seen in plan. The upper portion 61 may have a linear sectional shape as shown in FIG. 1 and the like, or may have a gradual arcuate shape, for example.

The second guard 45 located at the second innermost position is generally rotationally symmetrical about the rotation axis A1 of the substrate W around the first guard 44. The second guard 45 integrally includes a guide portion 62, and a cup portion 63 provided outside the guide portion 62.

The guide portion 62 includes a cylindrical portion 64 (see FIG. 2 and the like) provided outside the middle portion 60 of the first guard 44 coaxially with the middle portion 60, and an upper portion 65 (see FIG. 2 and the like) extending obliquely upward toward the center from an upper edge of the cylindrical portion 64 (toward the rotation axis A1 of the substrate W). The cylindrical portion 64 is located above the second drain/recovery channel 55, and is accommodated in the second drain/recovery channel 55 when the second guard 45 and the second cup 43 are located closest to each other. An inner peripheral edge of the upper portion 65 has a round shape having a greater diameter than the substrate W held by the spin chuck 3 as seen in plan. The upper portion 65 may have a linear sectional shape as shown in FIG. 1 and the like, or may have a gradual arcuate shape, for example.

The cup portion 63 is connected to an outer periphery of the upper portion 65 of the guide portion 62. The cup portion 63 is disposed between the second cup 43 and the cylindrical member 50 as seen in plan. The cup portion 63 is generally rotationally symmetrical about the rotation axis A1 of the substrate W. The cup portion 63 has a U-shaped sectional shape, and defines a third drain/recovery channel 66 (see FIG. 2 and the like) for collecting and recovering the treatment liquid used for the treatment of the substrate W. The treatment liquid collected in the third drain/recovery channel 66 is sent to the recovery treatment unit (not shown) or the drain unit (not shown).

The third guard 46 located at the third innermost position is generally rotationally symmetrical about the rotation axis A1 of the substrate W rotated by the spin chuck 3. The third guard 46 surrounds the spin chuck 3. The third guard 46 integrally includes a cylindrical lower portion 68 (see FIG. 2 and the like) surrounding the second guard 45, an annular upper portion 69 (see FIG. 2 and the like) extending obliquely upward inward from an upper edge of the lower portion 68, a suspended portion 70 (see FIG. 2 and the like) extending vertically downward from an outer peripheral edge of the upper portion 69, and a projection 71 (see FIG. 2 and the like) projecting outward from a middle portion of the suspended portion 70 and having an outer peripheral portion extending vertically downward. The lower portion 68 is located above the third drain/recovery channel 66, and is accommodated in the third drain/recovery channel 66 when the second guard 45 and the third guard 46 are located closest to each other. The projection 71 is located above the drain channel 75, and is accommodated in the drain channel 75 when the third guard 46 is located at a lower position. An inner peripheral edge of the upper portion 69 has a round shape having a greater diameter than the substrate W held by the spin chuck 3 as seen in plan. The upper portion 69 may have a linear sectional shape as shown in FIG. 1 and the like, or may have a gradual arcuate shape, for example.

The outermost fourth guard 47 surrounds the spin chuck 3 outside the third guard 46, and is generally rotationally symmetrical about the rotation axis A1 of the substrate W rotated by the spin chuck 3. The fourth guard 47 includes a cylindrical portion 72 coaxial with the third guard 46, and an upper portion 73 extending obliquely upward toward the center (toward the rotation axis A1 of the substrate W) from an upper edge of the cylindrical portion 72. The cylindrical portion 72 is located above the projection 71 of the third guard 46. An inner peripheral edge of the upper portion 73 has a round shape having a greater diameter than the substrate W held by the spin chuck 3. The upper portion 73 may have a linear sectional shape as shown in FIG. 1 and the like, or may have a gradual arcuate shape, for example.

As shown in FIG. 1, the guard lift unit 48 moves up and down the respective guards 44 to 47 between an upper position such that the guard upper edge is located above the substrate W and a lower position such that the guard upper edge is located below the substrate W. The guard lift unit 48 can retain each of the guards 44 to 47 at a desired position between the upper position and the lower position. When the treatment liquid is supplied to the substrate W or when the substrate W is dried, any one of the guards 44 to 47 is opposed to the peripheral surface of the substrate W.

Where the innermost first guard 44 is opposed to the peripheral surface of the substrate W, as shown in FIG. 2, all the first to fourth guards 44 to 47 are located at the upper position. In this state, a lower edge of the lower portion 58 of the first guard 44 is located at the same level as an upper edge of the first drain/recovery channel 54. That is, only the distal edge of the lower portion 58 of the first guard 44 enters the first drain/recovery channel 54.

Where the second guard 45 located at the second innermost position is opposed to the peripheral surface of the substrate W, the second to fourth guards 45 to 47 are each located at the upper position (the position shown in FIG. 2), and the first guard 44 is located at the lower position (the position shown in FIG. 3).

Where the third guard 46 located at the third innermost position is opposed to the peripheral surface of the substrate W, the third and fourth guards 46, 47 are each located at the upper position (the position shown in FIG. 2), and the first and second guards 44, 45 are each located at the lower position (the position shown in FIG. 3).

Where the outermost fourth guard 47 is opposed to the peripheral surface of the substrate W, as shown in FIG. 3, the fourth guard 47 is located at the upper position, and the first to third guards 44 to 46 are each located at the lower position.

The substrate treatment apparatus 1 further includes a first cleaning liquid nozzle 76 which spouts the cleaning liquid toward a peripheral surface and a bottom surface (base wall surface) of an outer periphery 15A of the spin base 15, a first cleaning liquid supplying unit 77 which supplies the cleaning liquid to the first cleaning liquid nozzle 76, a second cleaning liquid nozzle 78 which supplies the cleaning liquid to an inner wall of the first cup 42 (cup inner wall), and a second cleaning liquid supplying unit 79 which supplies the cleaning liquid to the second cleaning liquid nozzle 78. The first and second cleaning liquid nozzles 76, 78 each include a plurality of cleaning liquid nozzles (e.g., the first cleaning liquid nozzle 76 includes two first cleaning liquid nozzles 76, and the second cleaning liquid nozzle 78 includes four second cleaning liquid nozzles 78).

The cleaning liquid is pure water (deionized water) by way of example but not by way of limitation. A cleaning chemical liquid (e.g., SC1 (a liquid mixture of $NH_4OH$ and $H_2O_2$) may be used.

The first cleaning nozzles 76 each have a single first cleaning liquid outlet port 80 (see FIG. 5) which is opposed to the peripheral surface and the bottom surface of the outer periphery 15A. As shown in FIG. 5, the first cleaning liquid outlet port 80 is directed obliquely upward radially inward of the spin base 15. The two first cleaning liquid outlet ports 80 are located in an upper portion of the taper surface 24A of the boss 21. That is, the two first cleaning liquid outlet ports 80 are located obliquely below the outer periphery 15A of the spin base 15. The two first cleaning liquid outlet ports 80 are located at the same height, more specifically, in diametrically opposed relation about the center (rotation axis A1) of the spin base 15 as shown in FIG. 4.

The second cleaning liquid nozzles 78 each have a single second cleaning liquid outlet port 81 (see FIG. 5). As shown in FIG. 5, the four second cleaning liquid outlet ports 81 are located at the same height in the upper portion of the taper surface 24A of the boss 21. The second cleaning liquid outlet ports 81 are disposed obliquely below the spin base 15 radially outward of the spin base 15. As shown in FIG. 4, the four second cleaning liquid outlet ports 81 are spaced a predetermined distance from each other circumferentially of the spin base 15 so as to be symmetrical with respect to a phantom line A2 extending between the first drain/recovery port 92 and the center (rotation axis A1) of the spin base 15. The second cleaning liquid nozzles 78 are absent in a circumferential region of the boss 21 near the first drain/recovery port 92.

As shown in FIG. 5, the first cleaning liquid supplying unit 77 includes a first cleaning liquid flow passage 82 provided inside the boss 21, a first cleaning liquid supply line 83 which supplies the cleaning liquid to the first cleaning liquid flow passage 82, and a first cleaning liquid valve 84 which opens and closes the first cleaning liquid supply line 83. The first cleaning liquid flow passage 82 includes a first common flow passage 85 extending semicircumferentially and having a rectangular cross section (also see FIG. 4), and a plurality of first branch flow passages 86 which connect the first common flow passage 85 to the first cleaning liquid outlet ports 80, respectively. The first branch flow passages 86 extend vertically upward from the first common flow passage 85 and are then bent obliquely upward to open in the taper surface 24A of the boss 21 to thereby define the first cleaning liquid outlet ports 80.

As shown in FIG. 5, the second cleaning liquid supplying unit 79 includes a second cleaning liquid flow passage 87 provided inside the boss 21, a second cleaning liquid supply line 88 which supplies the cleaning liquid to the second cleaning liquid flow passage 87, and a second cleaning liquid valve 89 which opens and closes the second cleaning liquid supply line 88. The second cleaning liquid flow passage 87 includes a second common flow passage 90 having a rectangular cross section and extending in an arcuate configuration having the same diameter as the first common flow passage 85 and coaxial with the first common flow passage 85 (also see FIG. 4), and a plurality of second branch flow passages 91 which connect the second common flow passage 90 to the second cleaning liquid outlet ports 81, respectively. The second common flow passage 90 is provided at the same height as the first common flow passage 85 in non-overlapping relation with the first common flow passage 85 circumferentially of the spin base 15. The second branch flow passages 91 extend vertically upward from the second common flow passage 90 and are then bent obliquely downward to open in the taper surface 24A of the boss 21 to thereby define the second cleaning liquid outlet ports 81.

FIG. 6 is a process diagram for explaining an exemplary resist removing process to be performed on the substrate W by the substrate treatment apparatus 1. FIGS. 7A to 7D are schematic diagrams showing the exemplary resist removing process.

Referring to FIGS. 1 and 6, the exemplary resist removing process will hereinafter be described. Reference will also be made to FIGS. 2 to 5 and FIGS. 7A to 7D.

When the resist removing process is to be performed by the substrate treatment apparatus 1, a substrate W subjected to a high-dose ion implantation process is loaded into the treatment chamber 2 (Step S1). The substrate W to be loaded is not subjected to a resist asking process. The substrate W has a front surface formed with a minute pattern having a higher-aspect ratio. More specifically, the controller 8 retracts all the nozzles and the like from above the spin chuck 3, and moves the first to fourth guards 44 to 47 to the lower position (the lowermost position). While the upper edges of the first to fourth guards 44 to 47 are located below a substrate holding position at which the substrate W is to be held by the spin chuck 3, hands (not shown) of a substrate transport robot (not shown) are moved into the treatment chamber 2 with the substrate W held thereon, whereby the substrate W is transferred to the spin chuck 3 with its front surface facing up.

Thereafter, the controller 8 controls the guard lift unit 48 to move the first to fourth guards 44 to 47 to the upper position (the uppermost position) to bring the first guard 44 into opposed relation to the peripheral surface of the substrate W. [0109] Then, the controller 8 causes the spin motor 13 to start rotating the substrate W (Step S2). The rotation speed of the substrate W is increased to a predetermined sulfuric acid-containing liquid treatment speed (100 to 500 rpm, e.g., about 300 rpm) and maintained at the sulfuric acid-containing liquid treatment speed. The controller 8 controls the first recovery valve 95A and the first drain valve 96A to set the destination of the liquid flowing through the first common pipe 93 to the first recovery pipe 95.

After the rotation speed of the substrate W reaches the sulfuric acid-containing liquid treatment speed, the controller 8 performs a sulfuric acid-containing liquid supplying step of supplying the SPM to the substrate W (first chemical liquid supplying step, Step S3). More specifically, the controller 8 controls the first arm pivoting unit 30 to move the sulfuric acid-containing liquid nozzle 27 from the home position to the treatment position. Thus, the sulfuric acid-containing liquid nozzle 27 is located above the substrate W.

Figure 7A:
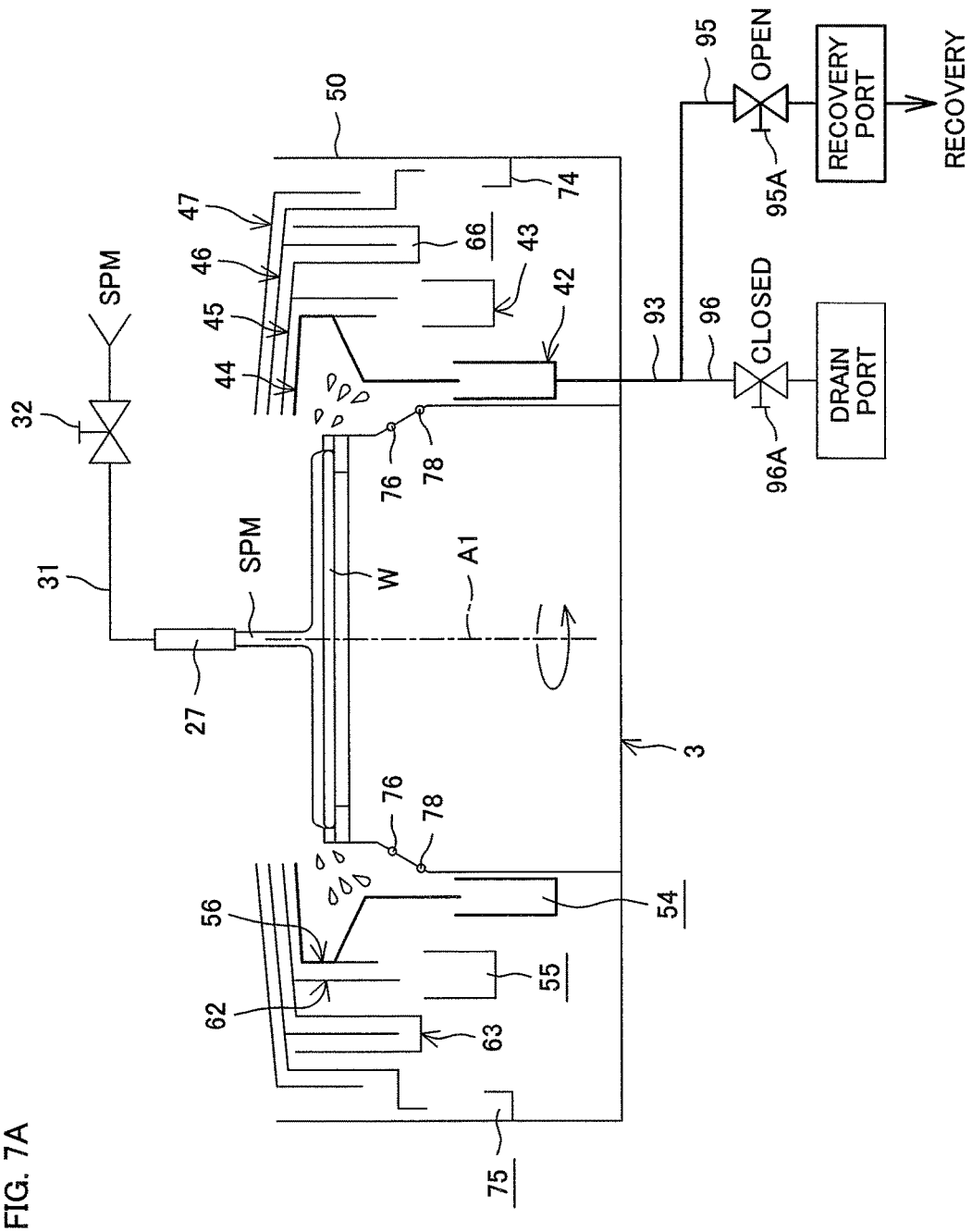
FIGS. 7A to 7D are schematic diagrams showing the exemplary substrate treatment process.

After the sulfuric acid-containing liquid nozzle 27 is located above the substrate W, the controller 8 opens the sulfuric acid-containing liquid valve 32, whereby the SPM is spouted from the spout of the sulfuric acid-containing liquid nozzle 27 to be applied to the upper surface of the substrate W as shown in FIG. 7A. The controller 8 controls the first arm pivoting unit 30 to move the SPM application position between the center portion and the peripheral portion of the upper surface of the substrate W at this state.

After the SPM spouted from the sulfuric acid-containing liquid nozzle 27 is applied to the upper surface of the substrate W rotated at the sulfuric acid-containing liquid treatment speed (e.g., 300 rpm), the SPM receives a centrifugal force to flow outward on the upper surface of the substrate W. Therefore, the SPM is supplied to the entire upper surface of the substrate W, whereby a liquid film of the SPM is formed on the substrate W as covering the entire upper surface of the substrate W. The resist on the substrate W is removed from the substrate W by a chemical reaction between the resist and the SPM. The controller 8 moves the SPM application position between the center portion and the peripheral portion of the upper surface of the substrate W, while rotating the substrate W. Thus, the SPM application position passes over the entire upper surface of the substrate W, whereby the entire upper surface of the substrate W is scanned with the SPM application position. Therefore, the SPM spouted from the sulfuric acid-containing liquid nozzle 27 is supplied to the entire upper surface of the substrate W to evenly treat the entire upper surface of the substrate W. The SPM supplied to the upper surface of the substrate W is scattered from the periphery of the substrate W laterally of the substrate W.

The SPM scattered from the periphery of the substrate W is received by the inner wall of the first guard 44. The chemical liquid flows down on the inner wall of the first guard 44, and is received by the first cup 42 and collected in a bottom portion of the first cup 42 to be guided to the first common pipe 93. At this time, the destination of the liquid flowing through the first common pipe 93 is set to the first recovery pipe 95 by the first recovery valve 95A and the first drain valve 96A, so that the SPM guided to the first common pipe 93 is further guided to the recovery treatment unit (not shown) through the first recovery pipe 95. After the sulfuric acid-containing liquid supplying step (S3), the SPM adheres to the inner wall of the first cup 42, the peripheral surface and the bottom surface of the outer periphery 15A and the pipe wall of the first common pipe 93.

After a lapse of a predetermined period from the start of the spouting of the SPM, the controller 8 closes the sulfuric acid-containing liquid valve 32 to stop spouting the SPM. Further, the controller 8 controls the first arm pivoting unit 30 to move the sulfuric acid-containing liquid nozzle 27 from the treatment position to the home position.

After the end of the sulfuric acid-containing liquid supplying step (S3), a rinsing step of supplying the rinse liquid to the substrate W (Step S4) is performed with the first guard 44 opposed to the peripheral surface of the substrate W. More specifically, the controller 8 controls the first recovery valve 95A and the first drain valve 96A to switch the destination of the liquid flowing through the first common pipe 93 to the first drain pipe 96. Further, the controller 8 opens the rinse liquid valve 41 to spout the rinse liquid from the rinse liquid nozzle 39 toward the upper surface center portion of the substrate W as shown in FIG. 7B.

The rinse liquid spouted from the rinse liquid nozzle 39 is applied to the upper surface center portion of the substrate W covered with the SPM liquid film, and receives a centrifugal force generated by the rotation of the substrate W to flow toward the periphery of the substrate W on the upper surface of the substrate W. Thus, the SPM on the substrate W is forced to flow outward by the rinse liquid to be expelled around the substrate W. Therefore, the SPM liquid film on the substrate W is replaced with a liquid film of the rinse liquid covering the entire upper surface of the substrate W. Thus, the SPM is rinsed away from the entire upper surface of the substrate W. The rinse liquid supplied to the upper surface of the substrate W is scattered from the periphery of the substrate W laterally of the substrate W.

The rinse liquid scattered from the periphery of the substrate W is received by the inner wall of the first guard 44. The rinse liquid flows down on the inner wall of the first guard 44, and then drips from the lower edge of the lower portion 58 to be received in the first cup 42. The rinse liquid supplied to the first cup 42 moves circumferentially of the first cup 42 toward the first drain/recovery port 92 in the first cup 42 to be guided to the first common pipe 93 from the first drain/recovery port 92. Since the destination of the liquid flowing through the first common pipe 93 is set to the first drain pipe 96, the rinse liquid guided to the first common pipe 93 is further guided to the drain unit (not shown) through the first drain pipe 96.

Figure 7B:
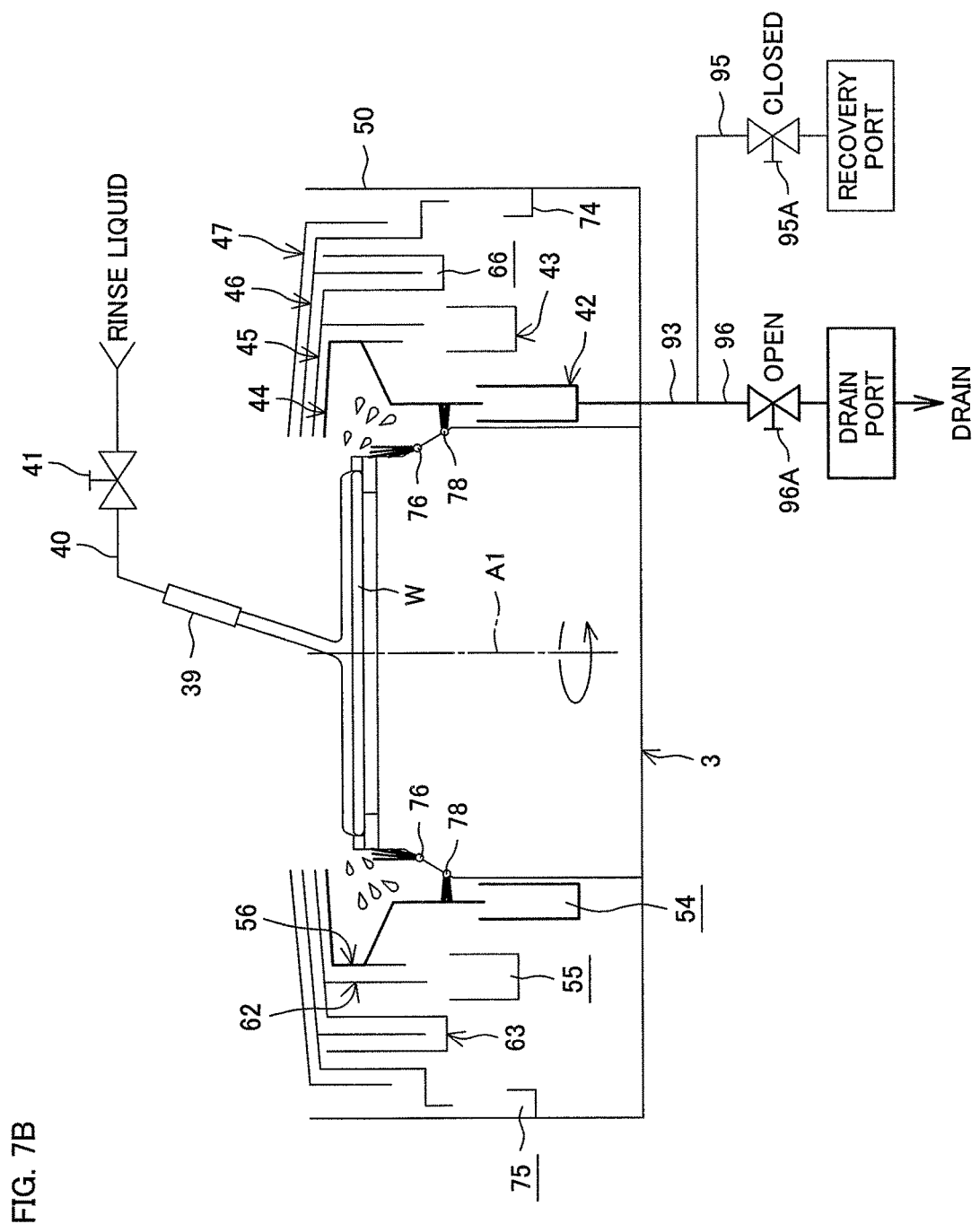

In the rinsing step (S4), as shown in FIGS. 2 and 7B, the controller 8 opens the first cleaning liquid valve 84 and the second cleaning liquid valve 89 to spout the cleaning liquid from the first cleaning liquid outlet ports 80 of the first cleaning liquid nozzles 76 (see FIG. 5) and the second cleaning liquid outlet ports 81 of the second cleaning liquid nozzles 78 (see FIG. 5) (first cleaning liquid supplying step).

As shown in FIG. 2, the cleaning liquid spouted from the first cleaning liquid nozzles 76 is sprayed onto the peripheral surface and the bottom surface of the outer periphery 15A. Thus, the SPM is washed away from the peripheral surface and the bottom surface of the outer periphery 15A. The cleaning liquid spouted from the first cleaning liquid nozzles 76 is splashed on the wall surface of the outer periphery 15A to be applied to inner wall portions (e.g., the inner walls of the middle portion 60 and the thicker portion 59) of the first guard 44. Then, the cleaning liquid flows down on the inner wall of the lower portion 58 of the first guard 44, and drips from the lower edge of the lower portion 58 to be received in the first drain/recovery channel 54 of the first cup 42. The cleaning liquid spouted from the second cleaning liquid outlet ports 81 is sprayed onto a vertically middle inner wall portion of the lower portion 58 of the first guard 44 to flow down on the inner wall of the lower portion 58. Then, the cleaning liquid drips from the lower edge of the lower portion 58 to be received in the first drain/recovery channel 54 of the first cup 42. As indicated by arrows in FIG. 4, the cleaning liquid supplied to the first drain/recovery channel 54 moves circumferentially of the first cup 42 toward the first drain/recovery port 92 in the first drain/recovery channel 54 to be guided to the first common pipe 93 from the first drain/recovery port 92. Since the destination of the liquid flowing through the first common pipe 93 is set to the first drain pipe 96, the cleaning liquid guided to the first common pipe 93 is further guided to the drain unit (not shown) through the first drain pipe 96 to be drained. The cleaning liquid flows in the first cup 42 and the first common pipe 93, whereby the inner wall of the first cup 42 and the pipe wall of the first common pipe 93 are cleaned.

In the rinsing step (S4), the rinse liquid is scattered on the peripheral surface and the bottom surface of the outer periphery 15A, and the rinse liquid received by the first guard 44 flows on the inner wall of the first cup 42 and on the pipe wall of the first common pipe 93. Thus, the SPM adhering to the inner wall of the first cup 42, the peripheral surface and the bottom surface of the outer periphery 15A and the pipe wall of the first common pipe 93 is considered to be rinsed away with the rinse liquid after the sulfuric acid-containing liquid supplying step (S3). However, the rinsing with the rinse liquid in the rinsing step (S4) alone is considered to be insufficient because the SPM partly remains on the inner wall of the first cup 42, the peripheral surface and the bottom surface of the outer periphery 15A and the pipe wall of the first common pipe 93.

In this exemplary process, the first cleaning liquid supplying step is performed in the rinsing step (S4). Thus, the SPM adhering to the inner wall of the first cup 42 and the peripheral surface and the bottom surface of the outer periphery 15A and the SPM adhering to the pipe wall of the first common pipe 93 are washed away with the cleaning liquid spouted from the first and second cleaning liquid nozzles 76, 78.

In this exemplary process, the organic solvent supplying step (S5) is performed after the end of the rinsing step (S4). Thus, the rinse liquid intruding into the minute pattern on the front surface of the substrate W is replaced with the organic solvent (IPA) having a lower surface tension prior to a spin drying step (S6) to be described later. This prevents the collapse of the pattern in the subsequent spin drying step (S6).

After a lapse of a predetermined period from the start of the spouting of the rinse liquid, the controller 8 controls the spin motor 13 to reduce the rotation speed of the substrate W stepwise from the sulfuric acid-containing liquid treatment speed to a puddling speed (e.g., about 10 rpm). After the rotation speed of the substrate W is reduced to the puddling speed (e.g., about 10 rpm), the controller 8 controls the spin motor 13 to maintain the rotation speed of the substrate W at the puddling speed. Thus, the rinse liquid film is retained in a puddle form on the entire upper surface of the substrate W.

After a lapse of a predetermined period from the time at which the rotation speed of the substrate W is reduced to the puddling speed (e.g., about 10 rpm), the controller 8 closes the rinse liquid valve 41 to stop spouting the rinse liquid from the rinse liquid nozzle 39. The controller 8 closes the first and second cleaning liquid valves 84, 89 to stop spouting the cleaning liquid from the first and second cleaning liquid nozzles 76, 78.

Then, the controller 8 starts the organic solvent supplying step (second chemical liquid supplying step, Step S5). More specifically, the controller 8 controls the second arm pivoting unit 36 to move the organic solvent nozzle 33 from the home position to the treatment position. Thus, the organic solvent nozzle 33 is located above the center portion of the substrate W. Further, the controller 8 controls the guard lift unit 48 to move the fourth guard 47 to the upper position (uppermost position) to bring the fourth guard 47 into opposed relation to the peripheral surface of the substrate W with the first to third guards 44 to 46 located at the lower position (lowermost position). Further, the controller 8 controls the first recovery valve 95A and the first drain valve 96A to set the destination of the liquid flowing through the first common pipe 93 to the first drain pipe 96.

Figure 7C:
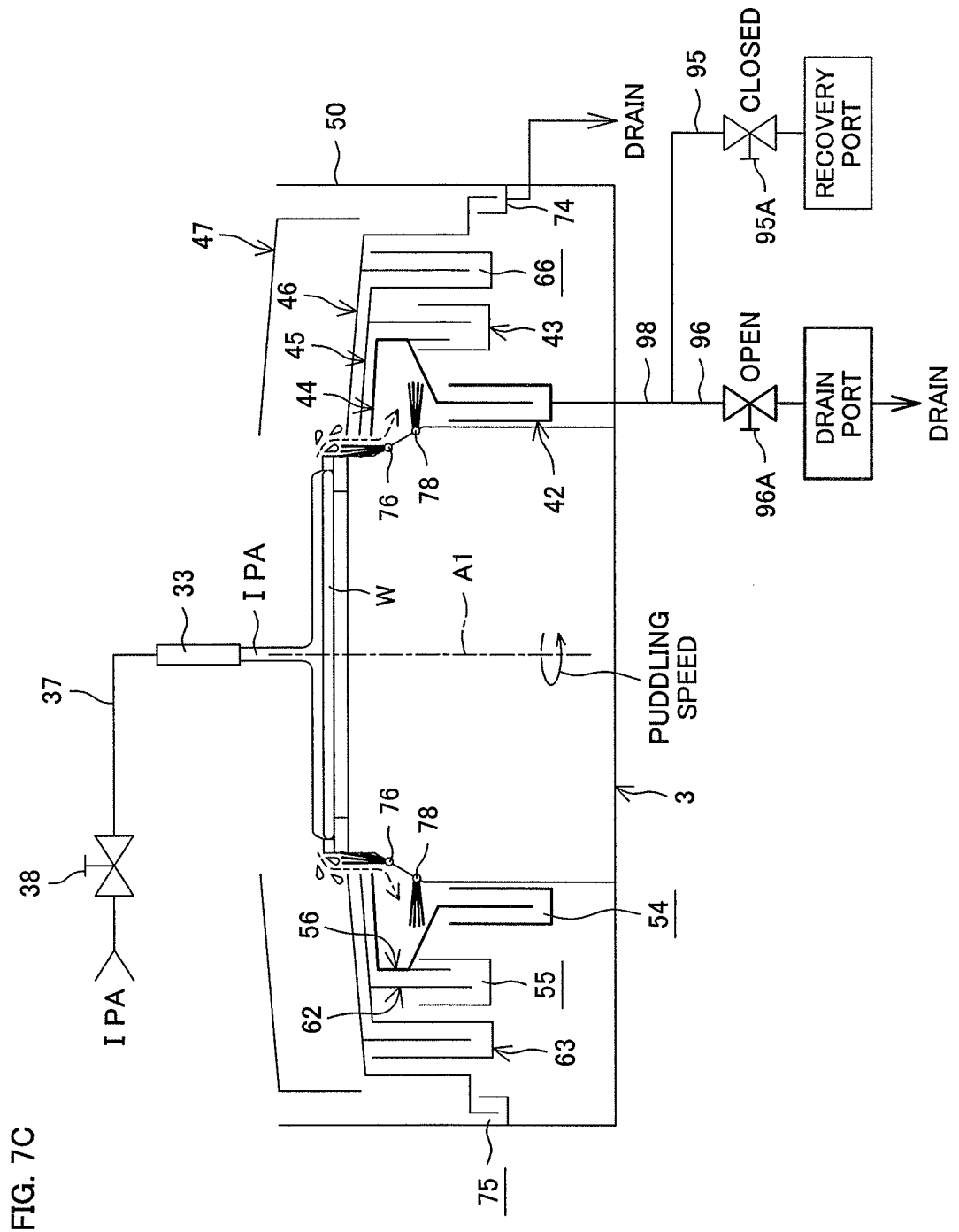

After the organic solvent nozzle 33 is located above the upper surface center portion of the substrate W, the controller 8 opens the organic solvent valve 38 while maintaining the rotation speed of the substrate W at the puddling speed. Thus, as shown in FIG. 7C, IPA is spouted from the spout of the organic solvent nozzle 33 to be applied to the upper surface center portion of the substrate W.

The controller 8 opens the organic solvent valve 38 to spout liquid IPA from the organic solvent nozzle 33 toward the upper surface center portion of the substrate W, while maintaining the rotation speed of the substrate W at the puddling speed. Thus, IPA is supplied to the upper surface of the substrate W, whereby the rinse liquid in the liquid film on the upper surface of the substrate W is sequentially replaced with IPA. Thus, a liquid film of IPA is retained in a puddle form on the upper surface of the substrate W as covering the entire upper surface of the substrate W. Even after the liquid film is substantially replaced with the IPA liquid film on the entire upper surface of the substrate W, the supply of IPA to the upper surface of the substrate W is continued. Therefore, IPA flows out from the periphery of the substrate W.

IPA flowing out from the periphery of the substrate W is received by the inner wall of the fourth guard 47 opposed to the peripheral surface of the substrate W. Then, IPA flows down on the inner wall of the fourth guard 47, and is guided by the projection 71 of the third guard 46 to be received by the drain channel 75 of the third cup 74 and further guided to the drain unit (not shown) from the bottom of the third cup 74 through the drain pipe (not shown).

In the organic solvent supplying step (S5) in which the substrate W is rotated at the puddling speed, a smaller centrifugal force acts on IPA present on the peripheral portion of the substrate W and, therefore, IPA drips from the periphery of the substrate W generally vertically downward. Therefore, some of IPA flowing out laterally of the substrate W does not flow on the fourth guard 47 but is liable to enter the inside of the innermost first guard 44, as indicated by broken lines in FIG. 7C, to adhere to the inner wall of the first cup 42 and the pipe wall of the first common pipe 93. If the sulfuric acid-containing liquid supplying step (S3) for the next substrate treatment (for the next resist removing process) is started with IPA adhering to (or remaining on) the inner wall of the first cup 42, the outer periphery 15A of the spin base 15 and the pipe wall of the first common pipe 93, there is a possibility that the SPM; and IPA are accidentally brought into contact with each other or mixed together in the sulfuric acid-containing liquid supplying step (S3).

To cope with this, as shown in FIGS. 3 and 7C, the controller 8 opens the first cleaning liquid valve 84 and the second cleaning liquid valve 89 in the organic solvent supplying step (S5) to spout the cleaning liquid from the first cleaning liquid outlet ports 80 of the first cleaning liquid nozzles 76 and the second cleaning liquid outlet ports 81 of the second cleaning liquid nozzles 78 (second cleaning liquid supplying step). That is, the second cleaning liquid supplying step is performed in the organic solvent supplying step (S5).

In the second cleaning liquid supplying step, the cleaning liquid spouted from the first cleaning liquid nozzles 76 is sprayed onto the peripheral surface and the bottom surface of the outer periphery 15A. Further, the cleaning liquid spouted from the second cleaning liquid outlet ports 81 is sprayed onto the upper inner wall portion of the lower portion 58 of the first guard 44. In the second cleaning liquid supplying step, the cleaning liquid flows in the same manner as in the first cleaning liquid supplying step. Thus, IPA adhering to the inner wall of the first cup 42 and the peripheral surface and the bottom surface of the outer periphery 15A and IPA adhering to the pipe wall of the first common pipe 93 are washed away with the cleaning liquid.

After a lapse of a predetermined puddling period (e.g., about 10 seconds) from the start of the spouting of IPA, the controller 8 controls the spin motor 13 to accelerate the rotation of the substrate W from the puddling speed to a higher rotation speed (e.g., about 1000 rpm) while continuing the spouting of IPA. After the rotation speed of the substrate W reaches the higher rotation speed, the controller 8 closes the organic solvent valve 38 to stop spouting IPA from the organic solvent nozzle 33, and closes the first and second cleaning liquid valves 84, 89 to stop spouting the cleaning liquid from the first and second cleaning liquid nozzles 76, 78.

Figure 7D:
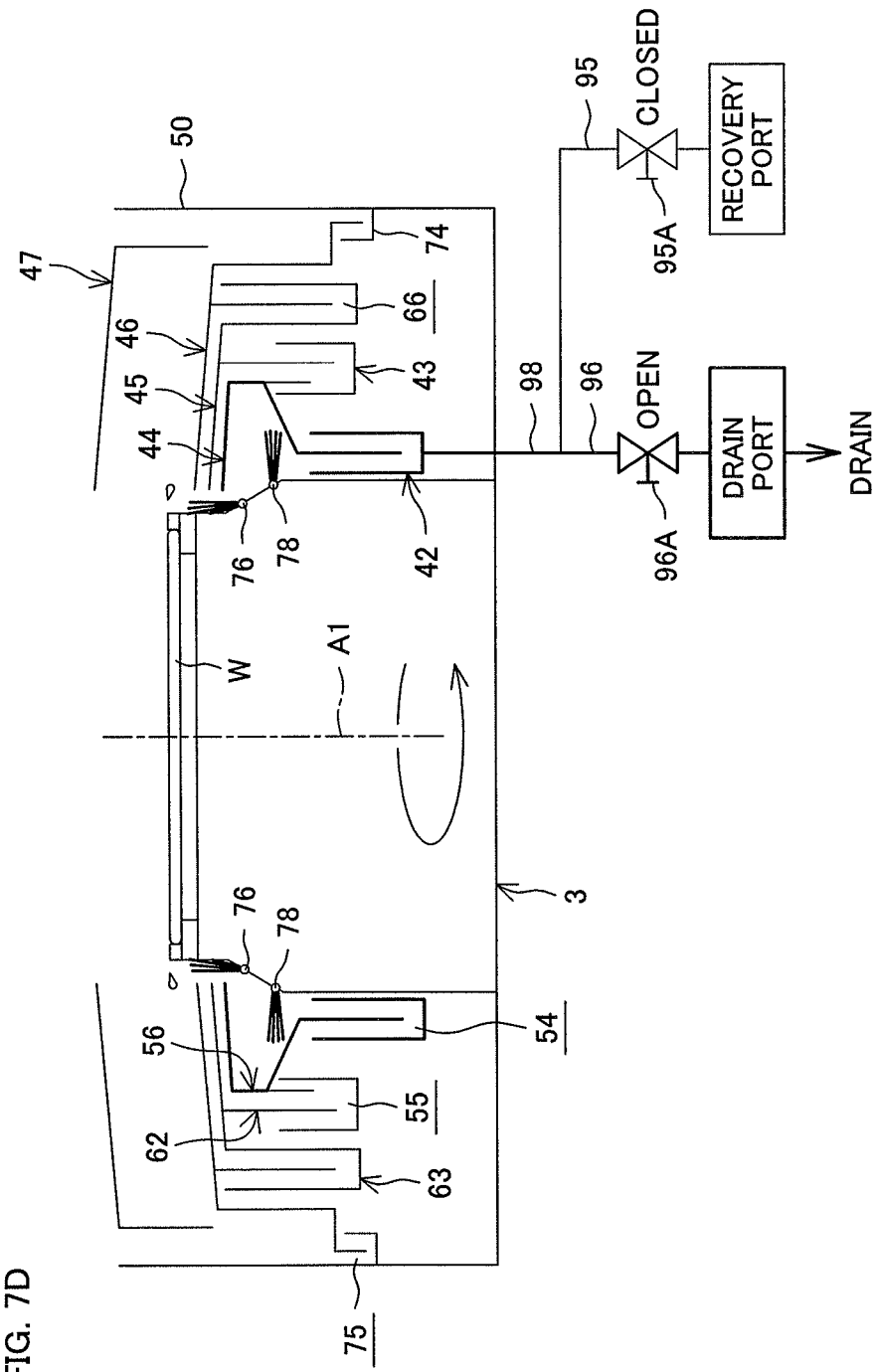

After the spouting of IPA is stopped, the controller 8 performs the spin drying step (Step S6) with the fourth guard 47 opposed to the peripheral surface of the substrate W as shown in FIG. 7D. That is, the controller 8 maintains the rotation speed of the substrate W at the higher rotation speed (e.g., about 1000 rpm). Thus, IPA adhering to the substrate W is spun off to dry the substrate W.

Further, the controller 8 opens the first cleaning liquid valve 84 and the second cleaning liquid valve 89 in the spin drying step (S6) to spout the cleaning liquid from the first cleaning liquid outlet ports 80 of the first cleaning liquid nozzles 76 and from the second cleaning liquid outlet ports 81 of the second cleaning liquid nozzles 78 (third cleaning liquid supplying step). That is, the third cleaning liquid supplying step is performed in the spin drying step (S6).

In the third cleaning liquid supplying step, the cleaning liquid spouted from the first cleaning liquid nozzles 76 is sprayed onto the peripheral surface and the bottom surface of the outer periphery 15A. The cleaning liquid spouted from the second cleaning liquid outlet ports 81 is sprayed onto the upper inner wall portion of the lower portion 58 of the first guard 44. In the third cleaning liquid supplying step, the cleaning liquid flows in the same manner as in the first cleaning liquid supplying step. Thus, IPA adhering to the inner wall of the first cup 42 and the peripheral surface and the bottom surface of the outer periphery 15A and IPA adhering to the pipe wall of the first common pipe 93 are washed away with the cleaning liquid.

After the spin drying step (S6) is performed for a predetermined period, the controller 8 controls the spin motor 13 to stop the rotation of the spin chuck 3 (the rotation of the substrate W) (Step S7).

Thus, the resist removing process for the single substrate W is completed, and the treated substrate W is unloaded from the treatment chamber 2 by the transport robot (Step S8).

Subsequently, a substrate W to be next treated is loaded into the treatment chamber 2, and the substrate treatment (resist removing process) shown in FIG. 6 is performed again. This substrate treatment is repeatedly performed until one lot of substrates W (e.g., 25 substrates W) are treated.

In the first embodiment, the sulfuric acid-containing liquid supplying step (S3) and the organic solvent supplying step (S5) are performed in the single treatment chamber. The SPM and IPA are a combination of chemical liquids which are liable to cause a hazard when being accidentally brought into contact with each other or mixed together. More specifically, the accidental mixing of the SPM and IPA may cause explosion due to the dehydrating action of sulfuric acid contained in the SPM.

In the first embodiment, as described above, the sulfuric acid-containing liquid supplying step (S3), the rinsing step (S4), the organic solvent supplying step (S5) and the spin drying step (S6) are performed in this order in the same treatment chamber. Further, the cleaning liquid is supplied to the inner wall of the first cup 42 and the peripheral surface and the bottom surface of the outer periphery 15A in the rinsing step (S4), the organic solvent supplying step (S5) and the spin drying step (S6).

If the organic solvent supplying step (S5) is started with the SPM adhering to (or remaining on) the inner wall of the first cup 42, the outer periphery 15A of the spin base 15 and the pipe wall of the first common pipe 93, there is a possibility that the SPM and IPA are accidentally brought into contact with each other or mixed together in the organic solvent supplying step (S5).

In the first embodiment, the cleaning liquid is supplied to the inner wall of the first cup 42 and the peripheral surface and the bottom surface of the outer periphery 15A (base wall surface) in the rinsing step (S4) to be performed after the sulfuric acid-containing liquid supplying step (S3), whereby the SPM is removed from the inner wall of the first cup 42 and the peripheral surface and the bottom surface of the outer periphery 15A before the start of the organic solvent supplying step (S5). Therefore, the SPM remains neither on the inner wall of the first cup 42 nor on the peripheral surface and the bottom surface of the outer periphery 15A at the start of the organic solvent supplying step (S5). This reliably prevents the accidental mixing of the SPM and IPA in the organic solvent supplying step (S5).

If the sulfuric acid-containing liquid supplying step (S3) for the next substrate treatment (resist removing process) is started with IPA adhering to (or remaining on) the inner wall of the first cup 42, the outer periphery 15A of the spin base 15 and the pipe wall of the first common pipe 93, there is a possibility that the SPM and IPA are accidentally brought into contact with each other or mixed together in the sulfuric acid-containing liquid supplying step (S3).

In the first embodiment, the cleaning liquid is supplied to the inner wall of the first cup 42 and the peripheral surface and the bottom surface of the outer periphery 15A in the organic solvent supplying step (S5), whereby IPA is removed from the inner wall of the first cup 42 and the peripheral surface and the bottom surface of the outer periphery 15A in the organic solvent supplying step (S5). After the end of the organic solvent supplying step (S5), therefore, IPA remains neither on the inner wall of the first cup 42 nor on the peripheral surface and the bottom surface of the outer periphery 15A. This reliably prevents the accidental mixing of the SPM and IPA in the sulfuric acid-containing liquid supplying step (S3) for the next substrate treatment. Further, the cleaning liquid is supplied to the inner wall of the first cup 42 and the peripheral surface and the bottom surface of the outer periphery 15A in the spin drying step (S6), whereby IPA is removed from the inner wall of the first cup 42 and the peripheral surface and the bottom surface of the outer periphery 15A in the spin drying step (S6). After the end of the spin drying step (S6), therefore, IPA remains neither on the inner wall of the first cup 42 nor on the peripheral surface and the bottom surface of the outer periphery 15A. This reliably prevents the accidental mixing of the SPM and IPA in the sulfuric acid-containing liquid supplying step (S3) for the next substrate treatment.

As described above, even if the plural types of chemical liquids to be used in combination for the substrate treatment (e.g., SPM and IPA) are liable to cause a hazard when being accidentally brought into contact with each other or mixed together, the substrate treatment apparatus 1 is capable of completing the substrate treatment in the single treatment chamber 2 while reliably preventing the accidental mixing of the chemical liquids (SPM and IPA).

Further, the destination of the liquid flowing through the first common pipe 93 is set to the first drain pipe 96 when the cleaning liquid is supplied to the inner wall of the first cup 42 and the peripheral surface and the bottom surface of the outer periphery 15A. Therefore, the cleaning liquid supplied to the inner wall of the first cup 42 and the peripheral surface and the bottom surface of the outer periphery 15A is guided to the first common pipe 93 through the first drain/recovery port 92 provided in the bottom of the first cup 42, and then to the first drain pipe 96. Therefore, even if the SPM or IPA adheres to the pipe wall of the first common pipe 93 in the sulfuric acid-containing liquid supplying step (S3) or the organic solvent supplying step (S5), the adhering SPM or IPA can be washed away with the cleaning liquid flowing through the first common pipe 93. This reliably prevents the accidental mixing of the SPM and IPA on the pipe wall of the first common pipe 93.

The first cleaning liquid nozzles 76 are disposed obliquely below the outer periphery 15A. If the first cleaning liquid nozzles 76 were disposed laterally of the outer periphery 15A of the spin base 15, the first cleaning liquid nozzles 76 would be located between the spin base and the cup as seen in plan, resulting in size increase of the substrate treatment apparatus 1. In this embodiment, in contrast, the first cleaning liquid nozzles 76 are not located laterally of the outer periphery 15A of the spin base 15, so that the size of the substrate treatment apparatus 1 is not increased. Thus, the substrate treatment apparatus 1 is capable of supplying the cleaning liquid to the peripheral surface of the outer periphery 15A of the spin base 15 without the size increase thereof. In addition, the cleaning liquid is supplied to the outer periphery 15A obliquely from below, whereby the SPM or IPA can be advantageously removed from the bottom surface of the outer periphery 15A of the spin base 15.

Since the second cleaning liquid nozzles 78 are absent in the region near the first drain/recovery port 92, the cleaning liquid spouted from the second cleaning liquid nozzles 78 to be supplied to the first cup 42 moves circumferentially of the first cup 42 toward the first drain/recovery port 92 in the first cup 42 to be guided to the first common pipe 93 from the first drain/recovery port 92. That is, a distance for which the cleaning liquid moves in the first cup 42 is increased. Thus, the SPM or IPA can be efficiently removed from the first cup 42.

Figure 8:
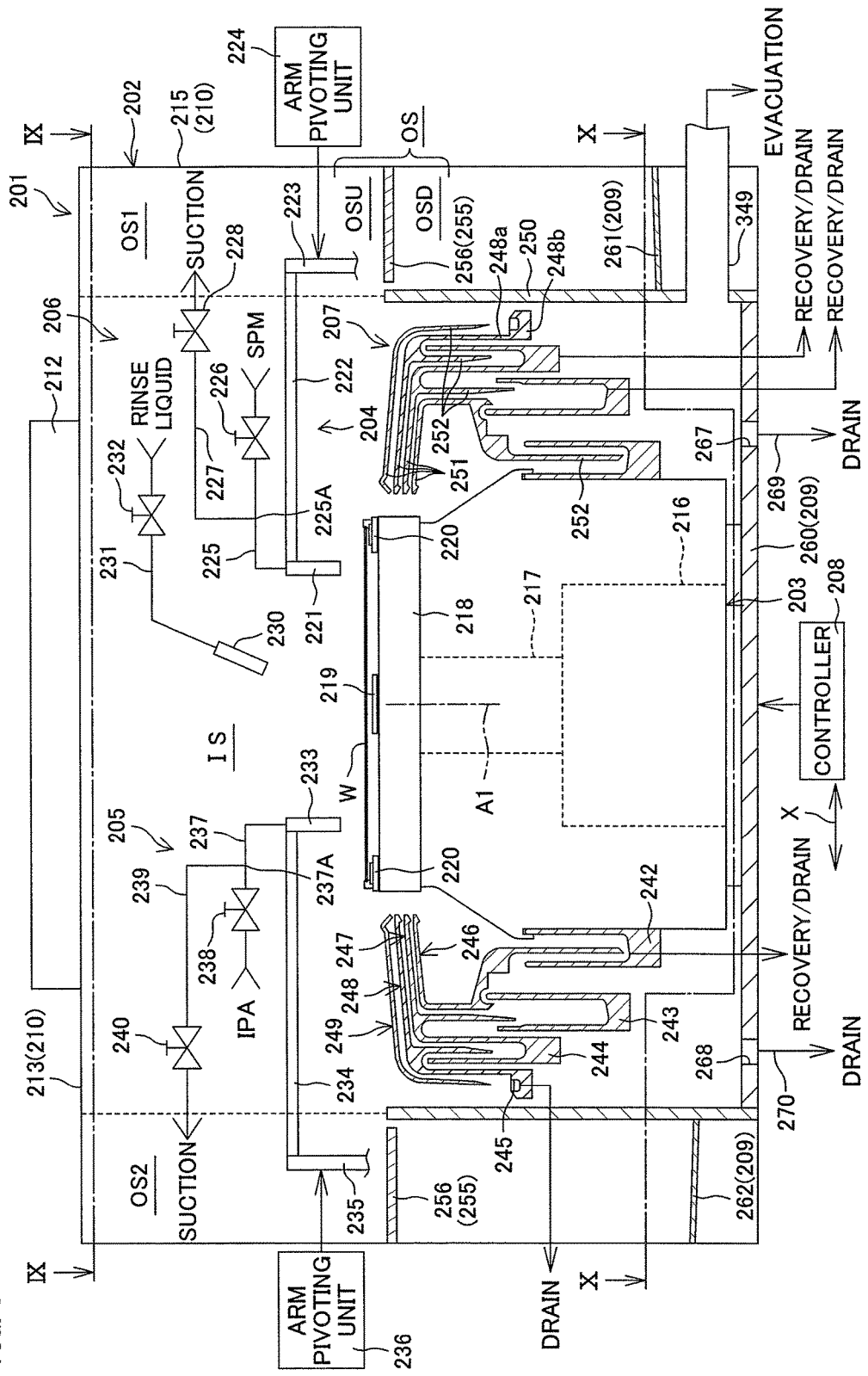
FIG. 8 is a diagram of a substrate treatment apparatus according to a second embodiment of the present invention as seen in a horizontal direction.
Figure 9:
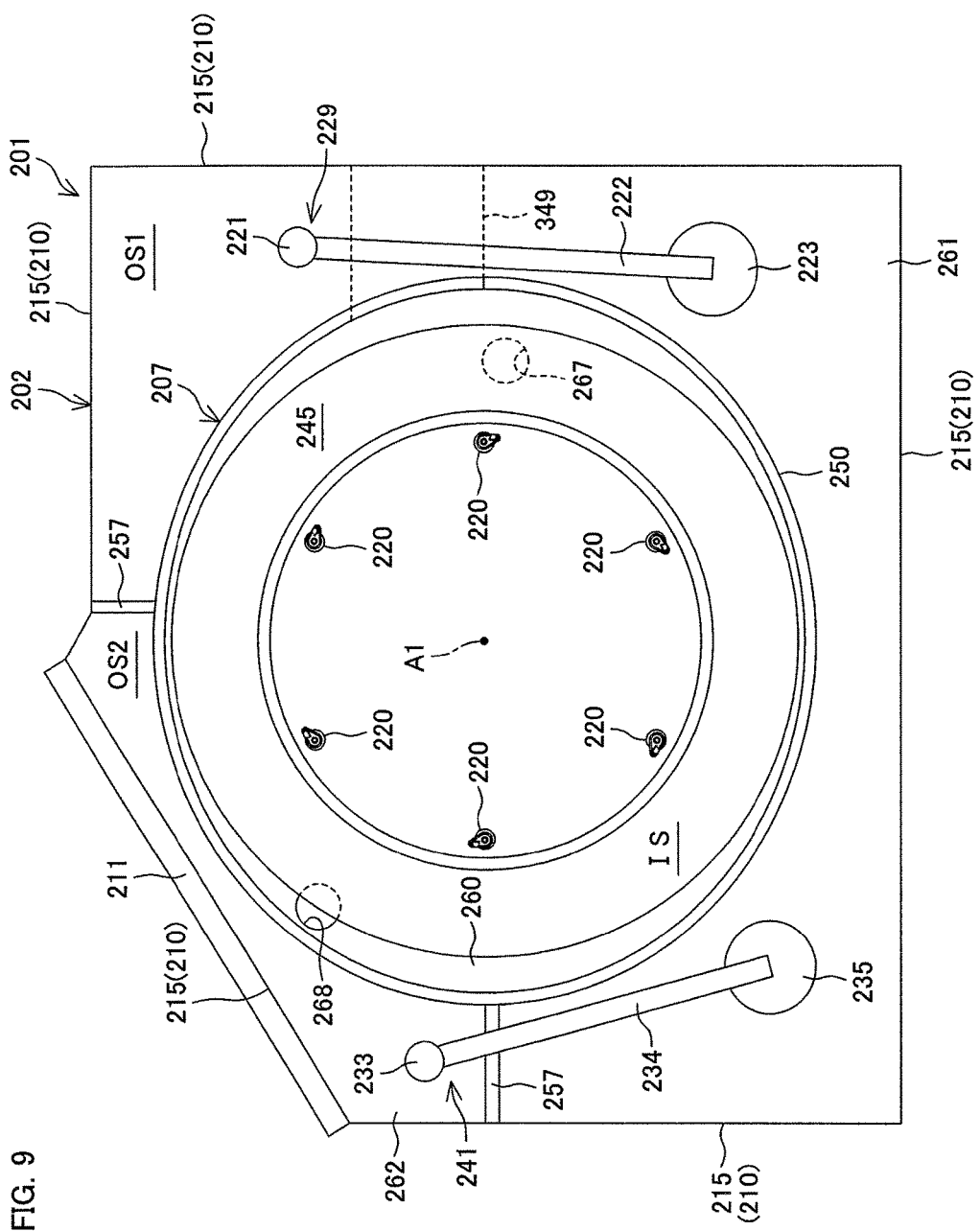
FIG. 9 is a diagram showing the inside of a treatment chamber taken along a sectional plane IX-IX in FIG. 8.
Figure 10:
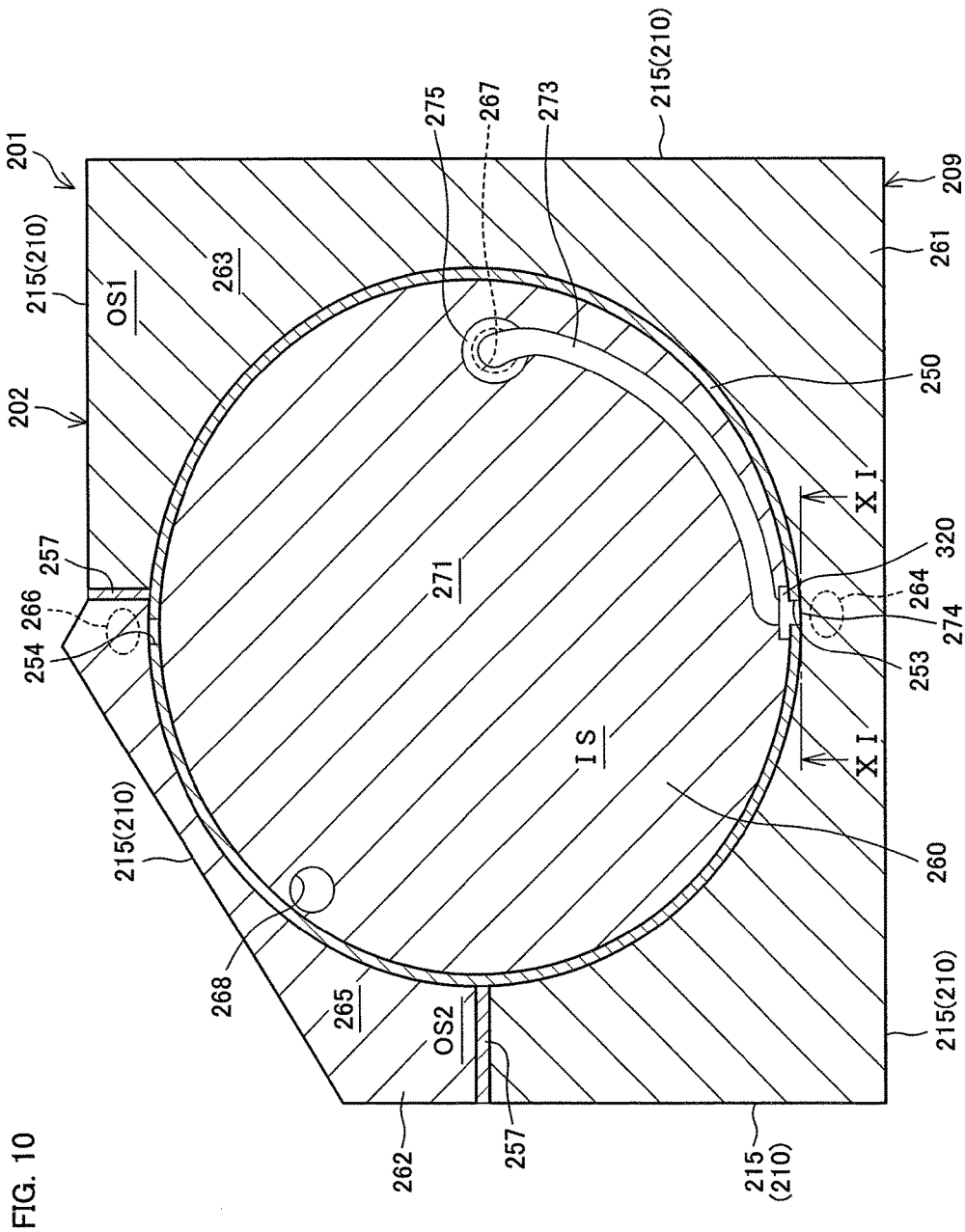
FIG. 10 is a sectional view showing the inside of the treatment chamber taken along a sectional plane X-X in FIG. 8.

FIG. 8 is a diagram of a substrate treatment apparatus 201 according to a second embodiment of the present invention as seen in a horizontal direction. FIG. 9 is a diagram showing the inside of a treatment chamber 202 taken along a sectional plane IX-IX in FIG. 8. FIG. 10 is a sectional view showing the inside of the treatment chamber 202 taken along a sectional plane X-X in FIG. 8.

The substrate treatment apparatus 201 is of a single substrate treatment type adapted to treat a front surface (having a device formation region) of a substrate W (e.g., a round semiconductor wafer or the like) with a liquid for a cleaning process or an etching process. The substrate treatment apparatus 201 includes a box-shaped treatment chamber 202 having an inside space, a spin chuck (substrate holding mechanism) 203 which horizontally holds a single substrate W in the treatment chamber 202 and rotates the substrate W about a vertical rotation axis A1 extending through the center of the substrate W, a sulfuric acid-containing liquid supplying unit 204 which supplies an SPM as an exemplary sulfuric acid-containing liquid (first chemical liquid) to the substrate W held by the spin chuck 203, an organic solvent supplying unit 205 which supplies IPA as an exemplary organic solvent (an organic solvent having a lower surface tension, second chemical liquid) to the front surface (upper surface) of the substrate W held by the spin chuck 203, a rinse liquid supplying unit 206 which supplies a rinse liquid to the front surface (upper surface) of the substrate W held by the spin chuck 203, a tubular treatment cup 207 surrounding the spin chuck 203, a controller 208 which controls the operations of devices provided in the substrate treatment apparatus 201 and the opening and closing of valves, and a vat 209 provided on the bottom of the treatment chamber 202.

The treatment chamber 202 includes a boxed-shaped partition wall 210 to be opened and closed by a shutter 211 (see FIG. 9), an FFU 212 serving as an air supplying unit which supplies clean air into the inside of the partition wall 210 (into the treatment chamber 2) from above the partition wall 210, and an evacuation device (not shown) which expels gas from the treatment chamber 202 from a lower portion of the partition wall 210. As shown in FIGS. 9 and 10, the treatment chamber 202 has a box shape having a generally rectangular plan shape (with one of the corners of the rectangle being obliquely beveled). The partition wall 210 includes a top wall 213 extending horizontally (X), and five side walls 215. The shutter 211 is provided in association with an opening (not shown) formed in one of the side walls 215.

The FFU 212 is disposed above the top wall 213, and attached to a top portion of the top wall 213. The FFU 212 supplies the clean air into the treatment chamber 202 from the top portion of the partition wall 210. The evacuation device is connected to a bottom portion of the treatment cup 207 through a cup evacuation duct 349, and the inside of the treatment cup 207 is evacuated through the bottom portion of the treatment cup 207. The FFU 212 and the evacuation device form a down flow in the treatment chamber 202.

A chuck of a clamping type adapted to horizontally clamp the substrate W to horizontally hold the substrate W is used as the spin chuck 203. More specifically, the spin chuck 203 includes a spin motor 216, a spin shaft 217 unified with a drive shaft of the spin motor 216, and a disk-shaped spin base 218 horizontally attached to an upper end of the spin shaft 217.

The spin shaft 217 is a vertical hollow shaft, in which a lower surface supply line (not shown) is inserted. A treatment liquid (e.g., a chemical liquid or pure water (DIW)) is supplied to the lower surface supply line. Further, a lower surface nozzle 219 which spouts the treatment liquid supplied to the lower surface supply line is provided at an upper end of the lower surface supply line. The lower surface nozzle 219 spouts the treatment liquid generally vertically upward, and the treatment liquid spouted from the lower surface nozzle 219 is applied generally perpendicularly to a center portion of a lower surface of the substrate W held by the spin chuck 203.

A plurality of clamping members 220 (three or more clamping members, e.g., six clamping members) are circumferentially provided on an upper surface of the spin base 218. The clamping members 220 are disposed in circumferentially properly spaced relation according to the outer peripheral shape of the substrate W on a peripheral portion of the upper surface of the spin base 218.

As shown in FIG. 8, the sulfuric acid-containing liquid supplying unit 204 includes a sulfuric acid-containing liquid nozzle (first chemical liquid nozzle) 221 which spouts the SPM toward the front surface of the substrate W, a third nozzle arm 222 having a distal end to which the sulfuric acid-containing liquid nozzle 221 is attached, a third pivot shaft 223 extending vertically on a lateral side of the spin chuck 203 and pivotally supporting the third nozzle arm 222, and a third arm pivoting unit (first moving mechanism) 224 which rotates the third pivot shaft 223 to move the third nozzle arm 222 to thereby move the sulfuric acid-containing liquid nozzle 221. The sulfuric acid-containing liquid nozzle 221 is, for example, a straight nozzle which spouts the SPM in the form of continuous stream, and is attached to the horizontal third nozzle arm 222, for example, with its spout directed downward. The third nozzle arm 222 extends horizontally.

The sulfuric acid-containing liquid supplying unit 204 further includes a sulfuric acid-containing liquid line 225 through which the SPM is guided to the sulfuric acid-containing liquid nozzle 221, and a sulfuric acid-containing liquid valve 226 which opens and closes the sulfuric acid-containing liquid line 225. With the sulfuric acid-containing liquid valve 226 open, the SPM is supplied from an SPM supply source to the sulfuric acid-containing liquid nozzle 221 through the sulfuric acid-containing liquid line 225. Thus, the SPM is spouted from the sulfuric acid-containing liquid nozzle 221.

The sulfuric acid-containing liquid line 225 is branched at a branch position 225A between the sulfuric acid-containing liquid nozzle 221 and the sulfuric acid-containing liquid valve 226, and one end of a first suction line 227 for sucking the SPM from the inside of the sulfuric acid-containing liquid line 225 is connected to the sulfuric acid-containing liquid line 225 at the branch position 225A. A first suction valve 228 is provided in the first suction line 227, and the other end of the first suction line 227 is connected to a first suction device (not shown). For example, the first suction device is constantly driven. When the first suction valve 228 is opened, an inside portion of the sulfuric acid-containing liquid line 225 downstream of the first branch position 225A is evacuated, so that the SPM is sucked from the downstream inside portion.

The third arm pivoting unit 224 pivots the third nozzle arm 222 about the third pivot shaft 223, whereby the sulfuric acid-containing liquid nozzle 221 is horizontally moved along an arcuate path. The third arm pivoting unit 224 horizontally moves the sulfuric acid-containing liquid nozzle 221 between a treatment position such that the SPM spouted from the sulfuric acid-containing liquid nozzle 221 is applied to the upper surface of the substrate W and a first home position 229 at which the sulfuric acid-containing liquid nozzle 221 is located adjacent the spin chuck 203 as seen in plan. Further, the third arm pivoting unit 224 horizontally moves the sulfuric acid-containing liquid nozzle 221 between a center position such that the SPM spouted from the sulfuric acid-containing liquid nozzle 221 is applied to the upper surface center portion of the substrate W and a peripheral position such that the SPM spouted from the sulfuric acid-containing liquid nozzle 221 is applied to the upper surface peripheral portion of the substrate W. The center position and the peripheral position are each defined as the treatment position. The sulfuric acid-containing liquid nozzle 221 may be a fixed nozzle which is fixedly disposed with its spout directed toward a predetermined position (e.g., center portion) on the upper surface of the substrate W.

The organic solvent supplying unit 205 includes an organic solvent nozzle (second chemical liquid nozzle) 233 which spouts IPA toward the front surface of the substrate W, a fourth nozzle arm 234 having a distal end to which the organic solvent nozzle 233 is attached, a fourth pivot shaft 235 extending vertically on a lateral side of the spin chuck 203 and pivotally supporting the fourth nozzle arm 234, and a fourth arm pivoting unit (second moving mechanism) 236 which rotates the fourth pivot shaft 235 to move the second nozzle arm 234 to thereby move the organic solvent nozzle 233. The organic solvent nozzle 233 is, for example, a straight nozzle which spouts IPA in the form of continuous stream, and is attached to the horizontal fourth nozzle arm 234, for example, with its spout directed downward. The fourth nozzle arm 234 extends horizontally.

The organic solvent supplying unit 205 further includes an organic solvent line 237 through which IPA is guided to the organic solvent nozzle 233, and an organic solvent valve 238 which opens and closes the organic solvent line 237. With the organic solvent valve 238 open, IPA is supplied from an IPA supply source to the organic solvent nozzle 233 through the organic solvent line 237. Thus, IPA is spouted from the organic solvent nozzle 233.

The organic solvent line 237 is branched at a branch position 237A between the organic solvent nozzle 233 and the organic solvent valve 238, and one end of a second suction line (suction mechanism) 239 for sucking IPA from the inside of the organic solvent line 237 and the inside of the organic solvent nozzle 233 is connected to the organic solvent line 237 at the branch position 237A. A second suction valve 240 (suction mechanism) is provided in the second suction line 239, and the other end of the second suction line 239 is connected to a second suction device (not shown). For example, the second suction device is constantly driven. When the second suction valve 240 is opened, an inside portion of the organic solvent line 237 downstream of the second branch position 237A is evacuated, so that IPA is sucked from the downstream inside portion. The second suction device may be provided separately from the first suction device, or the first suction device may double as the second suction device.

The fourth arm pivoting unit 236 pivots the fourth nozzle arm 234 about the fourth pivot shaft 235, whereby the organic solvent nozzle 233 is horizontally moved along an arcuate path. The fourth arm pivoting unit 236 horizontally moves the organic solvent nozzle 233 between a treatment position such that IPA spouted from the organic solvent nozzle 233 is applied to the upper surface of the substrate W and a second home position 241 at which the organic solvent nozzle 233 is located adjacent the spin chuck 203. Further, the fourth arm pivoting unit 236 horizontally moves the organic solvent nozzle 233 between a center position such that IPA spouted from the organic solvent nozzle 233 is applied to the upper surface center portion of the substrate W and a peripheral position such that IPA spouted from the organic solvent nozzle 233 is applied to the upper surface peripheral portion of the substrate W. The center position and the peripheral position are each defined as the treatment position. The organic solvent nozzle 233 may be a fixed nozzle which is fixedly disposed with its spout directed toward a predetermined position (e.g., center portion) on the upper surface of the substrate W.

The rinse liquid supplying unit 206 includes a rinse liquid nozzle 230 which spouts the rinse liquid toward the substrate W held by the spin chuck 203, a rinse liquid line 231 which supplies the rinse liquid to the rinse liquid nozzle 230, and a rinse liquid valve 232 which switches on and off the supply of the rinse liquid from the rinse liquid line 231 to the rinse liquid nozzle 230. The rinse liquid nozzle 230 is a fixed nozzle which spouts the rinse liquid with its spout kept still. The rinse liquid supplying unit 206 may include a rinse liquid nozzle moving device which moves the rinse liquid nozzle 230 to move the rinse liquid application position on the upper surface of the substrate W.

With the rinse liquid valve 232 open, the rinse liquid supplied from the rinse liquid line 231 to the rinse liquid nozzle 230 is spouted from the rinse liquid nozzle 230 toward the upper surface center portion of the substrate W.

The treatment cup 207 includes a tubular wall 250 having, for example, a cylindrical shape and surrounding the spin chuck 203, a plurality of cups 242, 243, 244 (fourth, fifth and sixth cups 242, 243, 244) provided between the spin chuck 203 and the tubular wall 250, a plurality of guards 246 to 249 (fifth to eighth guards 246 to 249) which each receive a treatment liquid (chemical liquid and rinse liquid) scattered around the substrate W, and a guard lift mechanism (not shown) which includes, for example, a ball screw mechanism for independently moving up and down the respective guards 246 to 249. By driving the guard lift mechanism, the guards 246 to 249 are independently moved up and down.

As shown in FIG. 8, the cups 242 to 244 each have a cylindrical shape, and surround the spin chuck 203 between the spin chuck 203 and the tubular wall 250. The fifth cup 243 located at the second innermost position is disposed outward of the fourth cup 242. The sixth cup 244 located at the third innermost position is disposed outward of the fifth cup 243. The sixth cup 244 is, for example, unitary with the six guard 247, and moved up and down together with the sixth guard 247. The cups 242 to 244 each define an annular channel which opens upward. The treatment liquid guided into the cup 242 to 244 is sent to a recovery unit or a drain unit (not shown) through the channel. Thus, the treatment liquid used for the treatment of the substrate W is recovered or drained.

As shown in FIG. 8, the guards 246 to 249 each have a cylindrical shape, and surround the spin chuck 203 between the spin chuck 203 and the tubular wall 250. The guards 246 to 249 each include an annular inclined portion 251 extending obliquely upward toward the rotation axis A1, and a cylindrical guide portion 252 extending downward from a lower edge of the inclined portion 251. An upper edge of the inclined portion 251 defines an inner periphery of the guard 246 to 249, and has a greater diameter than the substrate W and the spin base 218. The four inclined portions 251 are vertically stacked one on another. The four guide portions 252 are coaxial with each other. The guide portions 252 of the three inner guards 246 to 248 can be moved into and out of the three cups 242 to 244, respectively. That is, the treatment cup 207 is collapsible, and the guard lift mechanism moves up and down at least one of the four guards 246 to 249, whereby the treatment cup 207 is expanded or collapsed.

The seventh guard 248 out of the three inner guards 246 to 248 includes a suspended portion 248a extending vertically downward from an outer peripheral edge of the inclined portion 251 thereof, and a projection 248b projecting radially outward from a lower edge of the suspended portion 248a. The projection 248b has an annular drain channel 245 which opens upward. The drain channel 245 is located below the guide portion of the eighth guard 249. Liquid received by the drain channel 245 is guided to the drain unit (not shown).

The guard lift mechanism moves up and down the respective guards 246 to 249 between an upper position such that the guard upper edge is located above the substrate W and a lower position such that the guard upper edge is located below the substrate W. The guard lift mechanism can retain each of the guards 246 to 249 at a desired position between the upper position and the lower position. When the treatment liquid is supplied to the substrate W or when the substrate W is dried, any one of the guards 246 to 249 is opposed to the peripheral surface of the substrate W. Where the inner sixth guard 247 is opposed to the peripheral surface of the substrate W, for example, the fifth guard 246 is located at the lower position, and the sixth guard 247, the seventh guard 248 and the eighth guard 249 are located at the upper position. Where the seventh guard 248 is opposed to the peripheral surface of the substrate W, the seventh guard 248 and the eighth guard 249 are located at the upper position, and the fifth guard 246 and the sixth guard 247 are located at the lower position.

The tubular wall 250 has a cylindrical shape (in FIGS. 9 and 10, the tubular wall 250 is illustrated as having an oval shape for easier description (the same applies to FIGS. 17 and 18)). As shown in FIG. 10, the tubular wall 250 has first and second communication holes 253, 254 provided in two circumferential portions of a lower edge portion thereof as extending therethrough. The first communication hole 253 permits communication between an inner space IS and a first outer space OS1 to be described later, and the second communication hole 254 permits communication between the inner space IS and a second outer space OS2 to be described later. An upstream end of the cup evacuation duct 349 is connected to a predetermined circumferential portion of the lower edge portion of the tubular wall 250. A downstream end of the cup evacuation duct 349 is connected to the evacuation device (not shown) provided outside the apparatus. The internal atmosphere of the tubular wall 250 is expelled through the cup evacuation duct 349 by the evacuation device.

The tubular wall 250 partitions the inside space of the treatment chamber 202 into the inner space IS defined inward of the tubular wall 250 as seen in plan and an outer space OS defined outward of the tubular wall 250 as seen in plan. In other words, the inside space of the treatment chamber 202 includes the inner space IS and the outer space OS.

As shown in FIG. 8, a cover 255 is disposed at substantially the same level as an upper edge of the tubular wall 250 around the tubular wall 250. The cover 255 partitions the outer space OS into an upper outer space OSU and a lower outer space OSD. The third and fourth pivot shafts 223, 235 and the first and second home positions 229, 241 are located in the upper outer space OSU. The cover 255 includes, for example, a plurality of plate segments 256. The plate segments 256 are fixed to the tubular wall 250 and the side walls 215 by bolts (not shown). The plate segments 256 are disposed in circumferentially spaced relation. The upper outer space OSU communicates with the lower outer space OSD through gaps each defined between two circumferentially adjacent plate segments 256, gaps defined between the tubular wall 250 and the plate segments 256 and gaps defined between the side walls 215 and the plate segments 256. In FIG. 9, the cover 255 and the plate segments 256 are not shown (the same applies to FIG. 17).

As shown in FIGS. 9 and 10, two partition walls 257 are provided between the tubular wall 250 and the side walls 215 at least in the bottom portion as radially extending from the tubular wall 250. The partition walls 257 are each postured vertically. The two partition walls 257 circumferentially partitions the outer space OS into the first outer space OS1 and the second outer space OS2. Upper edges of the partition walls 257 horizontally extend at a height level slightly lower than the upper edge of the tubular wall 250. Thus, the first outer space OS1 and the second outer space OS2 are isolated from each other in a lower portion (including the bottom portion) of the treatment chamber 202.

The first outer space OS1 is a relatively large space including three corners of the treatment chamber 202 as seen in plan. The first home position 229 is defined in the first outer space OS1. The third and fourth pivot axes 223, 235 (see FIG. 9) are disposed in the first outer space OS1. On the other hand, the second outer space OS2 is a relatively small space including a space opposed to the shutter 211. The second home position 241 is defined in the second outer space OS2.

The vat 209 is disposed on the entire bottom of the treatment chamber 202 so as to prevent the chemical liquid (SPM and IPA) used in the treatment chamber 202 from flowing out of the treatment chamber 202. The vat 209 includes an inner vat 260 disposed on the bottom of the inner space IS defined inward of the tubular wall 250, a first outer vat 261 disposed on the bottom of the first outer space OS1, and a second outer vat 262 disposed on the bottom of the second outer space OS2.

The first outer vat 261 serves as a vat (first vat) for receiving the SPM, and the inner vat 260 and the second outer vat 262 each serve as a vat (second vat) for receiving IPA. In other words, the second vat extends over the bottom of the second outer space OS2 and the bottom of the inner space IS. In FIG. 10, the vats which receive different liquids are hatched differently for easy understanding (the same applies to FIG. 18).

Figure 11:
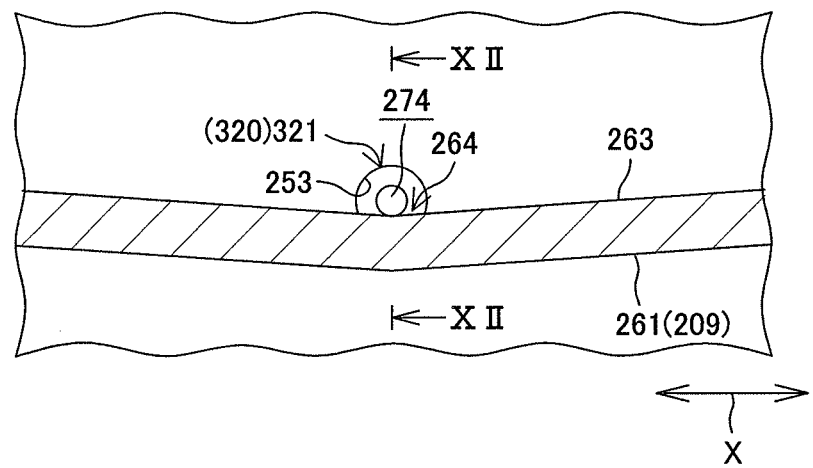
FIG. 11 is a sectional view of a first vat taken along a sectional plane XI-XI in FIG. 10.
Figure 12:
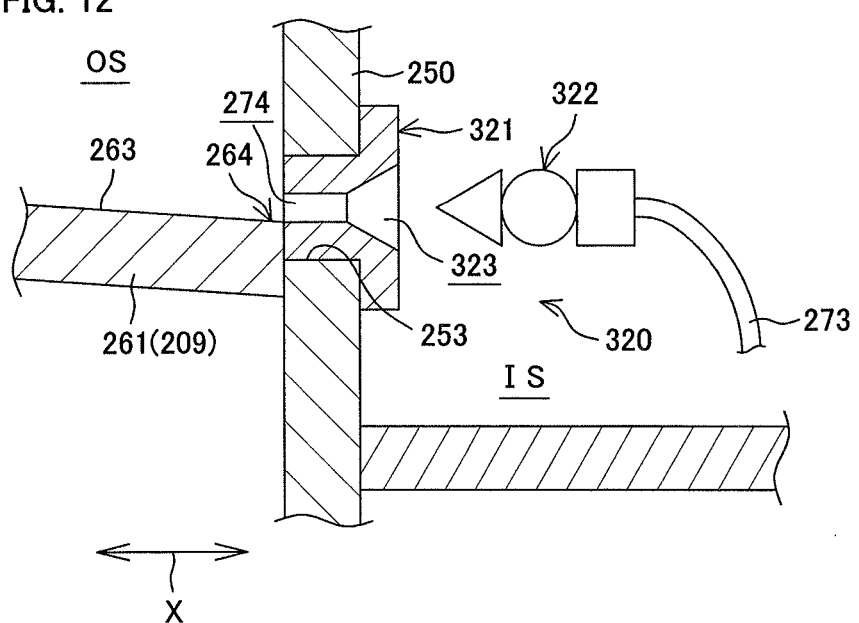
FIG. 12 is a sectional view taken along a sectional plane XII-XII in FIG. 11.

FIG. 11 is a sectional view of the first outer vat 261 taken along a sectional plane XI-XI in FIG. 10. FIG. 12 is a sectional view taken along a sectional plane XII-XII in FIG. 11.

As shown in FIG. 10, the first outer vat 261 is dimensioned and configured in conformity with the bottom of the first outer space OS1, and covers the entire bottom of the first outer space OS1 from below. The first outer vat 261 is a plate made of a chemical-resistant material (e.g., PVC). The entire periphery of the first outer vat 261 is welded to be connected to lower edges of the partition walls 257, the tubular wall 250 and the side walls 215 (see FIG. 8) for prevention of liquid leakage from the first outer space OS1.

The first outer vat 261 has a first reception surface 263. The first reception surface 263 is defined on the upper surface of the first outer vat 261 for receiving the SPM dripping from above. The first reception surface 263 has a first lowermost portion 264. A most portion of the first reception surface 263 excluding the first lowermost portion 264 is inclined downward toward the first lowermost portion 264 with respect to horizontal directions X. Therefore, the SPM received on different portions of the first reception surface 263 flows toward the first lowermost portion 264 due to height differences from the first lowermost portion 264.

As shown in FIG. 10, the second outer vat 262 is dimensioned and configured in conformity with the bottom of the second outer space OS2, and covers the entire bottom of the second outer space OS2 from below. The second outer vat 262 is, for example, a single plate made of a chemical-resistant material (e.g., PVC). The entire periphery of the second outer vat 262 is welded to be connected to the lower edges of the partition walls 257, the tubular wall 250 and the side walls 215 (see FIG. 8) for prevention of liquid leakage from the second outer space OS2.

The second outer vat 262 has a second reception surface 265 defined on an upper surface thereof for receiving IPA dripping from above. The second receiving surface 265 has a second lowermost portion 266. A most portion of the second reception surface 265 excluding the second lowermost portion 266 is inclined downward toward the second lowermost portion 266 with respect to the horizontal directions X. Therefore, IPA received on different portions of the second reception surface 265 flows toward the second lowermost portion 266 due to height differences from the second lowermost portion 266.

As shown in FIG. 10, the inner vat 260 is a single plate made of a chemical-resistant material (e.g., PVC). The inner vat 260 is dimensioned and configured in conformity with the bottom of the inner space IS defined inward of the tubular wall 250. The inner vat 260 covers the entire bottom of the inner space IS from below. That is, the inner vat 260 defines the bottom of the tubular wall 250. In other words, the inner vat 260 defines a part of the bottom wall of the treatment chamber 202. The entire periphery of the inner vat 260 is welded to be connected to the lower edge of the tubular wall 250 for prevention of liquid leakage from the inner space IS.

As shown in FIGS. 8 and 10, the inner vat 260 has first and second drain ports 267, 268 provided in an outer peripheral portion of an inner reception surface 271 thereof. The first drain port 267 and the second drain port 268 are disposed in circumferentially spaced relation (in the second embodiment, the first drain port 267 and the second drain port 268 are disposed on opposite sides of the rotation axis A1). A first drain pipe 269 is connected to the first drain port 267. A downstream end portion of the first drain pipe 269 extends to a first drain unit (not shown).

The inner reception surface 271 is defined on an upper surface of the inner vat 260 for receiving IPA dripping from above. The inner reception surface 271 is inclined. The second drain port 268 is provided in a lowermost portion of the inner reception surface 271. In the second embodiment, the lowermost portion of the inner reception surface 271 is defined at a predetermined position in an outer peripheral portion of the inner vat 260. A portion of the inner reception surface 271 excluding the lowermost portion is inclined downward toward the second drain port 268 with respect to the horizontal directions X. A second drain pipe 270 is connected to the second drain port 268. A downstream end portion of the second drain pipe 270 extends to a second drain unit (not shown) different from the first drain unit.

As described above, the inner space IS and the first outer space OS1 are isolated from each other in the bottom portion of the treatment chamber 202. Therefore, there is no liquid communication between the inner vat 260 disposed in the bottom of the inner space IS and the first outer vat 261 disposed in the bottom of the first outer space OS1. Further, the first outer space OS1 and the second outer space OS2 are isolated from each other in the bottom portion of the treatment chamber 202 as described above, so that there is no liquid communication between the first outer vat 261 disposed in the bottom of the first outer space OS1 and the second outer vat 262 disposed in the bottom of the second outer space OS2.

As shown in FIGS. 10 and 12, the first drain port 267 is connected to the first lowermost portion 264 of the first reception surface 263 through a first tube 273. The SPM flowing on the first reception surface 263 to reach the first lowermost portion 264 is guided to the first drain port 267 through the first tube 273. That is, the first tube 273 is provided as a bypass through which the first lowermost portion 264 and the first drain port 267 are connected to each other, so that the SPM present on the first reception surface 263 can be guided to the first drain port 267 while being prevented from flowing on the inner reception surface 271 of the inner vat 260. A chemical-resistant material such as a fluororesin is used as a material for the first tube 273.

A proximal end of the first tube 273 is connected to the first lowermost portion 264 (i.e., a portion of the tubular wall 250 opposed to the first lowermost portion 264) via a first pipe joint 320. The first pipe joint 320 includes a joint body 321 extending through a portion of the tubular wall 250 opposed to the first lowermost portion 264, and a tube side joint 322 fixed to the proximal end of the first tube 273. The joint body 321 is fixed to the tubular wall 250 to close the first communication hole 253 of the tubular wall 250. The joint body 321 has an inlet port 274, and an insertion hole 323 communicating with the inlet port 274. The joint body 321 is attached to the tubular wall 250 with the inlet port 274 directed outward of the tubular wall 250 and with the insertion hole 323 directed inward of the tubular wall 250. That is, the inlet port 274 is opposed to the first lowermost portion 264.

The tube side joint 322 is inserted (screwed) into the insertion hole 323 to be thereby locked in the insertion hole 323. In this locked state, the inside of the first tube 273 communicates with the inlet port 274. The first lowermost portion 264 and the inner vat 260 are isolated from each other by the join body 321 attached to the tubular wall 250. This eliminates a possibility that the SPM present on the first lowermost portion 264 enters the inner vat 260 (see FIG. 10).

A distal end of the first tube 273 is connected to the first drain port 267 (i.e., an upstream end of the first drain pipe 269) via a second pipe joint 275.

Figure 13:
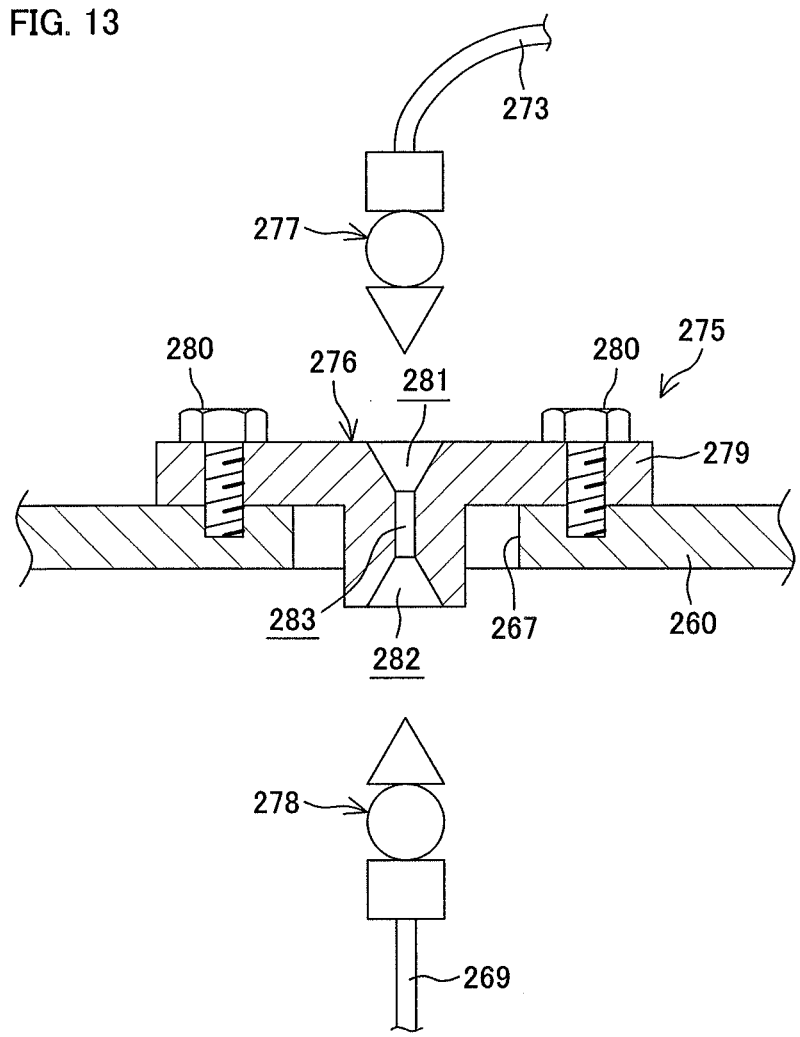
FIG. 13 is a diagram schematically showing connection between a first tube and a first drain pipe.

FIG. 13 is a diagram schematically showing connection between the first tube 273 and the first drain pipe 269.

The second pipe joint 275 includes a joint body 276 attached to the first drain port 267, a tube side joint 277, and a drain side joint 278. The joint body 276 has a flange 279 fixed to the inner vat 260 by a plurality of bolts 280. The joint body 276 includes a first insertion hole 281 in which a distal end of the tube side joint 277 is insertable, a second insertion hole 282 in which the drain side joint 278 is insertable, and a connection hole 283 through which the first and second insertion holes 281, 282 communicate with each other. The tube side joint 277 and the drain side joint 278 are respectively inserted (screwed) into the first and second insertion holes 281, 282 to be thereby locked in the first and second insertion holes 281, 282. In this state, the inside of the first tube 273 and the inside of the first drain pipe 269 communicate with each other. The first drain port 267 and the inner vat 260 are isolated from each other by the joint body 276 attached to the first drain port 267. This eliminates a possibility that IPA flowing on the inner vat 260 enters the first drain port 267 (first drain pipe 269).

The SPM received on different portions of the first reception surface 263 of the first outer vat 261 flows toward the first lowermost portion 264 due to height differences on the first reception surface 263. The SPM reaching the first lowermost portion 264 flows into the first tube 273 through the first pipe joint 320 to flow through the first tube 273 due to a height difference, thereby moving into the first drain pipe 269 via the second pipe joint 275 and the first drain port 267. The SPM moving into the first drain pipe 269 is sent to the first drain unit (not shown) to be drained.

As shown in FIG. 10, the second communication hole 254 is provided in a portion of the tubular wall 250 opposed to the second lowermost portion 266 of the second reception surface 265. IPA received on different portions of the second reception surface 265 of the second vat 209 flows toward the second lowermost portion 266 due to height differences on the second reception surface 265. IPA reaching the second lowermost portion 266 moves to the inner reception surface 271 of the inner vat 260 via the second communication hole 254, and then flows toward the second drain port 268 on the inner reception surface 271 due to the height differences on the inner reception surface 271.

IPA flowing onto the inner reception surface 271 of the inner vat 260 further flows toward the second drain port 268 due to the height differences on the inner reception surface 271. IPA reaching the second drain port 268 is sent to the second drain unit (not shown) through the second drain pipe 270 to be drained.

With the aforementioned arrangement, the drain port 267 can be provided in the center portion, thereby simplifying the construction of the apparatus. However, the drain port 267 may be provided in the lowermost portion 264 of the first reception surface 263. In this case, the piping arrangement can be simplified.

Figure 14:
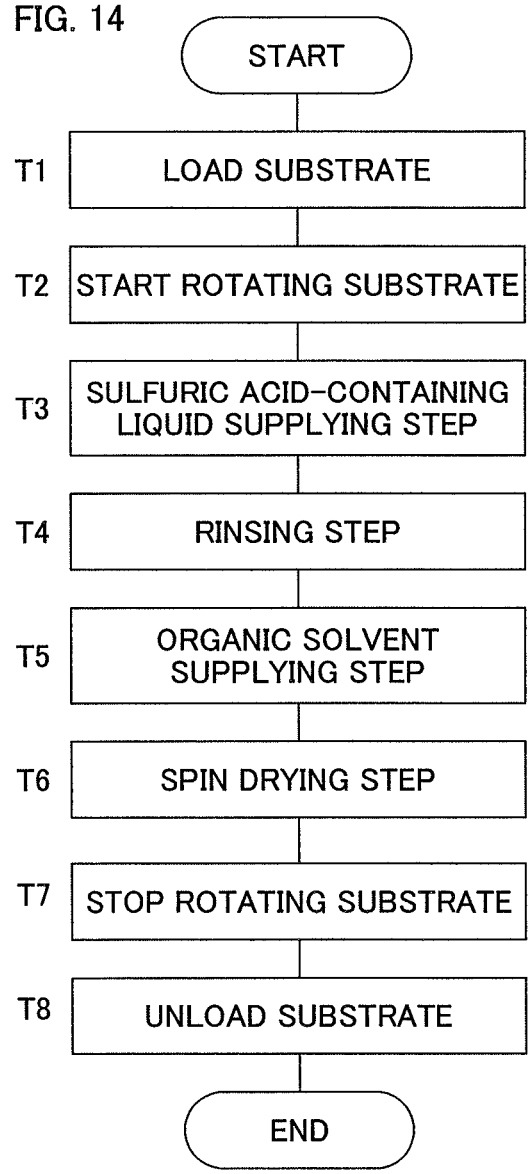
FIG. 14 is a process diagram for explaining another exemplary substrate treatment process to be performed by the substrate treatment apparatus of the second embodiment.
Figure 15:
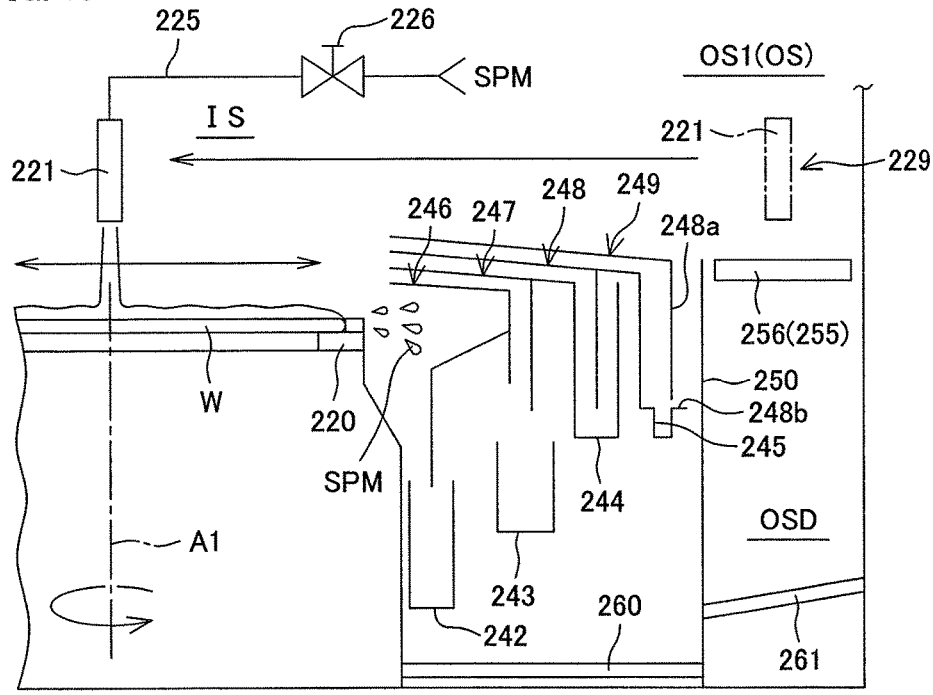
FIG. 15 is a schematic diagram showing the exemplary substrate treatment process.
Figure 16:
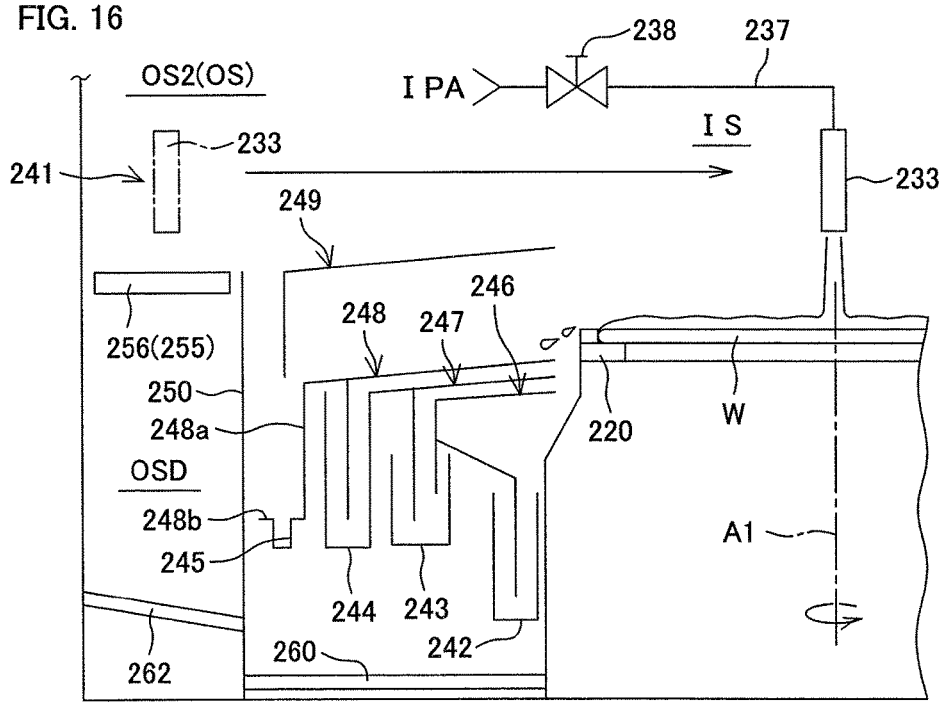
FIG. 16 is a schematic diagram showing the exemplary substrate treatment process.

FIG. 14 is a process diagram for explaining another exemplary resist removing process to be performed on the substrate W by the substrate treatment apparatus 201. FIGS. 15 and 16 are schematic diagrams showing the exemplary resist removing process.

Referring to FIGS. 8, 9 and 14, the exemplary resist removing process will be described. Reference will be made to FIGS. 10 to 12 and FIGS. 15 and 16 as required.

During the treatment of the substrate W, the inside of the tubular wall 250 is forcibly evacuated by driving the evacuation device (not shown). Further, the clean air is supplied into the treatment chamber 202 from the FFU 212. Therefore, a down flow of the clean air flowing downward is formed in the treatment chamber 202.

When the resist removing process is to be performed by the substrate treatment apparatus 201, the shutter 211 is opened, and a substrate W subjected to a high-dose ion implantation process is loaded into the treatment chamber 202 by a transport robot (not shown) (Step T1). The substrate W to be loaded is not subjected to a resist ashing process. The substrate W has a front surface formed with a minute pattern having a higher aspect ratio. More specifically, the controller 208 retracts all the nozzles and the like from above the spin chuck 203, and moves down the fifth to eighth guards 246 to 249 to the lower position (lowermost position). While the upper edges of the fifth to eighth guards 246 to 249 are located below the substrate holding position at which the substrate W is to be held by the spin chuck 203, hands (not shown) of the substrate transport robot (not shown) are moved into the treatment chamber 202 with the substrate W held thereon, whereby the substrate W is transferred to the spin chuck 203 with its front surface facing up.

Thereafter, the controller 208 controls the guard lift unit (not shown) to move all the fifth to eighth guards 246 to 249 to the upper position (the uppermost position) with the fifth guard 246 opposed to the peripheral surface of the substrate W.

The controller 208 causes the spin motor 216 to start rotating the substrate W (Step T2). The rotation speed of the substrate W is increased to a predetermined liquid treatment speed (100 to 500 rpm, e.g., about 300 rpm) and maintained at the liquid treatment speed.

After the rotation speed of the substrate W reaches the liquid treatment speed, the controller 208 performs a sulfuric acid-containing liquid supplying step of supplying the SPM to the substrate W (Step T3). More specifically, the controller 208 controls the third arm pivoting unit 224 to move the sulfuric acid-containing liquid nozzle 221 from the first home position 229 defined in the first outer space OS1 to the treatment position defined in the inner space IS as shown in FIG. 15.

At the first home position 229, the sulfuric acid-containing liquid nozzle 221 is located above a pod (not shown). Before the movement of the sulfuric acid-containing liquid nozzle 221 from the first home position 229 is started, a part of the SPM changed (in temperature or in quality) with time after the last spouting is often preliminarily dispensed from the sulfuric acid-containing liquid nozzle 221 at the first home position 229. For the preliminary dispensing, the controller 208 opens the first suction valve 228 after stopping the spouting of the SPM from the sulfuric acid-containing liquid nozzle 221 at the first home position 229. Thus, the SPM present in the portion of the sulfuric acid-containing liquid line 225 downstream of the first branch position 225A is sucked. The suction of the SPM is continued until a front of the SPM is retracted to a predetermined standby position in the sulfuric acid-containing liquid line 225. After the suction of the SPM, the controller starts moving the sulfuric acid-containing liquid nozzle 221 to the treatment position. The SPM has a relatively high viscosity and, therefore, hardly drips from the sulfuric acid-containing liquid nozzle 221 during the movement from the first home position 229 to the treatment position. In addition, the inside of the sulfuric acid-containing liquid line 225 is sucked before the start of the movement of the sulfuric acid-containing liquid nozzle 221, so that the SPM is reliably prevented from dripping from the sulfuric acid-containing liquid nozzle 221 during the movement toward the treatment position.

With the sulfuric acid-containing liquid nozzle 221 located above the substrate W, the controller 208 opens the sulfuric acid-containing liquid valve 226 to spout the SPM from the sulfuric acid-containing liquid nozzle 221. In this state, the controller 208 controls the third arm pivoting unit 224 to move the SPM application position between the center portion and the peripheral portion on the upper surface of the substrate W. Thus, the SPM is supplied to the entire upper surface of the substrate W, whereby the resist is removed from the substrate W by the SPM through a chemical reaction between the resist and the SPM. The SPM supplied onto the upper surface of the substrate W is scattered from the periphery of the substrate W laterally of the substrate W, and then received by the inner wall of the fifth guard 246 and guided into the fourth cup 242 to be recovered or drained through the bottom of the fourth cup 242.

After a lapse of a predetermined period from the start of the spouting of the SPM, the controller 208 closes the sulfuric acid-containing liquid valve 226 to stop spouting the SPM. After the spouting of the SPM from the sulfuric acid-containing liquid nozzle 221 is stopped, the controller 208 opens the first suction valve 228. Thus, the SPM is sucked from the portion of the sulfuric acid-containing liquid line 225 downstream of the first branch position 225A. The suction of the SPM is continued until the front of the SPM is retracted to the predetermined standby position in the sulfuric acid-containing liquid line 225.

After the suction of the SPM, the controller 208 controls the third arm pivoting unit 224 to move the sulfuric acid-containing liquid nozzle 221 from the treatment position defined in the inner space IS to the first home position 229 defined in the first outer space OS1. The SPM has a relatively high viscosity and, therefore, hardly drips from the sulfuric acid-containing liquid nozzle 221 during the movement of the sulfuric acid-containing liquid nozzle 221 from the first home position 229 to the treatment position. In addition, the inside of the sulfuric acid-containing liquid line 225 is sucked before the start of the movement of the sulfuric acid-containing liquid nozzle 221, so that the SPM is reliably prevented from dripping from the sulfuric acid-containing liquid nozzle 221 during the movement of the sulfuric acid-containing liquid nozzle 221 toward the first home position 229.

After the end of the sulfuric acid-containing liquid supplying step (T3), a rinsing step of supplying the rinse liquid to the substrate W (Step T4) is performed with the fifth guard 246 opposed to the peripheral surface of the substrate W. More specifically, the controller 208 opens the rinse liquid valve 232 to spout the rinse liquid from the rinse liquid nozzle 230 toward the upper surface center portion of the substrate W. The rinse liquid applied to the upper surface center portion of the substrate W receives a centrifugal force generated by the rotation of the substrate W to flow toward the periphery of the substrate on the upper surface of the substrate W. Thus, the SPM is rinsed away from the entire upper surface of the substrate W. The rinse liquid supplied to the upper surface of the substrate W is scattered from the periphery of the substrate W laterally of the substrate W, and then received by the inner wall of the fifth guard 246 and guided into the fourth cup 242 to be drained through the bottom of the fourth cup 242.

After a lapse of a predetermined period from the start of the spouting of the rinse liquid, the controller 208 controls the spin motor 216 to decelerate the rotation of the substrate W stepwise from the sulfuric acid-containing liquid treatment speed to a puddling speed (e.g., about 10 rpm). After the rotation speed of the substrate W is reduced to the puddling speed (e.g., about 10 rpm), the controller 208 controls the spin motor 216 to maintain the rotation speed of the substrate W at the puddling speed. Thus, a liquid film of the rinse liquid is retained in a puddle form on the entire upper surface of the substrate W.

After a lapse of a predetermined period from the time at which the rotation speed of the substrate is reduced to the puddling speed (e.g., about 10 rpm), the controller 208 closes the rinse liquid valve 232 to stop spouting the rinse liquid from the rinse liquid nozzle 230.

In turn, the controller 208 starts an organic solvent supplying step (second chemical liquid supplying step, Step T5). In this exemplary process, the organic solvent supplying step (T5) is performed after the rinsing step (T4) ends. That is, the rinse liquid intruding into the minute pattern on the front surface of the substrate W is replaced with the organic solvent (IPA) having a lower surface tension prior to a spin drying step (T6) to be described later. This prevents the collapse of the pattern in the subsequent spin drying step (T6).

More specifically, the controller 208 controls the guard lift mechanism to move down the fifth to seventh guards 246 to 248 to the lower position (lowermost position), whereby the eighth guard 249 is brought into opposed relation to the peripheral surface of the substrate W as shown in FIG. 16. Further, the controller 208 controls the fourth arm pivoting unit 236 to move the organic solvent nozzle 233 from the second home position 241 defined in the second outer space OS2 to the treatment position defined in the inner space IS.

At the second home position 241, the organic solvent nozzle 233 is located above a pod (not shown). Before the start of the movement of the organic solvent nozzle 233 from the second home position 241, a part of IPA changed in quality with time after the last spouting is often preliminarily dispensed from the organic solvent nozzle 233 at the second home position 241. For the preliminary dispensing, the controller 208 opens the second suction valve 240 after stopping the spouting of IPA from the organic solvent nozzle 233 at the second home position 241. Thus, IPA presenting in the portion of the organic solvent line 237 downstream of the second branch position 237A is sucked. The suction of IPA is continued until a front of IPA is retracted to a predetermined standby position in the organic solvent line 237. After the suction of IPA, the controller 208 starts moving the organic solvent nozzle 233 to the treatment position.

After the organic solvent nozzle 233 is located above the upper surface center portion of the substrate W, the controller 208 opens the organic solvent valve 238 with the rotation speed of the substrate W maintained at the puddling speed. Thus, as shown in FIG. 16, IPA is spouted from the spout of the organic solvent nozzle 233 to be applied to the upper surface center portion of the substrate W.

IPA is supplied to the upper surface of the substrate W, whereby the rinse liquid on the upper surface of the substrate W is sequentially replaced with IPA. Thus, a liquid film of IPA is retained in a puddle form on the upper surface of the substrate W as covering the entire upper surface of the substrate W. After the liquid film present on the entire upper surface of the substrate W is substantially replaced with the IPA liquid film, the supply of IPA to the upper surface of the substrate W is continued. Therefore, IPA flows out from the periphery of the substrate W.

IPA flowing out from the periphery of the substrate W is received by the inner wall of the eighth guard 249 opposed to the peripheral surface of the substrate W. Then, IPA flows down on the inner wall of the eighth guard 249 and then drips from the lower edge of the eighth guard 249, and is received in the drain channel 245 to be guided from the bottom of the drain channel 245 to the drain unit (not shown) through the drain pipe (not shown).

After a lapse of a predetermined puddling period (e.g., about 10 seconds) from the start of the spouting of IPA, the controller 208 controls the spin motor 216 to accelerate the rotation of the substrate W from the puddling speed to a higher rotation speed (e.g., about 1000 rpm) while continuously spouting IPA. After the rotation speed of the substrate W is increased to the higher rotation speed, the controller 208 closes the organic solvent valve 238 to stop spouting IPA. After the spouting of IPA from the organic solvent nozzle 233 is stopped, the controller 208 opens the second suction valve 240. Thus, IPA is sucked from the portion of the organic solvent line 237 downstream of the second branch position 237A. The suction of IPA is continued until the front of IPA is retracted to the predetermined standby position in the organic solvent line 237.

After the suction of IPA, the controller 208 controls the fourth arm pivoting unit 236 to move the organic solvent nozzle 233 from the treatment position defined in the inner space IS to the second home position 241 defined in the second outer space OS2. Since the inside of the organic solvent line 237 is sucked prior to the start of the movement of the organic solvent nozzle 233, IPA is substantially prevented from dripping from the organic solvent nozzle 233 during the movement of the organic solvent nozzle 233 from the treatment position. When the organic solvent nozzle 233 is moved from the second home position 241 to the treatment position prior to the start of the treatment, the sucking operation may also be performed in the aforementioned manner.

However, IPA has a relatively low viscosity. Therefore, there is a possibility that IPA drips from the organic solvent nozzle 233 when the organic solvent nozzle 233 is moved from the second home position 241 or when the organic solvent nozzle 233 is moved back to the second home position 241. In this case, IPA dripping from the organic solvent nozzle 233 is liable to be applied to the eighth guard 249 and the cover 255. The IPA applied to the eighth guard 249 flows on the outer wall of the eighth guard 249 and drips from the lower edge of the eighth guard 249 to be received in the inner vat 260. The IPA applied to the cover 255 flows into the lower outer space OSD through the gaps between the plate segments 256, the gaps between the tubular wall 250 and the plate segments 256 and the gaps between the side walls 215 and the plate segments 256 to be received in the second outer vat 262.

Further, the controller 208 performs the spin drying step (Step T6) with the eighth guard 249 opposed to the peripheral surface of the substrate W. That is, the controller 208 maintains the rotation speed of the substrate W at the higher rotation speed (e.g., about 1000 rpm). Thus, IPA adhering to the substrate W is spun off to dry the substrate W. After the spin drying step (T6) is performed for a predetermined period, the controller 208 controls the spin motor 216 to stop the rotation of the spin chuck 203 (the rotation of the substrate W) (Step T7). Thus, the resist removing process is completed for the single substrate W. Then, the shutter 211 is opened, and the treated substrate W is unloaded from the treatment chamber 202 by the transport robot (not shown) (Step T8).

The SPM and IPA are an inappropriate combination of chemical liquids which are liable to cause a hazard when being accidentally brought into contact with each other or mixed together. More specifically, the accidental mixing of the SPM and IPA may cause explosion due to the dehydrating action of sulfuric acid contained in the SPM.

As described above, the SPM hardly drips from the sulfuric acid-containing liquid nozzle 221 during the movement of the sulfuric acid-containing liquid nozzle 221 from the first home position 229 to the treatment position when the substrate treatment apparatus 201 normally operates. When the substrate treatment apparatus 201 abnormally operates during the movement of the sulfuric acid-containing liquid nozzle 221, however, there is a possibility that the SPM drips from the sulfuric acid-containing liquid nozzle 221 located between the first home position 229 and the treatment position. The SPM dripping from the sulfuric acid-containing liquid nozzle 221 is received on the first reception surface 263 of the first outer vat 261.

In the case of the organic solvent nozzle 233, on the other hand, there is a possibility that IPA drips from the organic solve nozzle 233 during the movement between the second home position 241 and the treatment position even when the substrate treatment apparatus 201 normally operates. In addition, when the substrate treatment apparatus 201 abnormally operates during the movement of the organic solvent nozzle 233, there is a possibility that IPA drips from the organic solvent nozzle 233 located between the second home position 241 and the treatment position. The IPA dripping from the organic solvent nozzle 233 is received on the second reception surface 265 of the second outer vat 262.

In the second embodiment, as described above, the vat 209 provided on the bottom of the treatment chamber 202 is divided into the inner vat 260 provided on the bottom of the inner space IS, the first outer vat 261 provided on the bottom of the first outer space OS1, and the second outer vat 262 provided on the bottom of the second outer space OS2. During the movement of the sulfuric acid-containing liquid nozzle 221 in the first outer space OS1, the SPM dripping from the sulfuric acid-containing liquid nozzle 221 is received on the first outer vat 261. Further, IPA dripping from the organic solvent nozzle 233 during the movement between the second outer space OS2 and the position above the substrate W is received on the second outer vat 262 or the inner vat 260. In other words, the vat 209 is divided into the first outer vat 261 for the sulfuric acid-containing liquid nozzle 221 and the second outer vat 262 for the organic solvent nozzle 233 according to the movement ranges of the sulfuric acid-containing liquid nozzle 221 and the organic solvent nozzle 233.

The first outer space OS1 and the second outer space OS2 are isolated from each other in the bottom portion of the treatment chamber 202, so that there is no liquid communication between the first outer vat 261 and the second outer vat 262. Further, the first drain port 267 through which the liquid received in the first outer vat 261 is drained and the second drain port 268 through which the liquid received in the second outer vat 262 is drained are provided separately from each other.

As described above, the SPM and IPA are reliably prevented from being accidentally brought into contact with each other or mixed together in the vat 209. Even if the chemical liquids liable to cause a hazard when being accidentally brought into contact with each other or mixed together are used in combination, therefore, the substrate treatment apparatus 201 is capable of reliably preventing the accidental mixing in the vat.

Figure 17:
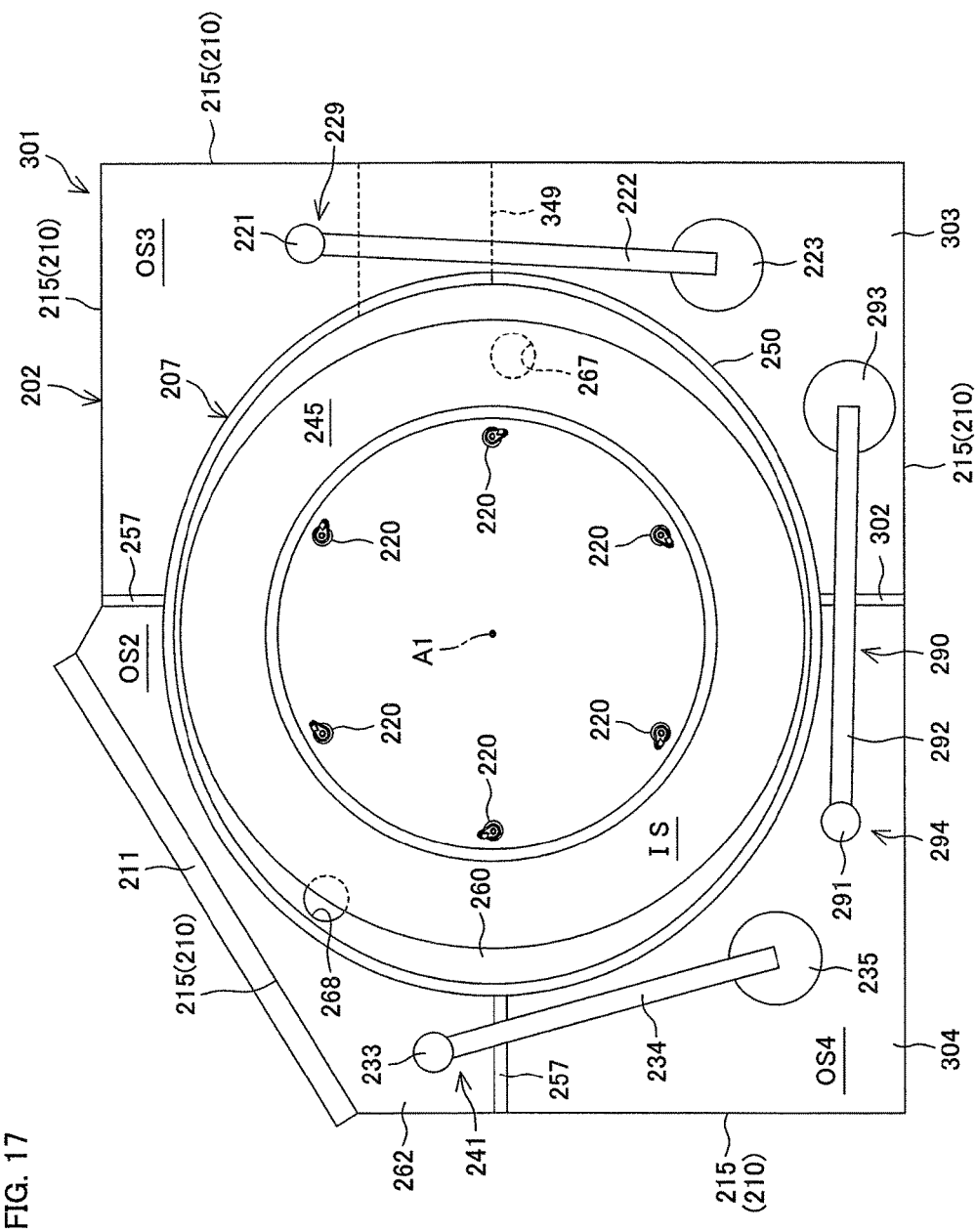
FIG. 17 is a schematic diagram showing an upper portion of a treatment chamber according to a third embodiment of the present invention.
Figure 18:
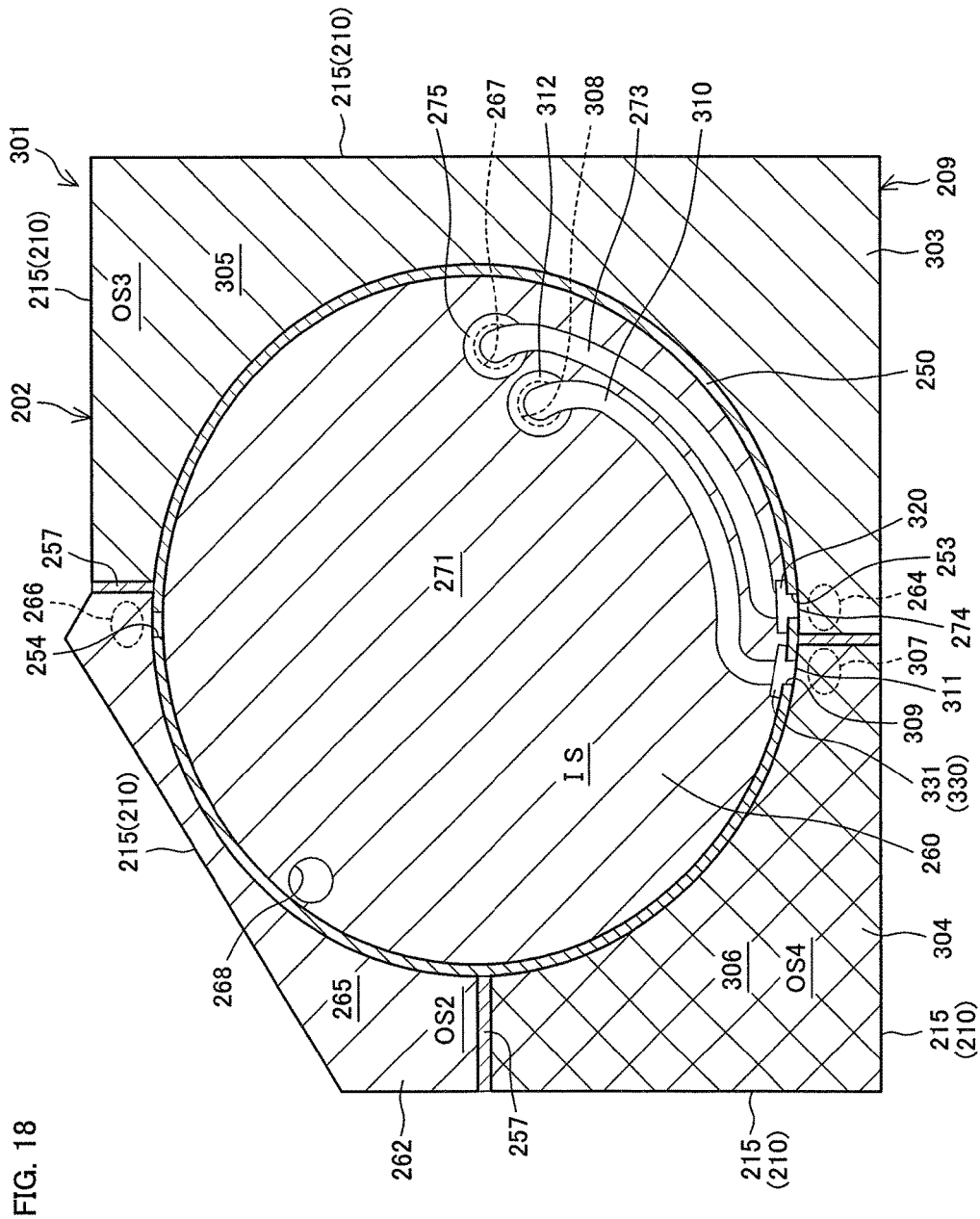
FIG. 18 is a schematic diagram showing a bottom portion of the treatment chamber shown in FIG. 17.

FIG. 17 is a schematic diagram showing the upper portion of the treatment chamber 202 according to a third embodiment of the present invention. FIG. 18 is a schematic diagram showing the bottom portion of the treatment chamber 202 shown in FIG. 17.

A substrate treatment apparatus 301 including the treatment chamber 202 according to the third embodiment of the present invention is different from the substrate treatment apparatus 201 according to the second embodiment in that an alkaline chemical liquid supplying unit 290 is further provided which supplies SC1 (ammonia/hydrogen peroxide liquid mixture) as an exemplary alkaline chemical liquid (third chemical liquid) to the substrate W held by the spin chuck 203. In the third embodiment, three types of chemical liquids are usable.

In the third embodiment, another partition wall 302 is provided in addition to the two partition walls 257 between the tubular wall 250 and the side walls 215. That is, the third embodiment differs from the second embodiment in that a total of three partition walls are provided.

In FIGS. 17 and 18, components corresponding to those of the second embodiment will be designated by the same reference characters as in FIGS. 8 to 16, and duplicate description will be omitted.

The alkaline chemical liquid supplying unit 290 includes an alkaline chemical liquid nozzle 291 which spouts SC1 toward the front surface of the substrate W, a fifth nozzle arm 292 having a distal end to which the alkaline chemical liquid nozzle 291 is attached, a fifth pivot shaft 293 extending vertically on a lateral side of the spin chuck 203 and pivotally supporting the fifth nozzle arm 292, and a fifth arm pivoting unit (not shown) which rotates the fifth pivot shaft 293 to move the fifth nozzle arm 292 to thereby move the alkaline chemical liquid nozzle 291. The alkaline chemical liquid nozzle 291 is, for example, a straight nozzle which spouts SC1 in the form of continuous stream, and is attached to the horizontally extending fifth nozzle arm 292, for example, with its spout directed downward. The fifth nozzle arm 292 extends horizontally.

The fifth arm pivoting unit pivots the fifth nozzle arm 292 about the fifth pivot shaft 293 to move the alkaline chemical liquid nozzle 291 horizontally along an arcuate path. The fifth arm pivoting unit horizontally moves the alkaline chemical liquid nozzle 291 between a treatment position such that SCI spouted from the alkaline chemical liquid nozzle 291 is applied to the upper surface of the substrate W and a fifth {third} home position 294 defined adjacent the spin chuck 203 as seen in plan. Further, the fifth arm pivoting unit horizontally moves the alkaline chemical liquid nozzle 291 between a center position such that SC1 spouted from the alkaline chemical liquid nozzle 291 is applied to the upper surface center portion of the substrate W and a peripheral position such that SC1 spouted from the alkaline chemical liquid nozzle 291 is applied to the upper surface peripheral portion of the substrate W. The center position and the peripheral position are each defined as the treatment position. The third home position 294 is defined in the first outer space OS1. The fifth pivot shaft 293 is also disposed in the first outer space OS1.

The partition wall 302 is postured vertically, and extends radially from the tubular wall 250. The partition wall 302 circumferentially partitions the outer space OS1 (see FIG. 9) of the second embodiment into a third outer space OS3 and a fourth outer space OS4 as seen in plan. The partition wall 302 separates the third and fourth outer spaces OS3, OS4 from each other, so that the first communication hole 253 is opposed to the third outer space OS3. An upper edge of the partition wall 302 horizontally extends at a height level slightly lower than the upper edge of the tubular wall 250. The third outer space OS3 and the fourth outer space OS4 are isolated from each other in a lower portion (including the bottom portion) of the treatment chamber 202 by the partition wall 302. Further, the third and fourth outer spaces OS3, OS4 are each isolated from the second outer space OS2.

The first outer vat 261 (see FIG. 10 and the like) of the second embodiment is also divided into two parts, i.e., a third outer vat 303 and a fourth outer vat 304, as the first outer space OS1 is divided into the third outer space OS3 and the fourth outer space OS4. That is, the vat 209 includes the inner vat 260, the second outer vat 262, the third outer vat 303 disposed on the bottom of the third outer space OS3, and the fourth outer vat 304 disposed on the bottom of the fourth outer space OS4.

The third outer vat 303 is a vat for receiving the SPM (first vat), while the fourth outer vat 304 is a vat (third vat) for receiving SC1. The third outer vat 303 is dimensioned and configured in conformity with the bottom of the third outer space OS3, and covers the entire bottom of the third outer space OS3 from below. The entire periphery of the third outer vat 303 is welded to be connected to the lower edges of the partition walls 257, 302 and the tubular wall 250 for prevention of liquid leakage from the third outer space OS3.

The fourth outer vat 304 is dimensioned and configured in conformity with the bottom of the fourth outer space OS4, and covers the entire bottom of the fourth outer space OS4 from below. The entire periphery of the fourth outer vat 304 is welded to be connected to the lower edges of the partition walls 257, 302 and the tubular wall 250 for prevention of liquid leakage from the fourth outer space OS4.

The first outer vat 261 is divided into two parts, i.e., the third and fourth outer vats 303, 304. The third outer vat 303 has a third reception surface 305, while the fourth outer vat 304 has a fourth reception surface 306. Therefore, the first reception surface 263 (see FIG. 10) is also divided into two parts, i.e., the third reception surface 305 and the fourth reception surface 306. The lowermost portion 264 of the first reception surface 263 (also see FIG. 10) is provided on the third reception surface 305, and a portion of the third reception surface 305 excluding the first lowermost portion 264 is inclined downward toward the first lowermost portion 264 with respect to the horizontal directions X. Therefore, the SPM received on different portions of the third reception surface 305 flows toward the first lowermost portion 264 due to height differences from the first lowermost portion 264.

The fourth reception surface 306 has a fourth lowermost portion 307 located adjacent the first lowermost portion 264 on a side of the partition wall 302 opposite from the first lowermost portion 264. A portion of the fourth reception surface 306 excluding the fourth lowermost portion 307 is inclined downward toward the fourth lowermost portion 307 with respect to the horizontal directions X. Therefore, SC1 received on different portions of the fourth reception surface 306 flows toward the fourth lowermost portion 307 due to height differences from the fourth lowermost portion 307.

A third drain port 308 is provided adjacent the first drain port 267 in an outer peripheral portion of the inner reception surface 271 of the inner vat 260. A third drain pipe (not shown) is connected to the third drain port 308. A downstream end portion of the third drain pipe extends to a third drain unit (not shown) different from the first and second drain units.

The tubular wall 250 has a third communication hole 309 provided in a lower edge portion thereof as extending therethrough to be opposed to the fourth lowermost portion 307 of the fourth reception surface 306.

As shown in FIG. 18, the third drain port 308 is connected to the fourth lowermost portion 307 of the fourth reception surface 306 through a second tube 310. SC1 flowing on the fourth reception surface 306 to reach the fourth lowermost portion 307 is guided to the third drain port 308 through the second tube 310. That is, the second tube 310 is provided as a bypass for connection between the fourth lowermost portion 307 and the third drain port 308, so that SC1 received on the fourth reception surface 306 can be guided to the third drain port 308 while being prevented from flowing on the inner reception surface 271 of the inner vat 260. A chemical-resistant material such as a fluororesin is used as a material for the second tube 310.

A proximal end of the second tube 310 is connected to the fourth lowermost portion 307 (a portion of the tubular wall 250 opposed to the fourth lowermost portion 307) via a first pipe joint 330 similar to the first pipe joint 320. The first pipe joint 330 has a joint body 331 which closes the third communication hole 309 of the tubular wall 250 to be fixed to the tubular wall 250. The joint body 331 has an inlet port 311, which is opposed to the fourth lowermost portion 307. A distal end of the second tube 310 is connected to the third drain port 308 via a pipe joint 312 similar to the pipe joint 275 (see FIG. 13).

SC1 received on different portions of the fourth reception surface 306 of the fourth outer vat 304 flows toward the fourth lowermost portion 307 due to height differences on the fourth reception surface 306. SC1 reaching the fourth lowermost portion 307 flows into the second tube 310 via the inlet port 311 opening in the third communication hole 309 to move into the third drain pipe due to a height difference from the second tube 310. SC1 flowing into the third drain pipe is sent to the third drain unit (not shown) to be drained.

According to the third embodiment, as described above, not only IPA but also SC1 is reliably prevented from being accidentally brought into contact with or mixed with the SPM. This reliably prevents the accidental mixing of the alkali and the acid in the vat.

While the three embodiments of the present invention have thus been described, the invention may be embodied in other ways.

In the exemplary process according to the first embodiment, the first cleaning liquid supplying step is performed in the rinsing step (S4) byway of example. However, the first cleaning liquid supplying step may be started after the end of the rinsing step (S4) and the organic solvent supplying step (S5) may be started after the end of the first cleaning liquid supplying step. Further, the first cleaning liquid supplying step may be started before the end of the rinsing step (S4), and the organic solvent supplying step (S5) may be started after the end of the first cleaning liquid supplying step after the rinsing step (S4).

In the exemplary process according to the first embodiment, the second cleaning liquid supplying step is performed in the organic solvent supplying step (S5) by way of example, but the second cleaning liquid supplying step may be performed before the start of the spin drying step (S6) after the end of the organic solvent supplying step (S5).

Further, the second cleaning liquid supplying step may be started before the end of the organic solvent supplying step (S5), and the spin drying step (S6) may be started after the end of the second cleaning liquid supplying step after the organic solvent supplying step (S5).

In the exemplary process according to the first embodiment, both the second and third cleaning liquid supplying steps are performed for removing IPA adhering to (or remaining on) the first cup 42 and the like by way of example, but it is sufficient to perform at least one of the second and third cleaning liquid supplying steps. There is no need to perform both of the second and third cleaning liquid supplying steps.

In the exemplary process according to the first embodiment, the front surface of the substrate W is treated with IPA retained in the puddle form on the substrate W in the organic solvent supplying step (S5) by way of example not by way of limitation. In the organic solvent supplying step (S5), the substrate W may be rotated at a relatively high rotation speed (e.g., several hundreds rpm).

In the first cleaning liquid supplying step according to the first embodiment, a threshold may be provided for the rotation speed of the substrate W in the rinsing step (S4), and the timing of the end of the first cleaning liquid supplying step may be determined according to the threshold.

If the substrate W is rotated at a rotation speed not higher than the threshold when the first cleaning liquid supplying step ends in the rinsing step (S4) according to the first embodiment, the cleaning of the inner wall of the first cup 42 and the like may be regarded as being incomplete, and the opening of the organic solvent valve 38 may be prohibited in the organic solvent supplying step (S5) to be subsequently performed (interlock).

The timings of the end of the first to third cleaning liquid supplying steps may be determined based on cumulative flow amounts (cumulative use amounts) of the cleaning liquid in the first to third cleaning liquid supplying steps. More specifically, cumulative flow meters may be respectively provided for the cleaning liquid supplying units 77, 79, and the cumulative flow amounts may be calculated based on the values of the cumulative flow meters.

If the cumulative flow amount of the cleaning liquid is not higher than the threshold when the first to third cleaning liquid supplying steps each end in the first embodiment, the cleaning of the inner wall of the first cup 42 and the like may be regarded as being incomplete, and the opening of the sulfuric acid-containing liquid valve 32 may be prohibited in the organic solvent supplying step (S5) or the sulfuric acid-containing liquid supplying step (S3) to be subsequently performed (interlock).

In the first to third cleaning liquid supplying steps of the first embodiment, the timings of the end of the first to third cleaning liquid supplying steps may be determined based on the cumulative flow amounts (cumulative use amounts) of the cleaning liquid in the respective cleaning liquid supplying steps. More specifically, cumulative flow meters may be respectively provided for the cleaning liquid supplying units 77, 79, and the cumulative flow amounts may be calculated based on the values of the cumulative flow amounts.

If the cumulative flow amount of the cleaning liquid is not higher than the threshold when the first to third cleaning liquid supplying steps each end, the cleaning of the inner wall of the first cup 42 and the like may be regarded as being incomplete, and the opening of the organic solvent valve 38 may be prohibited in the organic solvent supplying step (S5) or the sulfuric acid-containing liquid supplying step (S3) to be subsequently performed (interlock).

In the first embodiment, the first cup 42 out of the plurality of cups (the first cup 42, the second cup 43 and cup portion 63) is cleaned by way of example, but the second cup 43 or the cup portion 63 may be cleaned.

Where the second guard 45 is opposed to the peripheral surface of the substrate W in the sulfuric acid-containing liquid supplying step (S3), for example, the second cup 43 may be cleaned in the first cleaning liquid supplying step. In this case, the controller 8 controls the guard lift unit 48 to bring the second guard 45 into opposed relation to the peripheral surface of the substrate W, and controls the second recovery valve 100A and the second drain valve 101A to set the destination of the second common pipe 98 to the second recovery pipe 100 in the sulfuric acid-containing liquid supplying step (S3). In the first cleaning liquid supplying step, the controller 8 controls the guard lift unit 48 to bring the second guard 45 into opposed relation to the peripheral surface of the substrate W, and controls the second recovery valve 100A and the second drain valve 101A to switch the destination of the second common pipe 98 to the second drain pipe 101. Further, the controller 8 opens the first cleaning liquid valve 84 to spout the cleaning liquid from the first cleaning liquid nozzles 76. Thus, the cleaning liquid spouted from the first cleaning liquid nozzles 76 is sprayed onto the peripheral surface and the bottom surface of the outer periphery 15A, whereby the SPM adhering to the peripheral surface and the bottom surface of the outer periphery 15A is washed away. Further, the cleaning liquid spouted from the first cleaning liquid nozzles 76 is splashed on the peripheral surface and the bottom surface of the outer periphery 15A to be applied to the inner wall of the guide portion 62 of the second guard 45, and flows down on the inner wall of the cylindrical portion 64 (see FIG. 2 and the like) and drips from the lower edge of the cylindrical portion 64 to be received in the second drain/recovery channel 55 (see FIG. 2 and the like) of the second cup 43. The cleaning liquid supplied to the second drain/recovery channel 55 moves circumferentially of the second cup 43 toward the second drain/recovery port 97 in the second drain/recovery channel 55 to be guided to the second common pipe 98 from the second drain/recovery port 97. Since the destination of the second common pipe 98 is set to the second drain pipe 101, the cleaning liquid guided to the second common pipe 87 is further guided to the drain unit (not shown) through the second drain pipe 101 to be drained. The cleaning liquid flows through the second cup 43 and the second common pipe 98, whereby the inner wall of the second cup 43 and the pipe wall of the second common pipe 98 are cleaned.

Where the third guard 46 is opposed to the peripheral surface of the substrate W in the sulfuric acid-containing liquid supplying step (S3), the cup portion 63 may be cleaned in the first cleaning liquid supplying step. In this case, the controller 8 controls the guard lift unit 48 to bring the third guard 46 into opposed relation to the peripheral surface of the substrate W, and controls the third recovery valve 105A and the third drain valve 106A to set the destination of the third common pipe 103 to the third recovery pipe 105 in the sulfuric acid-containing liquid supplying step (S3). In the first cleaning liquid supplying step, the controller 8 controls the guard lift unit 48 to bring the third guard 46 into opposed relation to the peripheral surface of the substrate W, and controls the third recovery valve 105A and the third drain valve 106A to switch the destination of the third common pipe 103 to the third drain pip 106. Further, the controller 8 opens the first cleaning liquid valve 84 to spout the cleaning liquid from the first cleaning liquid nozzles 76. Thus, the cleaning liquid spouted from the first cleaning liquid nozzles 76 is sprayed onto the peripheral surface and the bottom surface of the outer periphery 15A, whereby the SPM adhering to the peripheral surface and the bottom surface of the outer periphery 15A is washed away. Further, the cleaning liquid spouted from the first cleaning liquid nozzles 76 is splashed on the peripheral surface and the bottom surface of the outer periphery 15A to be applied to the inner wall of the lower portion 68 of the third guard 45 (see FIG. 2 and the like), and flows down on the inner wall and drips from the lower edge of the lower portion 68 to be received in the third drain/recovery channel 66 of the cup portion 63 of the second guard 45 (see FIG. 2 and the like). The cleaning liquid supplied to the third drain/recovery channel 66 moves circumferentially of the cup portion 63 toward the third drain/recovery port 102 in the third drain/recovery channel 66 to be guided to the third common pipe 103 from the third drain/recovery port 102. Since the destination of the third common pipe 103 is set to the third drain pipe 106, the cleaning liquid guided to the third common pipe 103 is further guided to the drain unit (not shown) through the third drain pipe 106 to be drained. The cleaning liquid flows through the cup portion 63 and the third common pipe 103, whereby the inner wall of the cup portion 63 and the pipe wall of the third common pipe 103 are cleaned.

In the first embodiment, the common pipes 93, 98, 103 are respectively connected to the bottoms of the cups 42, 43, 63, and the destinations of the liquids (treatment liquid or cleaning liquid) flowing through the common pipes 93, 98, 103 are each switched between the recovery pipe 95, 100, 105 and the drain pipe 96, 101, 106 by way of example. Without this arrangement, the drain pipes 96, 101, 106 may be respectively connected to the bottoms of the cups 42, 43, 63. That is, drain ports may be provided instead of the drain/recovery ports 92, 97, 102, and the drain pipes 96, 101, 106 may be respectively connected to the drain/recovery ports 92, 97, 102.

In the first embodiment, a three-way valve may be used for switching the destination of the liquid flowing through the common pipe 93, 98, 103 between the recovery pipe 95, 100, 105 and the drain pipe 96, 101, 106.

In the first embodiment, the cleaning liquid spouted from the first cleaning liquid nozzles 76 is sprayed onto both the peripheral surface and the bottom surface of the outer periphery 15A by way of example, but the cleaning liquid may be sprayed onto at least one of the peripheral surface and the bottom surface of the outer periphery 15A.

In the first embodiment, the cleaning liquid spouted from the second cleaning liquid nozzles 78 is once applied to the lower portion 58 and then supplied to the inner wall of the first cup 42 by way of example, but the cleaning liquid spouted from the second cleaning liquid nozzles 78 may be supplied directly to the inner wall of the first cup 42 (e.g., the inner wall of the bottom 51).

In the first embodiment, the second cleaning liquid outlet ports 81 of the second cleaning liquid nozzles 78 are directed obliquely downward by way of example, but the second cleaning liquid outlet ports 81 may be directed horizontally.

In the first embodiment, the treatment cup 7 includes the plurality of cups by way of example, but the present invention may be applied to a treatment cup including a single cup.

In the first embodiment, the first and second cleaning liquid nozzles 76, 78 are configured such that the first and second cleaning liquid outlet ports 80, 81 are provided in the taper surface 24A (outer peripheral surface of the boss 21), but may each have a nozzle casing provided separately from the boss 21.

In the first embodiment, the first cleaning nozzles 76 and the second cleaning nozzles 78 are used in the respective cleaning liquid supplying steps by way of example, but the first cleaning nozzles 76 or the second cleaning nozzles 78 may be used.

In the second embodiment, the vat (second vat) for receiving IPA includes the inner vat 260 and the second outer vat 262 by way of example, but may include only the second outer vat 262. In this case, the inner space IS and the second outer space OS2 may be isolated from each other in the lower portion (including the bottom portion) of the treatment chamber 202.

The sulfuric acid-containing liquid nozzle 221, the organic solvent nozzle 233 and the alkaline chemical liquid nozzle 291 are each horizontally moved along the arcuate path between the treatment position and the home position 229, 241, 294 by way of example, but may be slid linearly.

In the second embodiment, the sulfuric acid-containing liquid line 225 and the organic solvent line 237 are respectively branched into the first suction line 227 and the second suction line 239. Suction mechanisms may be respectively provided in the sulfuric acid-containing liquid valve 226 which opens and closes the sulfuric acid-containing liquid line 225 and in the organic solvent valve 238 which opens and closes the organic solvent line 237, and the SPM and IPA may be respectively sucked from the sulfuric acid-containing liquid line 225 and the organic solvent line 237 by driving the suction mechanisms.

Further, the arrangement for sucking the sulfuric acid-containing liquid line 225 or the organic solvent line 237 (the first suction line 227, the first suction valve 228 and the like or the second suction line 239, the second suction valve 240 and the like) may be obviated.

In the embodiments described above, the SPM is used as the sulfuric acid-containing liquid by way of example, but sulfuric acid may be used as the sulfuric acid-containing liquid.

In the embodiments described above, the organic solvent includes at least one of IPA, methanol, ethanol, HFE (hydrofluoroether) and acetone. These organic solvents may be used either alone or in combination. For example, a liquid mixture of IPA and acetone or a liquid mixture of IPA and methanol may be used as the organic solvent.

In the embodiments described above, the sulfuric acid-containing liquid such as the SPM and the organic solvent such as IPA are used in combination as the first chemical liquid and the second chemical liquid which are liable to cause a hazard when being accidentally brought into contact with each other or mixed together by way of example. Other exemplary combinations of chemical liquids which are liable to cause a hazard by the accidental mixing include a combination of a nitric acid-containing liquid such as nitric acid and nitrohydrofluoric acid (a liquid mixture of hydrofluoric acid and nitric acid) and an organic solvent, and a combination of nitrohydrochloric acid and sulfuric acid.

The present invention may be applied not only to the combination of the first chemical liquid and the second chemical liquid which are liable to cause a hazard when being accidentally brought into contact with each other or mixed together but also to a combination of a first chemical liquid and a second chemical liquid which are inappropriate for the mixing. For example, the present invention is applicable to a combination of an acid and an alkali which produce a reaction product when being accidentally brought into contact with each other or mixed together.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application Nos. 2014-165555 and 2014-165556 filed in the Japan Patent Office on Aug. 15, 2014, the disclosure of which is incorporated herein by reference in their entireties.

What is claimed is:

1. A substrate treatment apparatus comprising:
   a treatment chamber;
   a substrate holding and rotating mechanism provided in the treatment chamber and including a spin base rotatable about a predetermined rotation axis for holding the substrate and rotating the substrate about the rotation axis;
   an annular cup provided around the substrate holding and rotating mechanism for retaining a treatment liquid expelled from the substrate rotated by the substrate holding and rotating mechanism;
   a first chemical liquid supplying unit which supplies a first chemical liquid to the substrate held by the substrate holding and rotating mechanism;
   a second chemical liquid supplying unit which supplies a second chemical liquid different from the first chemical liquid to the substrate held by the substrate holding and rotating mechanism;
   a cleaning liquid nozzle having a cleaning liquid outlet port for spouting a cleaning liquid toward a cup inner wall which is an inner wall of the cup and/or a base wall surface which is a wall surface of an outer periphery of the spin base;
   a cleaning liquid supplying unit which supplies the cleaning liquid to the cleaning liquid nozzle;
   a rotative treatment control unit which controls the first chemical liquid supplying unit and the second chemical liquid supplying unit to perform a first chemical liquid supplying step of supplying the first chemical liquid to the substrate rotated by the substrate holding and rotating mechanism and a second chemical liquid supplying step of supplying the second chemical liquid different from the first chemical liquid to the substrate rotated by the substrate holding and rotating mechanism after the first chemical liquid supplying step; and
   a cleaning control unit which controls the cleaning liquid supplying unit to spout the cleaning liquid from the cleaning liquid outlet port to supply the cleaning liquid to the cup inner wall and/or the base wall surface before start of the second chemical liquid supplying step after end of the first chemical liquid supplying step, and/or during and/or after the second chemical liquid supplying step.

2. The substrate treatment apparatus according to claim 1, wherein the rotative treatment control unit includes a rinsing control unit which performs a rinsing step of supplying a rinse liquid to the substrate rotated by the substrate holding and rotating mechanism to rinse away the first chemical liquid from a front surface of the substrate before the start of the second chemical liquid supplying step after the end of the first chemical liquid supplying step,
wherein the cleaning control unit includes a first cleaning control unit which spouts the cleaning liquid from the cleaning liquid outlet port in the rinsing step and/or before the start of the second chemical liquid supplying step after end of the rinsing step.

3. The substrate treatment apparatus according to claim 1, wherein the cleaning control unit includes a second cleaning control unit which spouts the cleaning liquid from the cleaning liquid outlet port in the second chemical liquid supplying step and/or after end of the second chemical liquid supplying step.

4. The substrate treatment apparatus according to claim 1, wherein the rotative treatment control unit includes a spin drying control unit which performs a spin drying step of causing the substrate holding and rotating mechanism to rotate the substrate to spin off liquid from a front surface of the substrate after end of the second chemical liquid supplying step, wherein the cleaning control unit includes a third cleaning control unit which spouts the cleaning liquid from the cleaning liquid outlet port in the spin drying step.

5. The substrate treatment apparatus according to claim 1, further comprising:
a common pipe connected to a drain/recovery port provided in a bottom of the cup;
a recovery pipe connected to the common pipe for recovering the first chemical liquid or the second chemical liquid;
a drain pipe connected to the common pipe;
a switch valve which switches a destination of liquid flowing through the common pipe between the recovery pipe and the drain pipe; and a destination setting control unit which controls the switch valve so that the destination of the liquid flowing through the common pipe is set to the drain pipe, while causing the cleaning control unit to supply the cleaning liquid.

6. The substrate treatment apparatus according to claim 1, wherein the cleaning liquid nozzle includes a first cleaning liquid nozzle having a first cleaning liquid outlet port to be opposed to the base wall surface.

7. The substrate treatment apparatus according to claim 6, wherein the first cleaning liquid nozzle is disposed with the first cleaning liquid outlet port directed obliquely upward.

8. The substrate treatment apparatus according to claim 1, wherein the cleaning liquid nozzle includes a second cleaning liquid nozzle having a second cleaning liquid outlet port for supplying the cleaning liquid to the cup inner wall.

9. The substrate treatment apparatus according to claim 8,
wherein the cup annularly surrounds the substrate holding and rotating mechanism, and has a drain port provided in a bottom wall thereof,
wherein the second cleaning liquid outlet port includes a plurality of second cleaning liquid outlet ports provided circumferentially of the cup laterally of the spin chuck, and the second cleaning liquid outlet ports are absent in a region near the drain port.

10. The substrate treatment apparatus according to claim 1,
wherein the first chemical liquid is a sulfuric acid-containing liquid,
wherein the second chemical liquid is an organic solvent.

* * * * *